(12) United States Patent
Kurokawa

(10) Patent No.: US 7,835,422 B2
(45) Date of Patent: Nov. 16, 2010

(54) SEMICONDUCTOR DEVICE

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 761 days.

(21) Appl. No.: 11/491,026

(22) Filed: Jul. 24, 2006

(65) Prior Publication Data

US 2007/0028194 A1 Feb. 1, 2007

(30) Foreign Application Priority Data

Jul. 29, 2005 (JP) ............................. 2005-222194
Nov. 1, 2005 (JP) ............................. 2005-318543

(51) Int. Cl.
*H04B 1/69* (2006.01)
*H04B 1/38* (2006.01)
(52) U.S. Cl. ...................... 375/145; 375/219
(58) Field of Classification Search .................. 375/145, 375/219; 327/534, 160; 716/1; 235/451, 235/492; 365/226
See application file for complete search history.

(56) References Cited

U.S. PATENT DOCUMENTS

| | | | |
|---|---|---|---|
| 6,671,194 B2 * | 12/2003 | Takahashi | 363/69 |
| 6,868,503 B1 * | 3/2005 | Maksimovic et al. | 713/401 |
| 6,992,468 B2 | 1/2006 | Kranz | |
| 7,296,742 B2 * | 11/2007 | Enomoto et al. | 235/451 |
| 2002/0093362 A1 * | 7/2002 | Matsumoto | 326/80 |
| 2003/0056127 A1 * | 3/2003 | Vaglica | 713/300 |
| 2005/0007171 A1 * | 1/2005 | Yoneda | 327/199 |
| 2005/0122819 A1 * | 6/2005 | Park et al. | 365/226 |
| 2006/0061232 A1 * | 3/2006 | Min et al. | 310/317 |

FOREIGN PATENT DOCUMENTS

CN 1443393 9/2003
JP 2000-149194 5/2000

OTHER PUBLICATIONS

Hiroki Dembo et al., RFCPUs on Glass and Plastic Substrates Fabricated by TFT Transfer Technology, 2005 IEDW, 2005, pp. 1067-1069.
RFCPUs on Glass and Plastic Substrates Fabricated by TFT Transfer Technology, 2005 IEDM [5.8], 3 pages.
Office Action (Application No. 200610110005.5) Dated Jun. 19, 2009.

* cited by examiner

*Primary Examiner*—Khai Tran
(74) *Attorney, Agent, or Firm*—Eric J. Robinson; Robinson Intellectual Property Law Office, P.C.

(57) ABSTRACT

In a semiconductor device having a large-scale arithmetic circuit, when there is delay in clock signals, a malfunction occurs in a circuit. In particular, in an environment where supply voltage varies as in a wireless chip, it is very difficult to precisely estimate delays in clock signals in designing. Further, in order to keep supply voltage stable, a large-scale power supply circuit is required, which increases the area of a chip, and the cost thereof. A semiconductor device provided with a power control circuit and a clock generation circuit is used to detect variation in supply voltage using the power control circuit and changing frequency and duty ratio of a clock circuit using the clock generation circuit, thereby operating an arithmetic circuit stably. A high performance semiconductor device provided with such a large-scale arithmetic circuit can be provided at low cost.

29 Claims, 34 Drawing Sheets

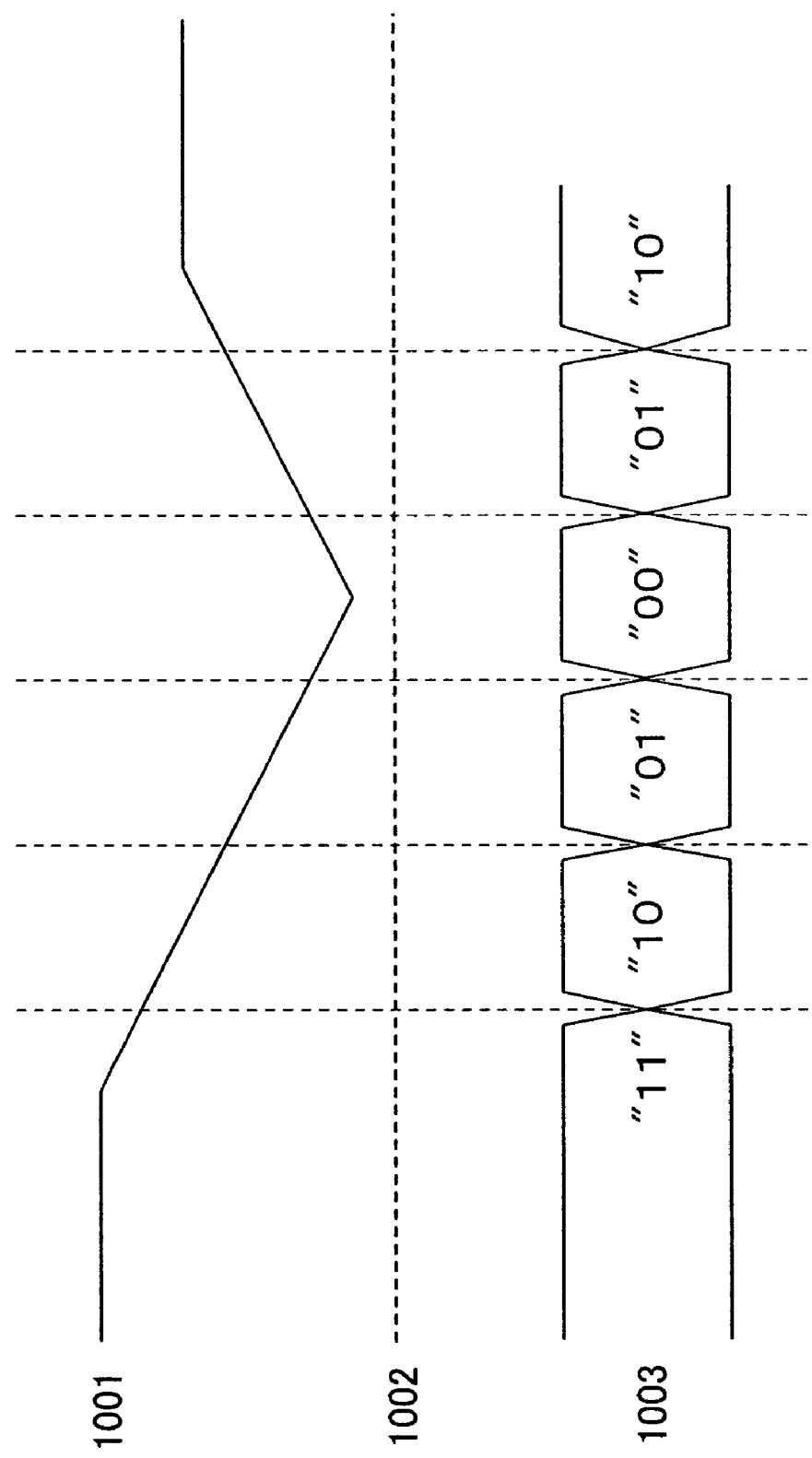

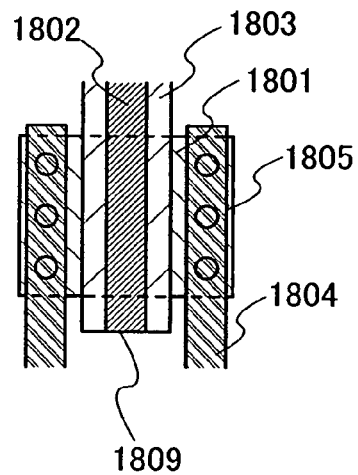
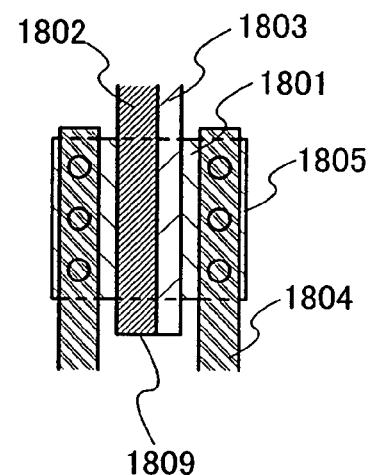
Fig.19A    Fig.19B
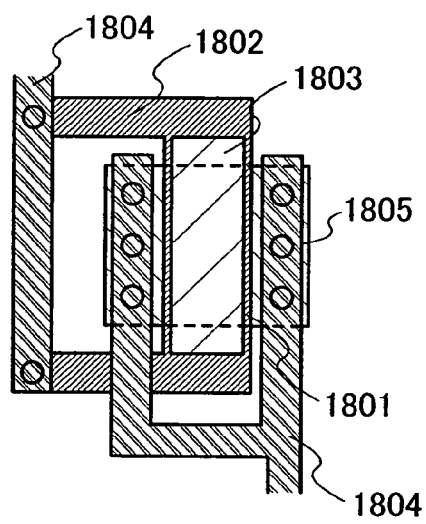
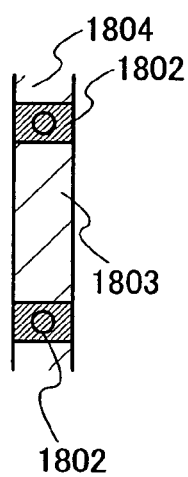
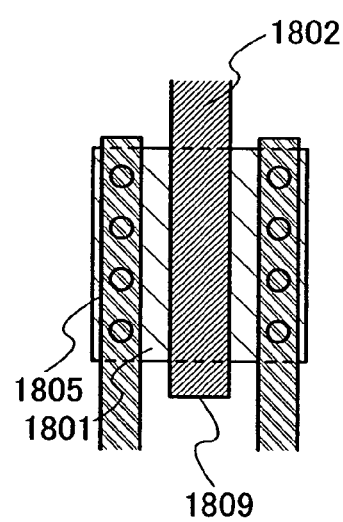
Fig.19C    Fig.19D    Fig.19E 1601
1602

1601 1603

1601
1604

1601
1605

SEMICONDUCTOR DEVICE

BACKGROUND OF THE INVENTION

1. Field of the Invention

The present invention relates to a semiconductor device including a large scale arithmetic circuit, and particularly to a semiconductor device in which an arithmetic circuit can be operated stably even when supply voltage changes. Specifically, the present invention relates to a semiconductor device in which a large scale circuit having advanced arithmetic functions, to which supply voltage is supplied with a wireless communication signal is formed from semiconductor thin film transistors.

2. Description of the Related Art

In recent years, a compact semiconductor device in which micro IC chips and an antenna for wireless communication are combined (hereinafter referred to as a wireless chip) is spotlighted. A wireless chip can write data or read data by transmitting/receiving communication signals (operation magnetic field) using a wireless communication device (hereinafter referred to as a reader/writer).

Wireless chips are applied in areas, for example, product management in distribution industry. At present, product management using barcodes or the like is a mainstream; however, since data of barcodes are read optically, they cannot be read when a shield exists. Meanwhile, as to a wireless chip, since data are read wirelessly, they can be read even when a shield exists. Thus, higher efficiency, lower cost, and the like of product management are expected. In addition, wide use in tickets, airline passenger tickets, automatic checkout, and the like is expected (Reference 1: Japanese Patent Application Laid-Open No. 2000-149194).

SUMMARY OF THE INVENTION

As the range of application of wireless chips is expanding, wireless chips having further advanced functions are increasingly required. For example, data are expected to be prevented from being leaked to a third party by encrypting the data transmitted/received. There are methods of performing coding/decoding processing using hardware, using software, and using both hardware and software. In the method of processing using hardware, an arithmetic circuit is a circuit dedicated for coding/decoding. In the method of processing using software, an arithmetic circuit includes a CPU (Central Processing Unit) and a large scale memory, the CPU executes a coding/decoding program. In the method of processing using both hardware and software, an arithmetic circuit includes a coding/decoding dedicated circuit, a CPU, and a memory; the dedicated circuit performs a part of arithmetic processing of coding/decoding, and the CPU executes programs other than arithmetic processing. However, in any case, a wireless chip is to be provided with a large scale circuit.

As standards of communication using wireless chips, ISO/IEC 15693 and the like are established, for example. According to ISO/IEC 15693, a frequency of 13.56 MHz±7 kHz is used for a carrier wave in a communication signal, and an ASK (Amplitude Shift Keying) is employed for transmitting data from a reader/writer to a wireless chip. FIG. 2 shows a communication signal when data are transmitted to a wireless chip in the ASK system. In FIG. 2, a communication signal 201 is an electromagnetic wave which oscillates at the frequency of a carrier wave. Data transmitted with the communication signal 201 is represented by an envelope 202 of the amplitude of the communication signal 201. The maximum amplitude of the communication signal 201 is represented as "1", and the minimum is represented as "0". The wireless chip receives "0" and "1" with the communication signal 201 described above.

Further, supply voltage or clock signals required for operating the wireless chip are generated by the communication signal 201. Therefore, in order to operate arithmetic circuits in the wireless chip, a large scale antenna or a large scale power supply circuit which can supply large current with communication signals, a clock generation circuit which can supply stable clock signals, and the like are required; further, increase in the area of a chip, rise in cost of a chip, and the like are concerns. In addition, since the ASK system is used for data transmission, supply of supply voltage or a clock signal tends to be unstable when receiving "0".

When the supply of supply voltage or clock signals becomes unstable, a malfunction occurs in a synchronous circuit. This will be described with reference to FIG. 3 and FIG. 4. FIG. 3 shows a shift register in which a first flip-flop (hereinafter referred to as FF) 301 and a second FF 302 are connected in series, as an example of a synchronous circuit. The first FF 301 and the second FF 302 respectively store voltage values of a first data wiring 305 and a second data wiring 306 at the rising edges of a first clock signal and a second clock signal respectively supplied by a first clock wiring 303 and a second clock wiring 304, and the stored voltage values are outputted as voltage values of the second data wiring 306 and a third data wiring 307.

FIGS. 4A and 4B show examples of timing charts of a shift register in FIG. 3. FIG. 4A shows a timing chart of the case where the shift register in FIG. 3 operates ideally. Here, timing charts of the first clock signal and the second clock signal in FIG. 3 supplied by the first clock wiring 303 and the second clock wiring 304 are a first clock signal 401 and a second clock signal 402 in FIG. 4A respectively. Note that there is no interval between the first clock signal 401 and the second clock signal 402. Further, a timing chart of the voltage value of the first data wiring 305 in FIG. 3 is a first data signal 403 in FIG. 4A. In this case, timing charts of the voltage values of the second data wiring 306 and the third data wiring 307 in FIG. 3 are a second data signal 404 and a third data signal 405 in FIG. 4A respectively.

However, in FIG. 3, in the case where there is an interval between the first clock signal and the second clock signal supplied by the first clock wiring 303 and the second clock wiring 304, a malfunction is caused unlike the timing chart in FIG. 4A. FIG. 4B shows a timing chart illustrating the case of a malfunction. Timing charts of the first clock signal and the second clock signal supplied by the first clock wiring 303 and the second clock wiring 304 in FIG. 3 are shown as a first clock signal 411 and a second clock signal 412 in FIG. 4B. Note that there is an interval of 416 between the first clock signal 411 and the second clock signal 412. Accordingly, the second clock signal 412 is delayed with respect to the first clock signal 411. A timing chart of the voltage value of the first data wiring 305 in FIG. 3 is a first data signal 413 in FIG. 4B. In this case, timing charts of voltage values of the second data wiring 306 and the third data wiring 307 in FIG. 3 are a second data signal 414 and a third data signal 415 in FIG. 4B respectively.

Here, FIG. 4A and FIG. 4B have the same timing chars of the voltage value of the second data wiring 306 in FIG. 3. However, the timing charts of the voltage value of the third data wiring 307 are different. This is because, due to delay of the second clock signal 412 in FIG. 4B, the voltage value which is to be normally stored at a next rise of the second clock signal 412 is stored one cycle earlier. Such behavior of FF is called racing, data racing, or the like. Thus, a malfunction occurs in a synchronous circuit when there is delay in propagating clock signals.

As to propagation of clock signals, delay can partly controlled through design. However, in the case where supply voltage varies as in a wireless chip, it is very difficult to control. In particular, as the scale of a circuit to be provided becomes larger, designing becomes more difficult. Note that, variation in supply voltage, delay caused in propagating clock signals can generally be issues in semiconductor devices including large scale arithmetic circuits other than a wireless chip. In particular, it becomes a serious problem in a semiconductor device in which a large scale circuit having advanced arithmetic functions is structured using thin film transistors including a semiconductor.

The present invention is made in view of the above issues, and provides a semiconductor device having a suitable structure as a semiconductor device mounted with a large scale circuit. Further, the invention provides a semiconductor device which can be stably operated even in the case where variation in supply voltage is a concern. Specifically, the invention is suitable for a semiconductor device mounted with a large scale circuit formed using semiconductor thin film transistors. Further, the invention is suitable for a wireless chip in which supply voltage or clock signals are generated by communication signals, and an ASK system is used for transmitting/receiving data.

In a semiconductor device of the present invention, a positive clock signal and a negative clock signal are generated to operate an FF. Here, as to a positive clock signal and a negative clock signal, the signals are in one cycle and either of them include one "0" period and one "1" period, and there is no period where both signals are simultaneously "1". Hereinafter, such a relation between a positive clock signal and a negative clock signal is referred to as non-overlap, and one or both of a positive clock signal and a negative clock signal are referred to as non-overlapping clocks. Further, when a function to modify a period of a non-overlapping clock and the duty ratio by an operating environment is provided, a large scale arithmetic circuit can be stably operated. In addition, a period of "1" and a period of "0" respectively correspond to a HIGH state and a LOW state of clock signals.

With a configuration described above, a semiconductor device which can be operated stably can be provided even in the case where supply voltage is unstable, and there is a delay in propagating clock signals. Further, a high performance wireless chip which can be equipped with a large scale arithmetic circuit can be provided.

In particular, when a semiconductor device of the present invention is manufactured using thin film transistors having a semiconductor film as an active layer, which is formed over a substrate having an insulating surface such as a glass substrate, a quartz substrate, or a plastic substrate, a large area substrate can be used in a manufacturing process. Therefore, manufacturing cost of a semiconductor device of the present invention can be substantially reduced. In addition, particularly in the case of using a plastic substrate that has mechanical flexibility, a completed semiconductor device in the present invention can be handled in various forms besides the reduction in manufacturing cost.

One mode of the present invention is a semiconductor device including an arithmetic circuit; a power control circuit; and a clock generation circuit, wherein the arithmetic circuit includes a first level sensitive latch having a function of changing a period where data is held by a first gate signal, and a second level sensitive latch having a function of changing a period where data is held by a second gate signal, the power control circuit has a function of generating a control signal from a value of power voltage supplied to the arithmetic circuit, the clock generation circuit has functions of generating a first clock signal and a second clock signal, and the first gate signal and the second gate signal are generated respectively based on the first clock signal and the second clock signal which are generated in the clock generation circuit. A period where either a first level sensitive latch or a second level sensitive latch holds data is a period where a LOW clock signal is inputted either the first level sensitive latch or the second level sensitive latch. Alternatively, data may be held by the first level sensitive latch or the second level sensitive latch when each HIGH clock signal is inputted to either the first level sensitive latch or the second level sensitive latch.

One mode of the present invention is a semiconductor device including an arithmetic circuit; a power control circuit; and a clock generation circuit, wherein the arithmetic circuit includes a first level sensitive latch using a first clock signal as a first gate signal, and a second level sensitive latch using a second clock signal as a second gate signal, the power control circuit has a function of generating a control signal from a value of power voltage supplied to the arithmetic circuit, and the clock generation circuit changes a period where each of the first clock signal and the second clock signal is "0" using the control signal.

Another mode of the present invention is a semiconductor device including an arithmetic circuit; a power control circuit; and a clock generation circuit, wherein the arithmetic circuit includes a first level sensitive latch using a first clock signal as a first gate signal, and a second level sensitive latch using a second clock signal as a second gate signal, the power control circuit has a function of generating a control signal from a value of current supplied to the arithmetic circuit, and the clock generation circuit changes a period where each or the first clock signal and the second clock signal is "0" using the control signal.

Another mode of the present invention is a semiconductor device including an arithmetic circuit; a power control circuit; and a clock generation circuit, wherein one of the arithmetic circuit, the power control circuit, and the clock generation circuit includes a thin film transistor which has a semiconductor film formed over a substrate having an insulating surface as an active layer, wherein the arithmetic circuit includes a first level sensitive latch using a first clock signal as a first gate signal, and a second level sensitive latch using a second clock signal as a second gate signal, the power control circuit has a function of generating a control signal from a value of supply voltage supplied to the arithmetic circuit, the clock generation circuit changes a period where each of the first clock signal and the second clock signal is "0" using the control signal.

Another mode of the present invention is a semiconductor device including an arithmetic circuit; a power control circuit; and a clock generation circuit, wherein one of the arithmetic circuit, the power control circuit, and the clock generation circuit includes a thin film transistor which has a semiconductor film formed over a substrate having an insulating surface as an active layer, wherein the arithmetic circuit includes a first level sensitive latch using a first clock signal as a first gate signal, and a second level sensitive latch using a second clock signal as a second gate signal, the power control circuit has a function of generating a control signal from a value of current supplied to the arithmetic circuit, the clock generation circuit changes a period where each of the first clock signal and the second clock signal is "0" using the control signal.

Another mode of the present invention is a semiconductor device including an arithmetic circuit; a power control circuit;

and a clock generation circuit, wherein the arithmetic circuit, the power control circuit, and the clock generation circuit each include a thin film transistor which has a semiconductor film formed over a substrate having an insulating surface as an active layer, wherein the arithmetic circuit includes a first level sensitive latch using a first clock signal as a first gate signal, and a second level sensitive latch using a second clock signal as a second gate signal, the power control circuit has a function of generating a control signal from a value of supply voltage supplied to the arithmetic circuit, the clock generation circuit changes a period where each of the first clock signal and the second clock signal is "0" using the control signal.

Another mode of the present invention is a semiconductor device including an arithmetic circuit; a power control circuit; and a clock generation circuit, wherein the arithmetic circuit, the power control circuit, and the clock generation circuit each include a thin film transistor which has a semiconductor film formed over a substrate having an insulating surface as an active layer, wherein the arithmetic circuit includes a first level sensitive latch using a first clock signal as a first gate signal, and a second level sensitive latch using a second clock signal as a second gate signal, the power control circuit has a function of generating a control signal from a value of current supplied to the arithmetic circuit, the clock generation circuit changes a period where each of the first clock signal and the second clock signal is "0" using the control signal.

A first level sensitive latch of the present invention can change a period where data is held by a first gate signal, and a second level sensitive latch can change a period where data is held by a second gate signal. Further, the first gate signal an the second gate signal are generated respectively based on a first clock signal and a second clock signal which are generated in a clock generation circuit. Further, a period where the clock signal is "0" corresponds to a LOW state, while a period where the clock signal is "1" corresponds to a HIGH state.

Thus, a power control circuit for generating a control signal in accordance with a value of current supplied to an arithmetic circuit is provided, so that the duty ratio of a clock signal supplied to the arithmetic circuit can be optimized. For example, a control signal for reducing duty ratio of the clock signal is generated in the case where the value of current supplied to the arithmetic circuit is high, specifically, the case where the current consumption is high, which makes the supply voltage unstable and the circuit behavior becomes unstable accordingly.

Further, by providing a clock generation circuit having a function of changing a period where a first clock signal and a second clock signal are made "0" by a control signal, duty ratio of the clock signal supplied to an arithmetic circuit can be optimized. For example, in the case where a control signal for reducing duty ratio of a clock signal is generated by a power control circuit, duty ratio of the clock signal can be reduced by increasing a period where each of the first clock signal and the second clock signal is "0". Accordingly, the circuit behavior can be stabilized.

In the present invention, any one of a glass substrate, a quartz substrate, a plastic substrate, and an SOI substrate can be used as a substrate having an insulating surface.

In the present invention, a power control circuit may have a regulator and an operational amplifier circuit.

In the present invention, a power control circuit may have a regulator, an operational amplifier circuit, and an analog-digital converter circuit.

In the present invention, a clock generation circuit may have a means for changing frequencies of a first clock signal and a second clock signal using a control signal.

In the present invention, an arithmetic circuit may have a CPU and a memory.

In accordance with the present invention, even in the case where supply voltage of a semiconductor device varies and there occurs delay in propagating clock signals, a large scale arithmetic circuit can be operated stably. Accordingly, a highly reliable semiconductor device having a high performance arithmetic circuit can be provided. In particular, a semiconductor device having a high performance arithmetic circuit can be provided at low cost by manufacturing it using thin film transistors. Further, a wireless chip having a high performance arithmetic circuit can be provided at low cost, in which supply voltage is supplied through a communication signal by electromagnetic induction, and an ASK system is used for transmitting/receiving data.

BRIEF DESCRIPTION OF DRAWINGS

FIG. 10 is an example of the timing chart of a power control circuit of a semiconductor device of the present invention (2);

FIGS. 19A to 19E show electric elements forming a semiconductor device of the present invention;

DETAILED DESCRIPTION OF THE INVENTION

Embodiment Modes and Embodiments

Figure 1:
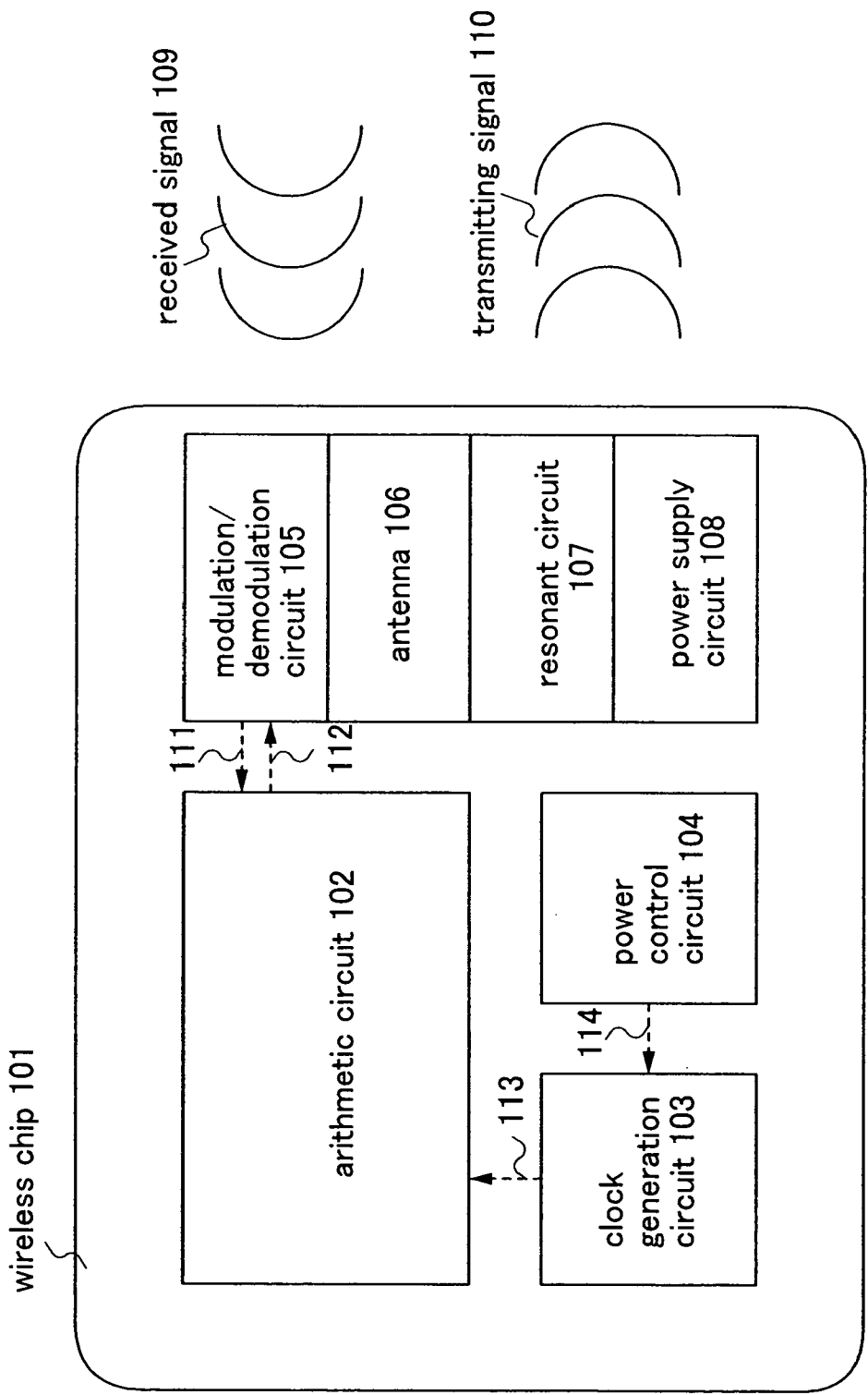
FIG. 1 is a schematic view of a semiconductor device of the present invention.
Figure 2:
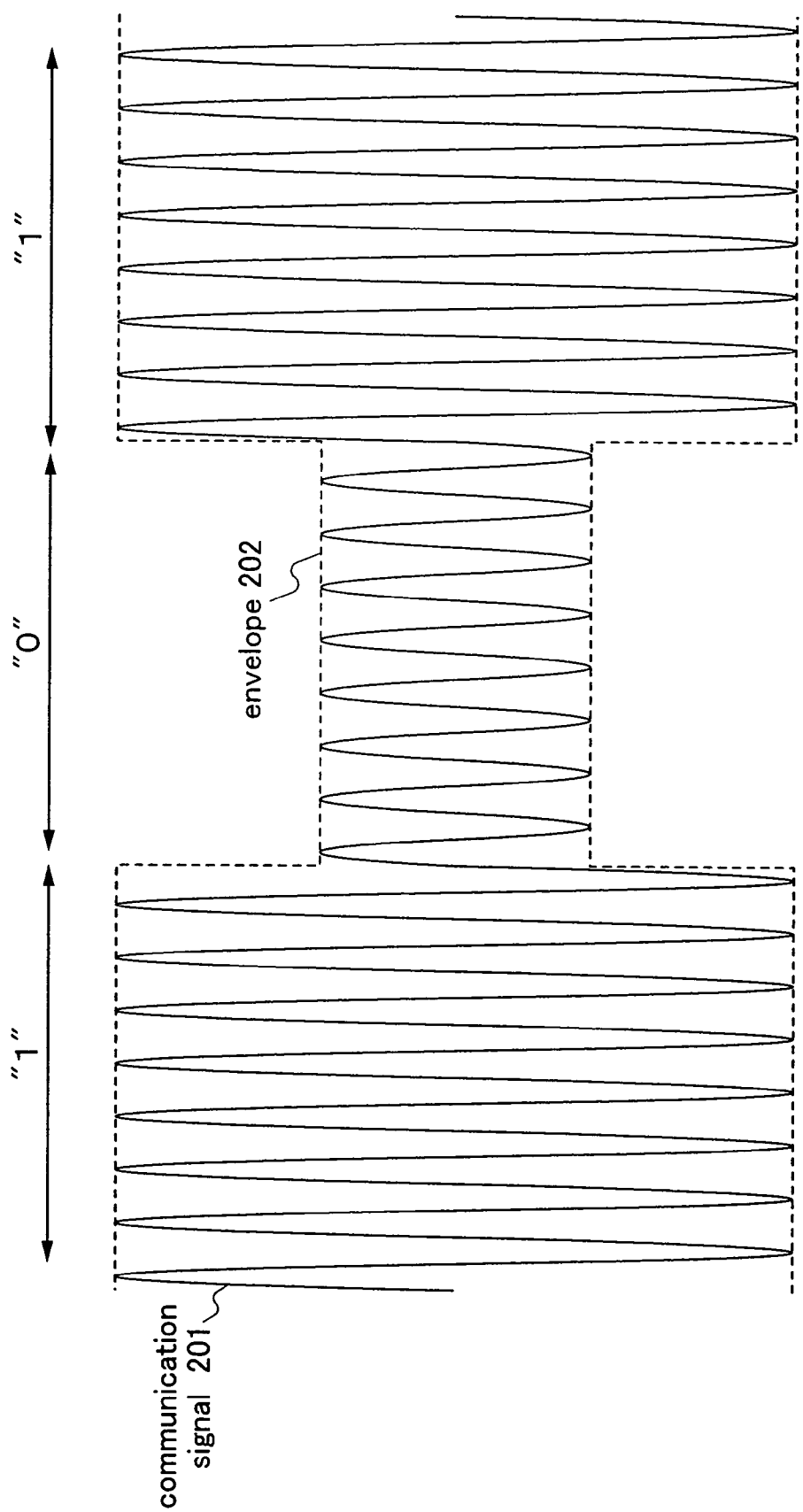
FIG. 2 shows a communication signal when data is transmitted/received by an ASK system.
Figure 3:
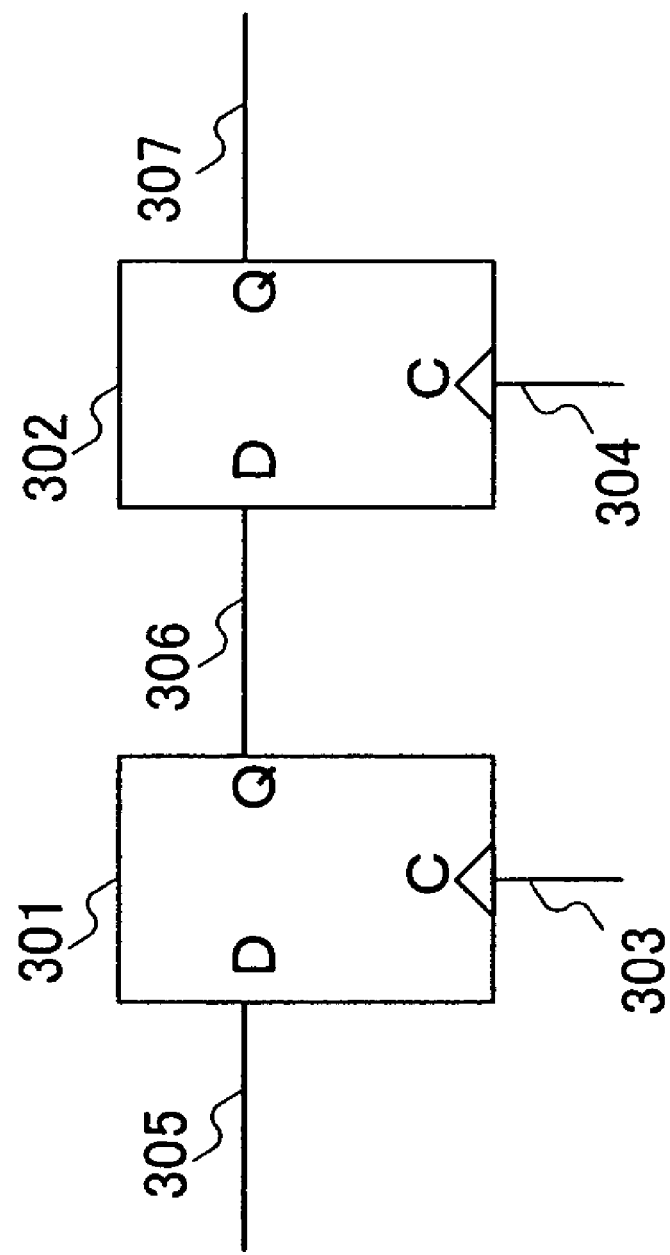
FIG. 3 shows a synchronous circuit.
Figure 4B:
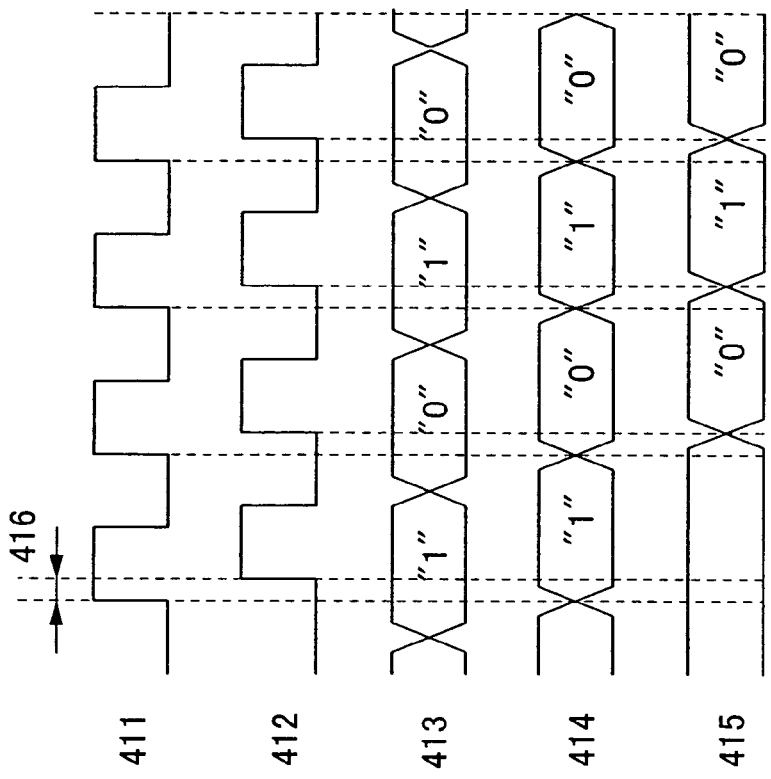
FIGS. 4A and 4B are examples of the timing chart of a synchronous circuit.
Figure 4A:
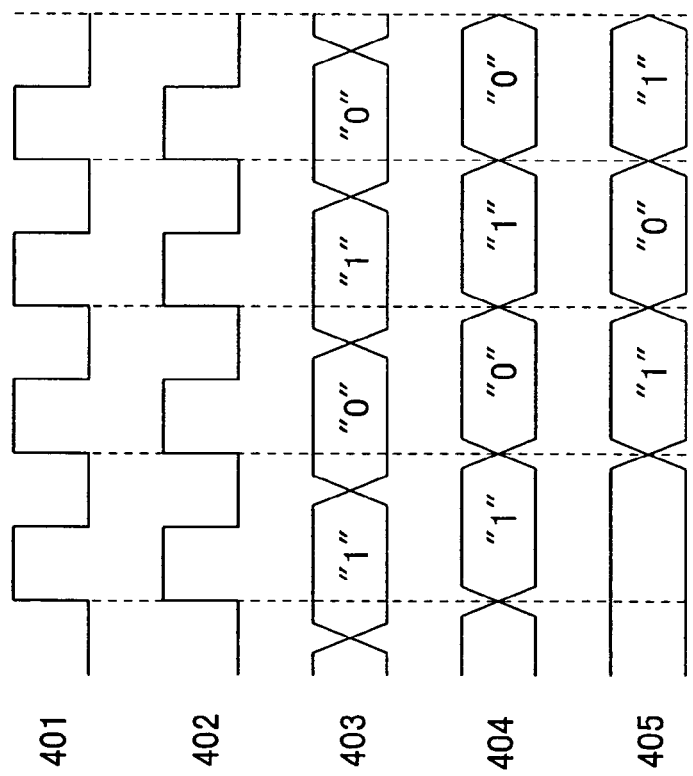

Embodiment modes and embodiments of the invention will be described below with reference to the drawings. Note that the invention is not limited to the following descriptions and it is easily understood by those skilled in the art that various changes may be made in modes and details without departing from the spirit and the scope of the invention. In the drawings for describing the embodiment modes embodiments, the same reference numerals are commonly given to like components, and the components will not be described repeatedly.

Embodiment Mode 1

Figure 5:
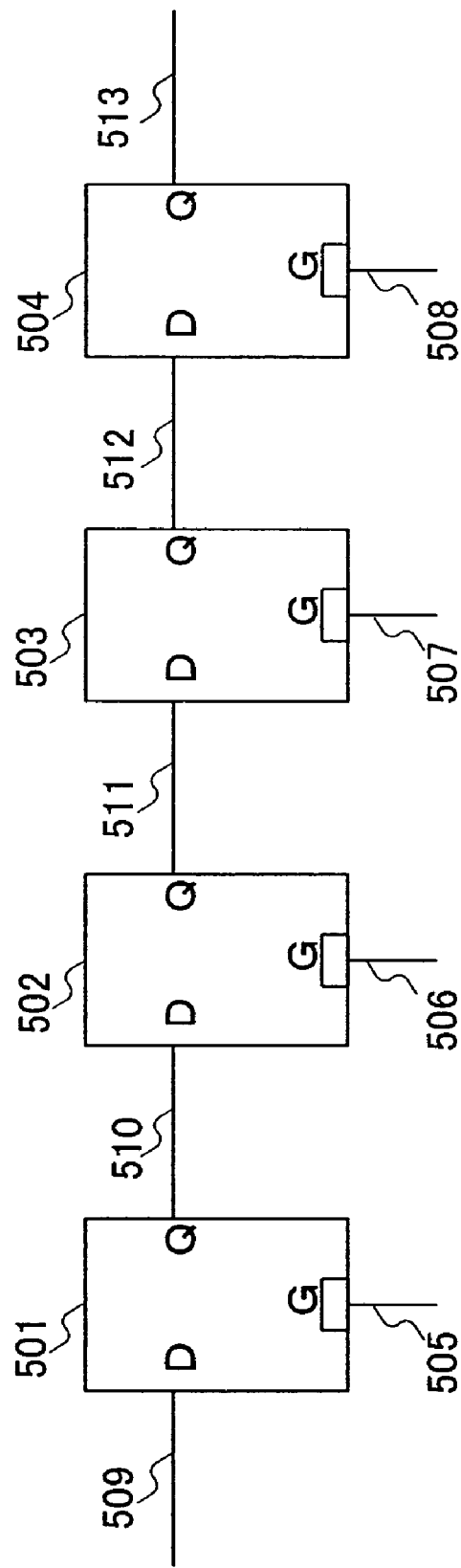
FIG. 5 shows a synchronous circuit in a semiconductor device of the present invention.
Figure 6B:
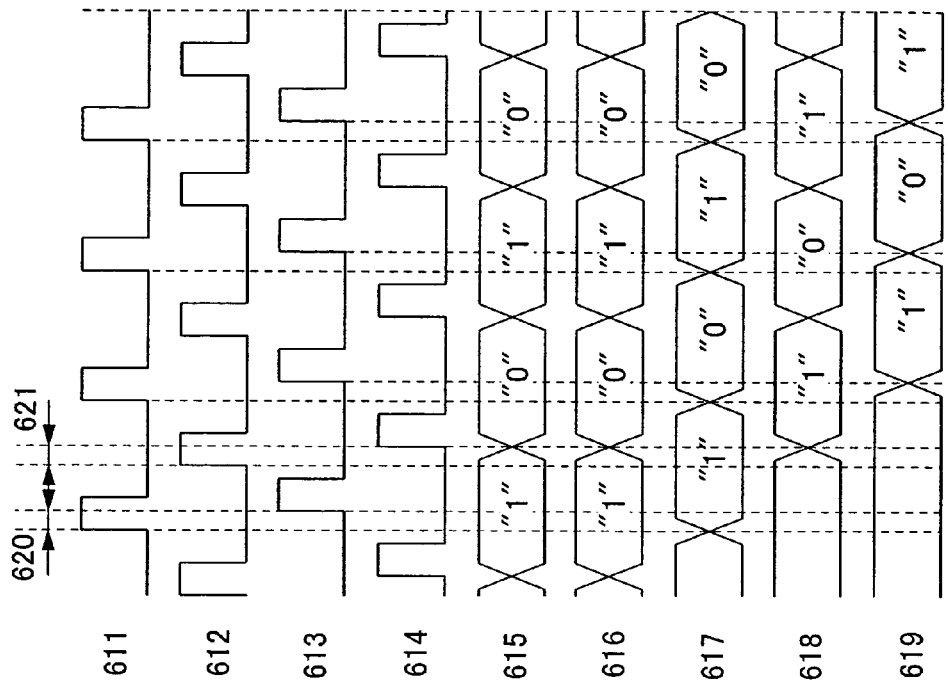
FIGS. 6A and 6B are examples of the timing chart of a semiconductor device of the present invention.
Figure 6A:
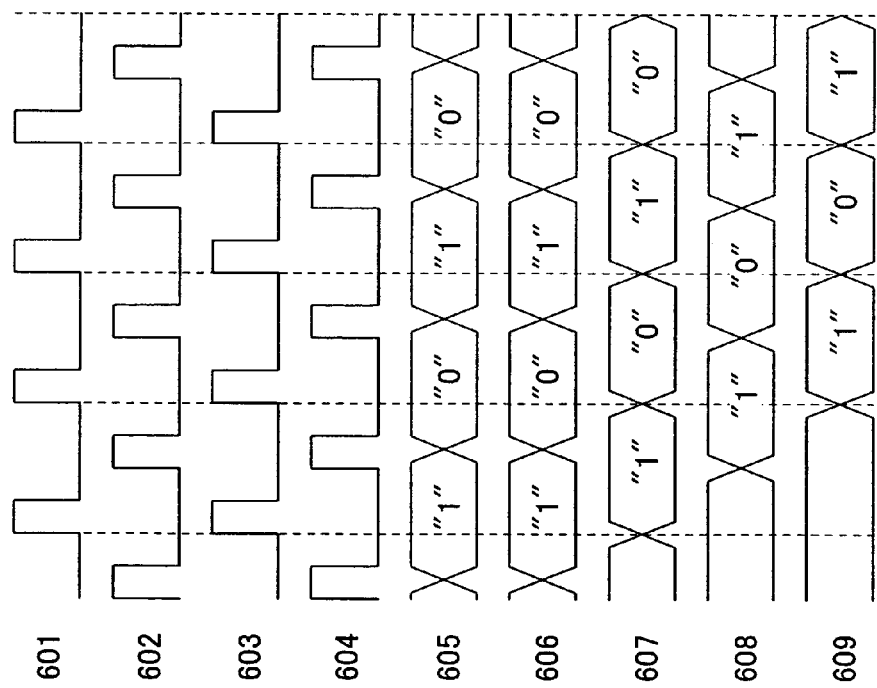

As an embodiment mode of a semiconductor device of the present invention, first, FIG. 5 and FIGS. 6A and 6B show that the data racing in a synchronous circuit can be prevented by a non-overlapping clock. FIG. 5 shows a shift register as an example of a synchronous circuit included in a semiconductor device of the present invention. FIGS. 6A and 6B are timing charts of behavior of the shift register shown in FIG. 5. In FIG. 5, first to fourth latches 501 to 504 are connected in series. The first to fourth latches 501 to 504 are level sensitive latches for supplying first to fourth clock signals as gate signals respectively to first to fourth clock wirings 505 to 508. Accordingly, the first to fourth latches 501 to 504 respectively store voltage values of first to fourth data wirings 509 to 512 when the first to fourth clock signals supplied to the first to fourth clock wirings 505 to 508 are "1", and the stored voltage values are outputted to second to fifth data wirings 510 to 513.

Here, the shift register shown in FIG. 5 is equivalent to a circuit in which two FFs are connected in series under the following conditions: the first latch 501 and the second latch 502 compose the first FF, and a third latch 503 and the fourth latch 504 compose a second FF. Here, clock signals are supplied to the second clock wiring 506 and the fourth clock wiring 508, and inverted outputs of the clock signals are supplied to the first clock wiring 505 and the third clock wiring 507. In this manner, an arbitrary synchronous circuit can be configured using a latch.

Next, description will be given with reference to timing charts shown in FIGS. 6A and 6B. FIG. 6A is a timing chart illustrating the case where the synchronous circuit in FIG. 5 operates ideally. Here, timing charts of first to fourth clock signals supplied to the first to fourth clock wirings 505 to 508 shown in FIG. 5 are first to fourth clock signals 601 to 604 in FIG. 6A respectively. Here, there is no delay between the first clock signal 601 and the third clock signal 603. Further, there is no delay either between the second clock signal 602 and the fourth clock signal 604. In addition, a timing chart of the voltage value of the first data wiring 509 in FIG. 5 is a first data signal 605 in FIG. 6. In this case, timing charts of the voltage values of the second to fifth data wirings 510 to 513 in FIG. 5 are second to fifth data signals 606 to 609 in FIG. 6A.

Suppose there is delay between the first clock signal and the third clock signal which are supplied to the first clock wiring 505 and the third clock wiring 507 in FIG. 5, in addition, there is delay also between the second clock signal and the fourth clock signal supplied to the second clock wiring 506 and the fourth clock wiring 508 in FIG. 5. Here, timing charts of the first to fourth clock signals supplied to the first to fourth clock wirings 505 to 508 in FIG. 5 are first to fourth clock signals 611 to 614 in FIG. 6 B respectively. Here, delay time between the first clock signal 611 and the third clock signal 613 corresponds to 620, and delay time between the second clock signal 612 and the fourth clock signal 614 corresponds to 621. In addition, a timing chart of the voltage value of the first data wiring 509 in FIG. 5 is a first data signal 615 in FIG. 6 B. In this case, timing charts of the voltage values of the second to fifth data wirings 510 to 513 in FIG. 5 correspond to second to fifth data signals 616 to 619 in FIG. 6 B. The second data signal 616 and the third data signal 617 in FIG. 6 B correspond respectively to the second data signal 606 and the third data signal 607 in FIG. 6 A. Further, values of the fourth data signal 618 and the fifth data signal 619 in FIG. 6B are outputted with delay times of 620 and 621 with respect to the second data signal 605 and the third data signal 606 in FIG. 6 A respectively; however, it is found that data racing does not occur.

As described above, a synchronous circuit using an FF of a non-overlapping clock has a configuration in which data racing hardly occurs. When a period where both the positive clock signal and the negative clock signal are "LOW", namely "0", is changed, extended here, a margin with respect to delay of a clock signal can be increased. In other words, if operation frequency of the synchronous circuit is reduced and duty ratio of the clock signal is reduced, a malfunction due to delay of the clock signal can be prevented. Meanwhile, when a period where both the positive clock signal and the negative clock signal are "HIGH", namely "1", is increased, operation frequency of the synchronous circuit can be reduced. Thus, the condition of LOW or HIGH of the clock signal can be set as appropriate.

FIG. 1 shows a configuration of a wireless chip as an embodiment mode of a semiconductor device of the present invention. In FIG. 1, a wireless chip 101 includes an arithmetic circuit 102, a clock generation circuit 103, a power control circuit 104, a modulation/demodulation circuit 105, an antenna 106, a resonant circuit 107, and a power supply circuit 108. Note that in FIG. 1, communication signals are shown separately as a received signal 109 and a transmitted signal 110 for simplifying the explanation; however, actually they constitute an integrated signal, and the signal is simultaneously transmitted and received between the wireless chip 101 and a reader/writer. Hereinafter, communication signals refer to received signals or transmitted signals. The received signal 109 is received with the antenna 106 and the resonant circuit 107 and then demodulated by the modulation/demodulation circuit 105. Further, the transmitted signal 110 is modulated by the modulation/demodulation circuit 105 and then transmitted by the antenna 106.

In FIG. 1, when the wireless chip 101 is placed inside the magnetic field generated by a communication signal, induced electromotive force is produced by the antenna 106 and the resonant circuit 107. The induced electromotive force is held in a capacitor in the power supply circuit 108, further, the potential is stabilized by the capacitance, and the induced electromotive force is supplied as supply voltage to each circuit of the wireless chip 101. The modulation/demodulation circuit 105 detects amplitude variation of the received signal 109 of an ASK system as received data of "0"/"1". The modulation/demodulation circuit 105 is, for example, a low-pass filter. Further, the modulation/demodulation circuit 105 transmits transmitted data by varying amplitude of the transmitted signal 110 of an ASK system. For example, in the case where a transmitted data 112 is "0", the resonance point of the resonant circuit 107 is changed, thereby changing amplitude of the communication signal.

As to the arithmetic circuit 102, an optimal arithmetic method is selected in accordance with the purpose, and the arithmetic circuit can be configured based on the method. There are arithmetic methods using hardware, using software, and using both hardware and software. In the method of processing using hardware, an arithmetic circuit is a dedicated circuit. In the method of processing using software, an arithmetic circuit includes a CPU and a large scale memory, the CPU executes a program. In the method of processing using both hardware and software, an arithmetic circuit includes a dedicated circuit, a CPU, and a memory; the dedicated circuit performs a part of arithmetic processing, and the CPU executes programs other than arithmetic processing.

A function of changing a cycle of non-overlapping clock and the duty ratio in accordance with the operating environment, which is the main feature of a semiconductor device of the present invention, is realized using the clock generation circuit 103 and the power control circuit 104.

The clock generation circuit 103 generates a non-overlapping clock signal 111 to be supplied to the arithmetic circuit 102. The power control circuit 104 generates a control signal 114 supplied to the clock generation circuit 103 by supply voltage supplied by the power supply circuit 108. In the clock generation circuit 103, a cycle and the duty ratio of a non-overlapping clock signal 113 are controlled by the control signal 114 supplied from the power control circuit 104.

The non-overlapping clock signal 113 is generated from a reference clock signal. For example, in the case of using a reference clock having the same frequency as a received signal, after the received signal is half-wave rectified by a diode and processed through an inverter circuit, so that the non-overlapping clock signal 113 can be generated. Further, a reference clock having higher frequency is generated, and the non-overlapping clock signal 113 is generated using the reference clock. For example, a PLL (Phase Lock Loop) circuit is provided.

The cycle and the duty ratio of a clock signal can be changed by using a circuit in which divide-by-n (n≧2) counter is operated using the reference clock, and the positive clock signal is "1" in the case where the counter value is mpr to mpf (0≦mpr≦mpf≦n−1), while the negative clock signal is "1" in the case where the counter value is mnr to mnf (0≦mnr≦mnf≦n−1), and by changing n, mpr, mpf, mnr, and mnf, in accordance with the control signal 114 as appropriate. As described above, a non-overlapping clock signal can be generated from the control signal 114 generated by the power control circuit 104. Such a non-overlapping clock signal is inputted to a latch circuit such as a level sensitive latch or the like.

The power control circuit 104 monitors supply voltage in the power supply circuit 108, and generates the control signal 114 of the clock generation circuit 103. For example, the power control circuit 104 is provided with a regulator circuit, and reference voltage is generated from supply voltage applied by the power supply circuit 108. The control signal 114 is generated in accordance with a result of comparing the reference voltage with supply voltage applied by the power supply circuit 108. As described above, the control signal 114 is generated from supply voltage value applied by the arithmetic circuit 102.

The control signal 114 generated in the power control circuit 104 is, for example, "11" in the case where the supply voltage value is a desired value, and "10", "01", or "00" in order of increasing supply voltage value, namely, in order of increasing delay of a clock signal. At that time, when the control signal 114 is "11" for example, the clock generation circuit 103 generates a clock signal having a frequency of 100 MHz and a duty ratio of 30%. Alternatively a clock signal having at a frequency of 80 MHz and a duty ratio of 30% may be generated in the case where the control signal 114 is "10", a clock signal having a frequency of 50 MHz and a duty ratio of 40% may be generated in the case of "01", and a clock signal having a frequency of 30 MHz and a duty ratio of 40% may be generated in the case of "00".

Note that the type of the control signal 114 generated in the power control circuit 104 depends on the configurations of the clock generation circuit 103 or the power control circuit 104. Further, a specific value of the frequency or duty ratio of the clock signal depends on the circuit scale and required specifications of an arithmetic circuit. Accordingly, specific configurations of the clock generation circuit, the power control circuit, and the control signal can be determined by a practitioner.

Further, as to a semiconductor device of the present invention, when current consumption is high, a circuit mounted on the semiconductor device produces heat, and delay of the clock signal is increased. Accordingly, there occurs the same problem as the case where the supply voltage varies. Therefore, it is also effective to monitor current consumption, thereby changing the cycle and the duty ratio of a non-overlapping clock.

The control signal 114 of clock generation circuit 103 can be generated by monitoring current consumption in the arithmetic circuit 102 with the power control circuit 104. For example, a reference voltage is generated from a supply voltage applied by the power supply circuit 108 using a regulator circuit provided. The control signal 114 is generated in accordance with the result of comparing the reference voltage with voltage generated in a reference resistor interposed between the power supply circuit 108 and the arithmetic circuit 102, that is, voltage in proportion to current consumption in the arithmetic circuit 102. As described above, the control signal 114 is generated from the value of current supplied to the arithmetic circuit 102.

The control signal 114 generated in the power control circuit 104 is, for example, "00" in the case where the current value is a desired value, and "01", "10", or "11" in order of increasing current value, namely, in order of increasing delay of a clock signal. At that time, when the control signal 114 is "00" for example, the clock generation circuit 103 generates a clock signal having a frequency of 100 MHz and a duty ratio of 30%. Alternatively a clock signal having a frequency of 80 MHz and a duty ratio of 30% is generated in the case where the control signal 114 is "01", a clock signal having a frequency of 50 MHz and a duty ratio of 40% is generated in the case of "10", and a clock signal having a frequency of 30 MHz and a duty ratio of 40% are generated in the case of "11".

Note that the type of the control signal 114 generated in the power control circuit 104 depends on the configurations of the clock generation circuit 103 or the power control circuit 104. Further, a specific value of the frequency or duty ratio of the clock signal depends on the circuit scale and required specifications of an arithmetic circuit. Accordingly, specific configurations of the clock generation circuit or the power control circuit, or a specific value of the control signal can be determined by a practitioner.

With the above described configuration, even in the case where supply voltage of a semiconductor device varies and there occurs delay in propagating clock signals, an arithmetic circuit can be operated stably. Accordingly, a highly reliable semiconductor device having a high performance arithmetic circuit can be provided. Further, in a wireless chip in which supply voltage is supplied by induced electromotive force from a communication signal and communication data are transmitted/received by an ASK system, even when the communication signal is unstable or supply voltage is unstable, a synchronous circuit can be operated stably. Therefore, a high performance and highly reliable wireless chip equipped with a large scale arithmetic circuit can be provided with a suitable structure.

In particular, when a semiconductor device of the present invention is manufactured using thin film transistors having a semiconductor film as an active layer, which is formed over a substrate having an insulating surface such as a glass substrate, a quartz substrate, or a plastic substrate, a large area substrate can be used in a manufacturing process. Therefore, manufacturing cost of a semiconductor device of the present invention can be substantially reduced. In addition, particularly in the case of using a plastic substrate that has mechanical flexibility, a completed semiconductor device in the present invention can be handled in various forms besides the reduction in manufacturing cost.

Embodiments

Embodiments of the present invention will be described with reference to the drawings.

Embodiment 1

Figure 7:
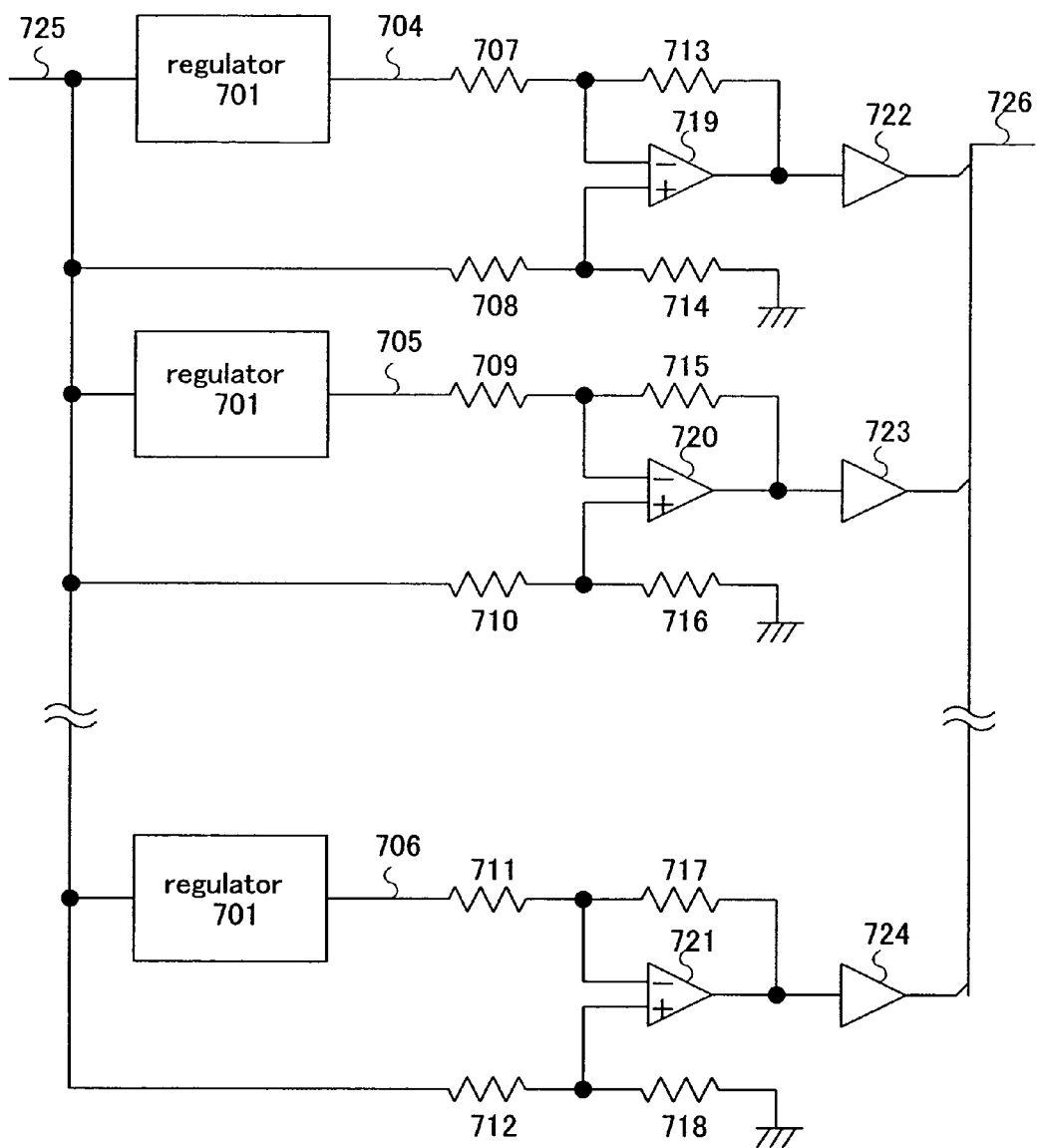
FIG. 7 shows a power control circuit of a semiconductor device of the present invention (1)
Figure 8:
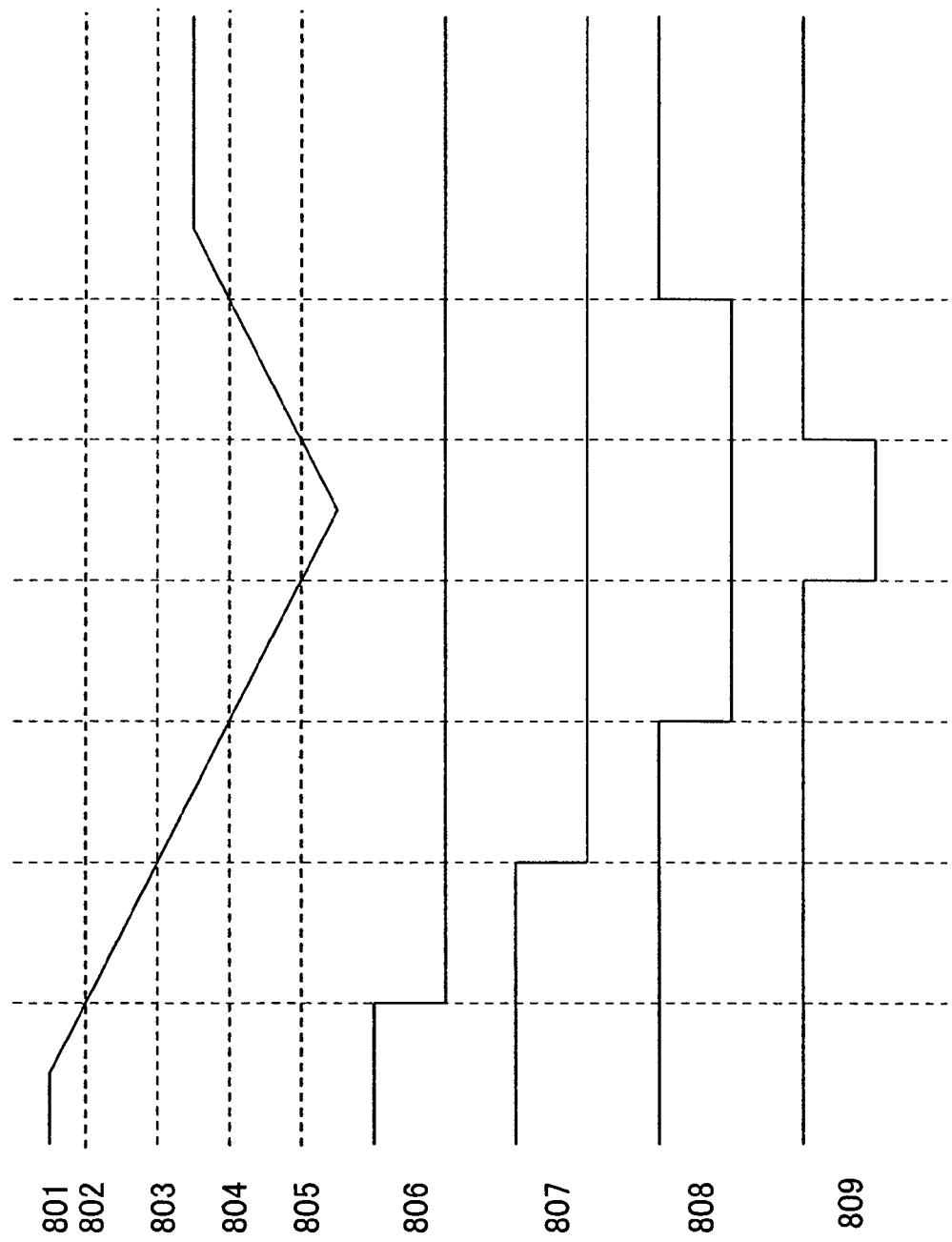
FIG. 8 is an example of the timing chart of a power control circuit of a semiconductor device of the present invention (1)

In this embodiment, as an example of a power control circuit in the configuration described in the embodiment mode, a method of controlling clock signals by monitoring variation in supply voltage will be described with reference to FIG. 7 and FIG. 8. FIG. 7 shows a circuit diagram of a power control circuit in this embodiment. FIG. 8 is a flowchart showing behavior of a power control circuit in this embodiment.

First, a circuit diagram of a power control circuit of this embodiment will be described with reference to FIG. 7. In FIG. 7, an output terminal of a first regulator 701 is connected to a resistor 707, an output terminal of a second regulator 702 is connected to a resistor 709, and an output terminal of an nth regulator 703 is connected to a resistor 711. An input terminal of a first operational amplifier 719 is connected to resistors 707, 708, 713, and 714, and the output terminal is connected to the resistor 713 and a first digital buffer 722. An input terminal of a second operational amplifier 720 is connected to resistors 709, 710, 715, and 716, and the output terminal is connected to the resistor 715 and a second digital buffer 723. An input terminal of an nth operational amplifier 721 is connected to resistors 711, 712, 717, and 718, and the output terminal is connected to the resistor 717 and an nth digital buffer 724.

In FIG. 7, supply voltage supplied from the power supply circuit 108 in FIG. 1 is supplied to first to the nth regulators 701 to 703 through a wiring 725, and first to nth reference potentials are outputted to first to nth reference potential wirings 704 to 706. Supply voltage and the first to nth reference potentials are inputted to the first to nth operational amplifiers 719 to 721 via the resistors 707 to 718 as shown in FIG. 7. Note that the resistors 707 to 718 constitute required resistance for operating the first to nth operational amplifiers 719 to 721 as differential amplifier circuits. Outputs of the first to nth operational amplifiers 719 to 721 generate digital signals through the first to nth digital buffers 722 to 724, and are outputted to a wiring 726. They become control signals 114 inputted to the clock generation circuit 103 from the power control circuit 104 in FIG. 1.

Next, behavior of a power control circuit of this embodiment will be described with reference to FIG. 8. Here, a power control circuit in FIG. 7 in the case of n=4 will be described. In FIG. 8, a timing chart of supply voltage supplied from the power supply circuit 108 in FIG. 1 shall be 801. Timing charts of first to fourth reference potentials generated by first to fourth regulators shall be 802 to 805. At that time, 806 to 809 are timing charts of outputs of first to fourth digital buffers. Here, if supply voltage is lower than each of the first to fourth reference potentials, outputs of each of the first to fourth digital buffers is "0".

With a configuration of a power control circuit described above, the state of supply voltage supplied by the power supply circuit 108 can be detected in accordance with the control signals 114 (outputs of the first to fourth digital buffers). Specifically, it can be detected that supply voltage is low in order of the cases where the control signals 114 are "1", "1", "1", "1"; "0", "1", "1", "1"; "0", "0", "1", "1"; "0", "0", "0", "1"; and "0", "0", "0", "0". Accordingly, frequency of a non-overlapping clock of the clock generation circuit 103 can be changed using the control signal 114. Otherwise, the duty ratio of the clock generation circuit 103 may be changed using the control signal 114. Specifically, as the detected supply voltage is lower, frequency of a non-overlapping clock may be reduced. Alternatively, as the detected supply voltage is lower, the duty ratio may preferably be reduced.

Note that, in accordance with the state of the supply voltage detected in the power control circuit 104, frequency of the non-overlapping clock of the clock generation circuit 103, or the specific value of the duty ratio can be determined by a practitioner in consideration of the circuit scale, power consumption, operational performance, or the like of the arithmetic circuit provided on a semiconductor device.

With the above described configuration, even in the case where supply voltage of a semiconductor device varies and there occurs delay in propagating clock signals, an arithmetic circuit can be operated stably. Accordingly, a highly reliable semiconductor device having a high performance arithmetic circuit can be provided. In particular, such a configuration is effective in the case of forming a semiconductor device from thin film transistors. Further, in a wireless chip in which supply voltage is supplied by induced electromotive force from a communication signal and communication data are transmitted/received by an ASK system, even when the communication signal is unstable or supply voltage is unstable, a synchronous circuit can be operated stably. Therefore, a high performance and highly reliable wireless chip equipped with a large scale arithmetic circuit can be provided with a suitable structure.

Embodiment 2

Figure 9:
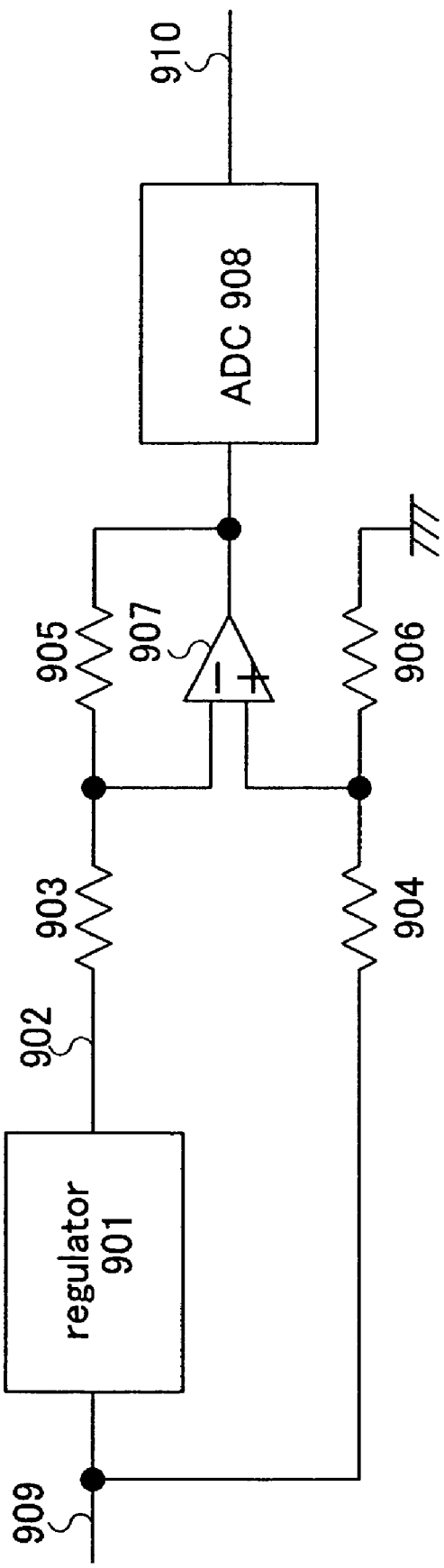
FIG. 9 shows a power control circuit of a semiconductor device of the present invention (2)

In this embodiment, as an example of a power control circuit in the configuration described in the embodiment mode, a method of controlling clock signals by monitoring variation in supply voltage unlike in Embodiment 1 will be described with reference to FIG. 9 and FIG. 10. FIG. 9 shows a circuit diagram of a power control circuit in this embodiment. FIG. 10 is a flowchart showing behavior of a power control circuit in this embodiment.

First, a circuit diagram of a power control circuit of this embodiment will be described with reference to FIG. 9. An output terminal of a first regulator 901 in FIG. 9 is connected to a resistor 903. An input terminal of a first operational amplifier 907 is connected to resistors 903, 904, 905, and 906, and the output terminal is connected to the resistor 905 and an ADC (Analog-Digital Converter) 908.

In FIG. 9, supply voltage supplied from the power supply circuit 108 in FIG. 1 is supplied to the regulator 901 through a wiring 909, and a reference potential is outputted to a reference potential wiring 902. Supply voltage and the reference potential are inputted to the operational amplifier 907 via the resistors 903 to 906 through the wiring 909 and the reference potential wiring 902 as shown in FIG. 9. Note that the resistors 903 to 906 constitute required resistance for operating the operational amplifier 907 as a differential amplifier circuit. Output voltage of the operational amplifier 907 generates a digital signal by the ADC 908, and is outputted to a wiring 910. It becomes a control signal 114 to the clock generation circuit 103 from the power control circuit 104 in FIG. 1.

Next, behavior of a power control circuit of this embodiment will be described with reference to FIG. 10. Here, a power control circuit in FIG. 9 in the case of detecting the supply voltage in four levels will be described. In FIG. 10, a timing chart of supply voltage supplied from the power supply circuit 108 in FIG. 1 shall be 1001. A timing chart of a reference potential generated by the regulator 901 in FIG. 9 shall be 1002. At that time, 1003 is a timing chart of the control signal 114. Here, the control signal 114 is "00", "01", "10", and "11" in order of increasing supply voltage, that is, in order of increasing difference between the reference potential and the supply voltage.

With a configuration of a power control circuit described above, the state of supply voltage supplied by the power supply circuit 108 can be detected. Specifically, it can be detected that supply voltage is low in order of the cases where the control signal 114 is "11", "10", "01", and "00". Accordingly, frequency of a non-overlapping clock in the clock generation circuit 103 may be changed using the control signal 114. Otherwise, the duty ratio of the clock generation circuit 103 may be changed using the control signal 114. Specifically, as the detected supply voltage is lower, frequency of a non-overlapping clock may be reduced. Alternatively, as the detected supply voltage is lower, the duty ratio may preferably be reduced.

Note that, in accordance with the state of the supply voltage detected in the power control circuit 104, frequency of the non-overlapping clock of the clock generation circuit 103, or the specific value of the duty ratio can be determined by a practitioner in consideration of the circuit scale, power consumption, operational performance, or the like of the arithmetic circuit provided on a semiconductor device.

With the above described configuration, even in the case where supply voltage of a semiconductor device varies and there occurs delay in propagating clock signals, an arithmetic circuit can be operated stably. Accordingly, a highly reliable semiconductor device having a high performance arithmetic circuit can be provided. In particular, such a configuration is effective in the case of forming a semiconductor device from thin film transistors. Further, in a wireless chip in which supply voltage is supplied by induced electromotive force from a communication signal and communication data are transmitted/received by an ASK system, even when the communication signal is unstable or supply voltage is unstable, a synchronous circuit can be operated stably. Therefore, a high performance and highly reliable wireless chip equipped with a large scale arithmetic circuit can be provided with a suitable structure.

Embodiment 3

Figure 22:
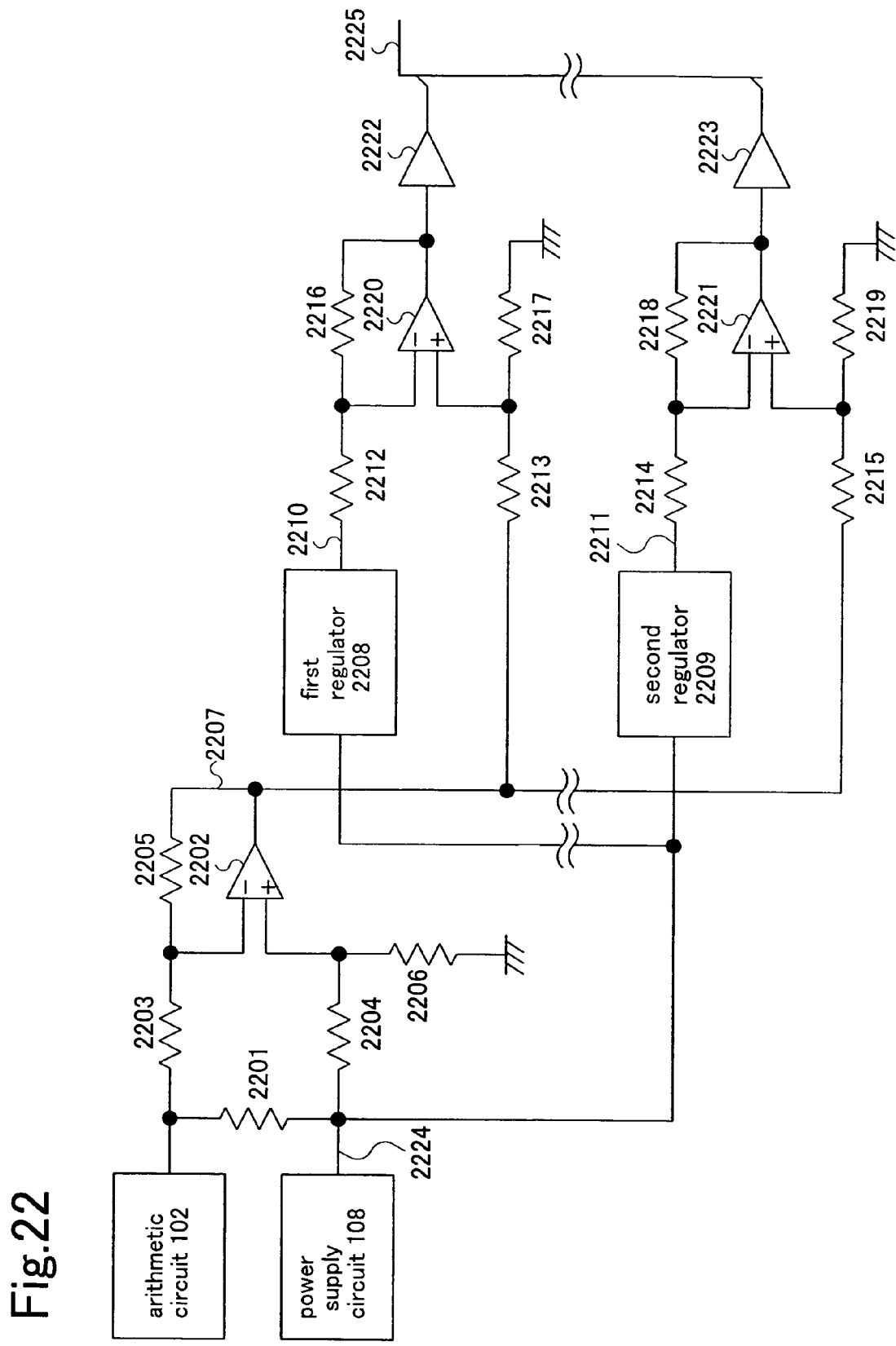
FIG. 22 shows a power control circuit of a semiconductor device of the present invention (3)
Figure 23:
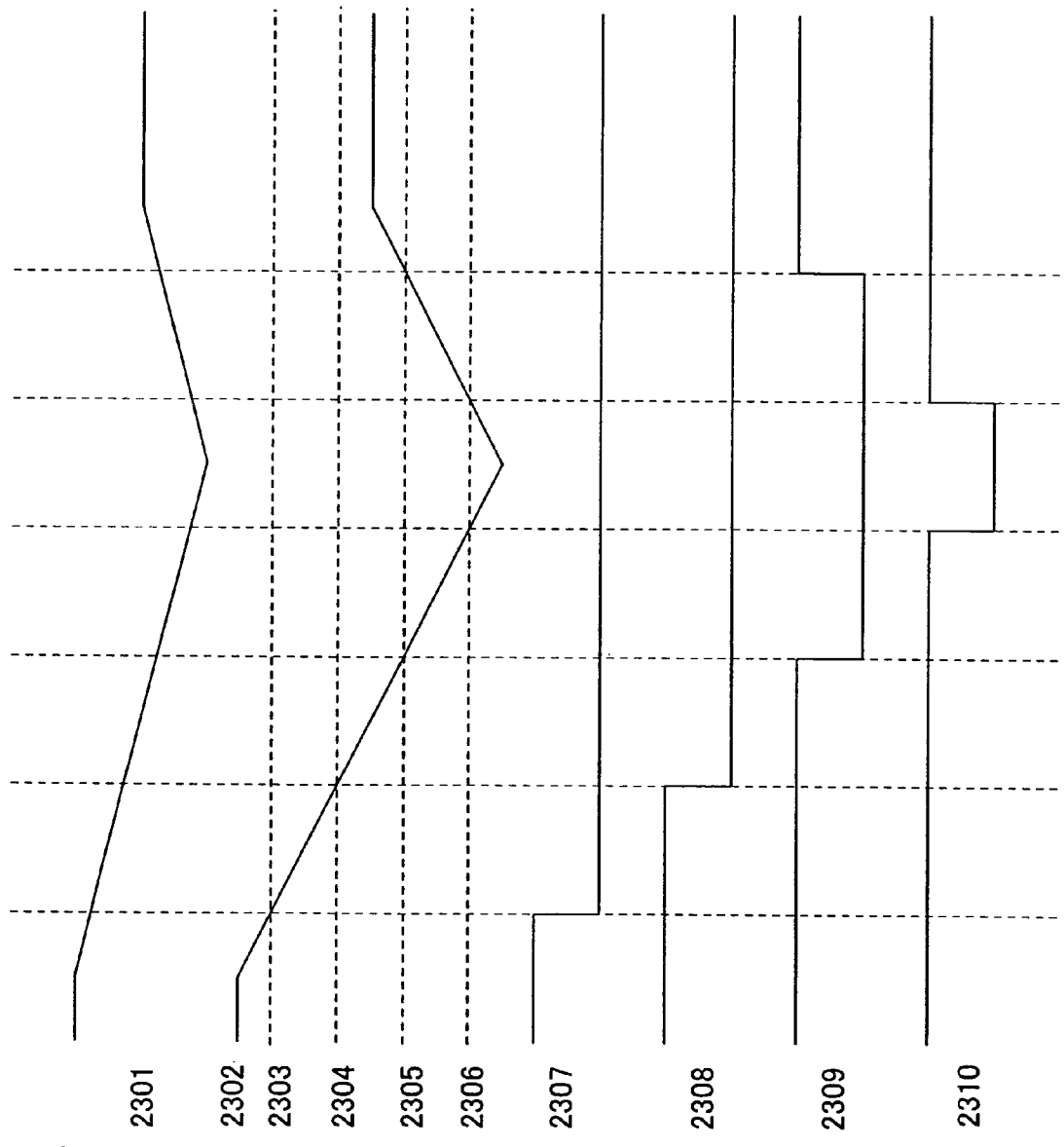
FIG. 23 is an example of the timing chart of a power control circuit of a semiconductor device of the present invention (3)

In this embodiment, as an example of a power control circuit in the configuration described in the embodiment mode, a method of controlling clock signals by monitoring current consumption in an arithmetic circuit will be described with reference to FIG. 22 and FIG. 23. FIG. 22 shows a circuit diagram of a power control circuit. FIG. 23 is a flowchart showing behavior of a power control circuit in this embodiment.

First, a circuit diagram of a power control circuit of this embodiment will be described with reference to FIG. 22. In FIG. 22, an input terminal of a first operational amplifier 2202 is connected to resistors 2203, 2204, 2205, and 2206, and the output terminal is connected to resistors 2205, 2213, and 2215. An output terminal of a first regulator 2208 is connected to a resistor 2212, and an output terminal of a second regulator 2209 is connected to a resistor 2214. An input terminal of the second operational amplifier 2220 is connected to resistors 2212, 2213, 2216, and 2217, and the output terminal is connected to the resistor 2216 and a first digital buffer 2222. An input terminal of an (n+1)th operational amplifier 2221 is connected to resistors 2214, 2215, 2218, and 2219, and the output terminal is connected to the resistor 2218 and a second digital buffer 2223.

In FIG. 22, supply voltage supplied from the power supply circuit 108 in FIG. 1 is supplied to the arithmetic circuit 102 in FIG. 1 via a monitor resistor 2201 through a wiring 2224. Voltage in proportion to current consumption in the arithmetic circuit 102 is generated between each end of the monitor resistor 2201. Assume that the voltage is input voltage of an amplifier circuit having a first operational amplifier 2202 and the first to fourth resistors 2203 to 2206, monitor voltage is outputted to a monitor voltage wiring 2207.

Supply voltage is supplied to first to nth regulators 2208 and 2209, and first to nth reference potentials are outputted to first to nth reference potential wirings 2210 and 2211. Monitor voltage and the first to nth reference potentials are inputted to second to (n+1)th operational amplifiers 2220 and 2221 via the resistors 2212 to 2219 as shown in FIG. 22. Note that the resistors 2212 to 2219 constitute required resistance for operating the second to (n+1)th operational amplifiers 2220 and 2221 as differential amplifier circuits. Outputs of the second to (n+1)th operational amplifiers 2220 to 2221 generate digital signals through the first to nth digital buffers 2222 to 2223, and are outputted to a wiring 2225. They become control signals 114 inputted to the clock generation circuit 103 from the power control circuit 104 in FIG. 1.

Next, behavior of a power control circuit of this embodiment will be described with reference to FIG. 23. Here, a power control circuit in FIG. 22 in the case of n=4 will be described. In FIG. 23, 2301 is a timing chart of current supplied to the monitor resistor 2201 in FIG. 22, that is, current consumption in the arithmetic circuit 102. Meanwhile, 2302 is a timing chart of the monitor voltage. Timing charts of first to fourth reference potentials generated by first to fourth regulators shall be 2303 to 2306. At that time, 2307 to 2310 are timing charts of outputs of first to fourth digital buffers.

Here, if monitor voltage of the monitor voltage wiring 2207 is lower than each of the first to fourth reference potentials, output of each of the first to fourth digital buffers is "0".

With a configuration of a power control circuit described above, the state of current consumption supplied by the arithmetic circuit 102 can be detected in accordance with the control signals 114 (outputs of the first to fourth digital buffers). Specifically, it can be detected that current consumption is low in order of the cases where the control signals 114 are "0", "0", "0", "0"; "0", "0", "0", "1"; "0", "0", "1", "1"; "0", "1", "1", "1"; and "1", "1", "1", "1". Accordingly, frequency of a non-overlapping clock in the clock generation circuit 103 may be changed using the control signal 114. Otherwise, the duty ratio may be changed. Specifically, as the detected current consumption is larger, frequency of a non-overlapping clock may be reduced.

Note that, in accordance with the state of the supply voltage detected in the power control circuit 104, frequency of the non-overlapping clock of the clock generation circuit 103, or the specific value of the duty ratio can be determined by a practitioner in consideration of the circuit scale, power consumption, operational performance, or the like of the arithmetic circuit provided on a semiconductor device.

With the above described configuration, even in the case where supply voltage of a semiconductor device varies and there occurs delay in propagating clock signals, an arithmetic circuit can be operated stably. Accordingly, a highly reliable semiconductor device having a high performance arithmetic circuit can be provided. In particular, such a configuration is effective in the case of forming a semiconductor device from thin film transistors. Further, in a wireless chip in which supply voltage is supplied by induced electromotive force from a communication signal and communication data are transmitted/received by an ASK system, even when the communication signal is unstable or supply voltage is unstable, a synchronous circuit can be operated stably. Therefore, a high performance and highly reliable wireless chip equipped with a large scale arithmetic circuit can be provided with a suitable structure.

Embodiment 4

Figure 24:
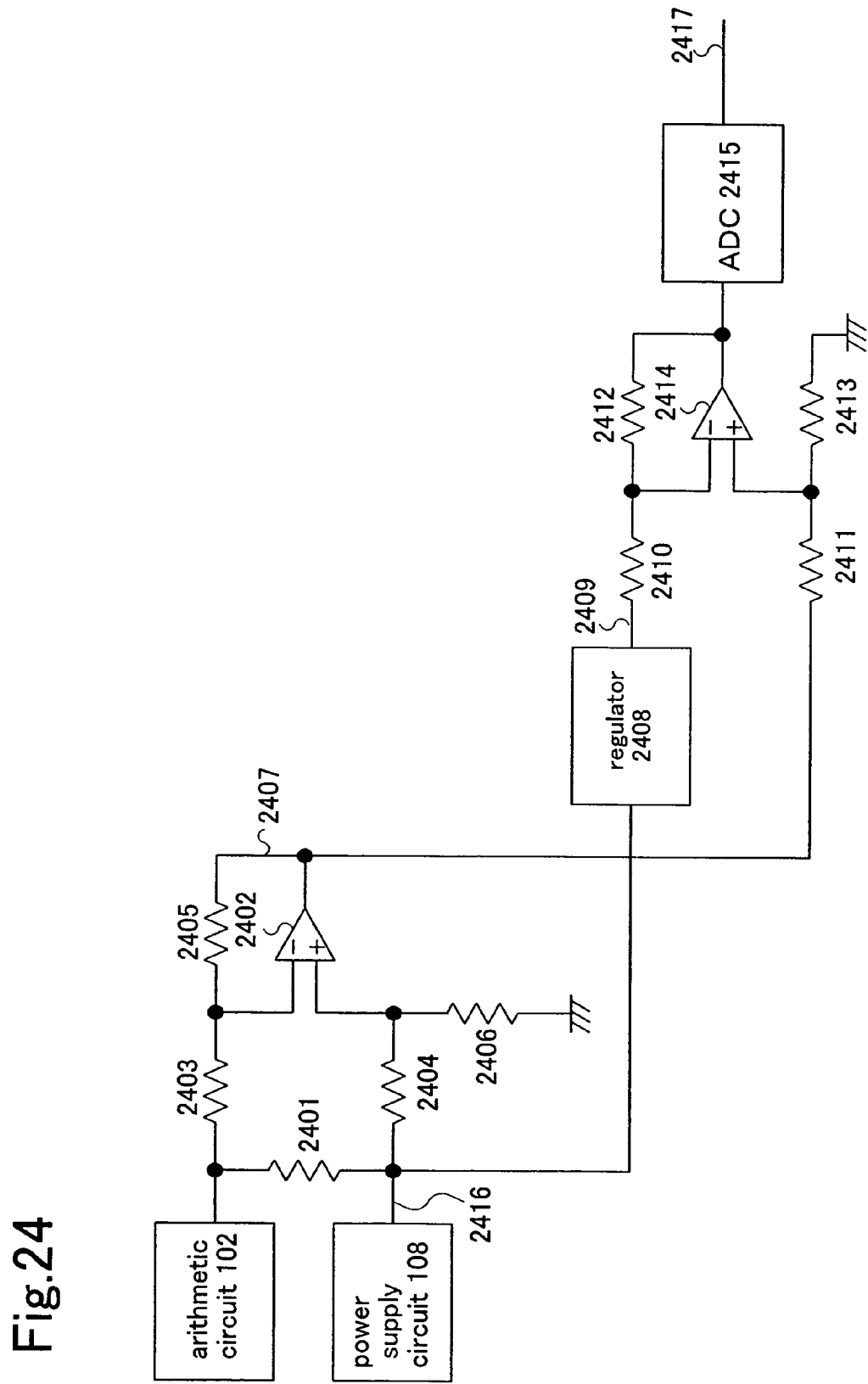
FIG. 24 shows a power control circuit of a semiconductor device of the present invention (4)
Figure 25:
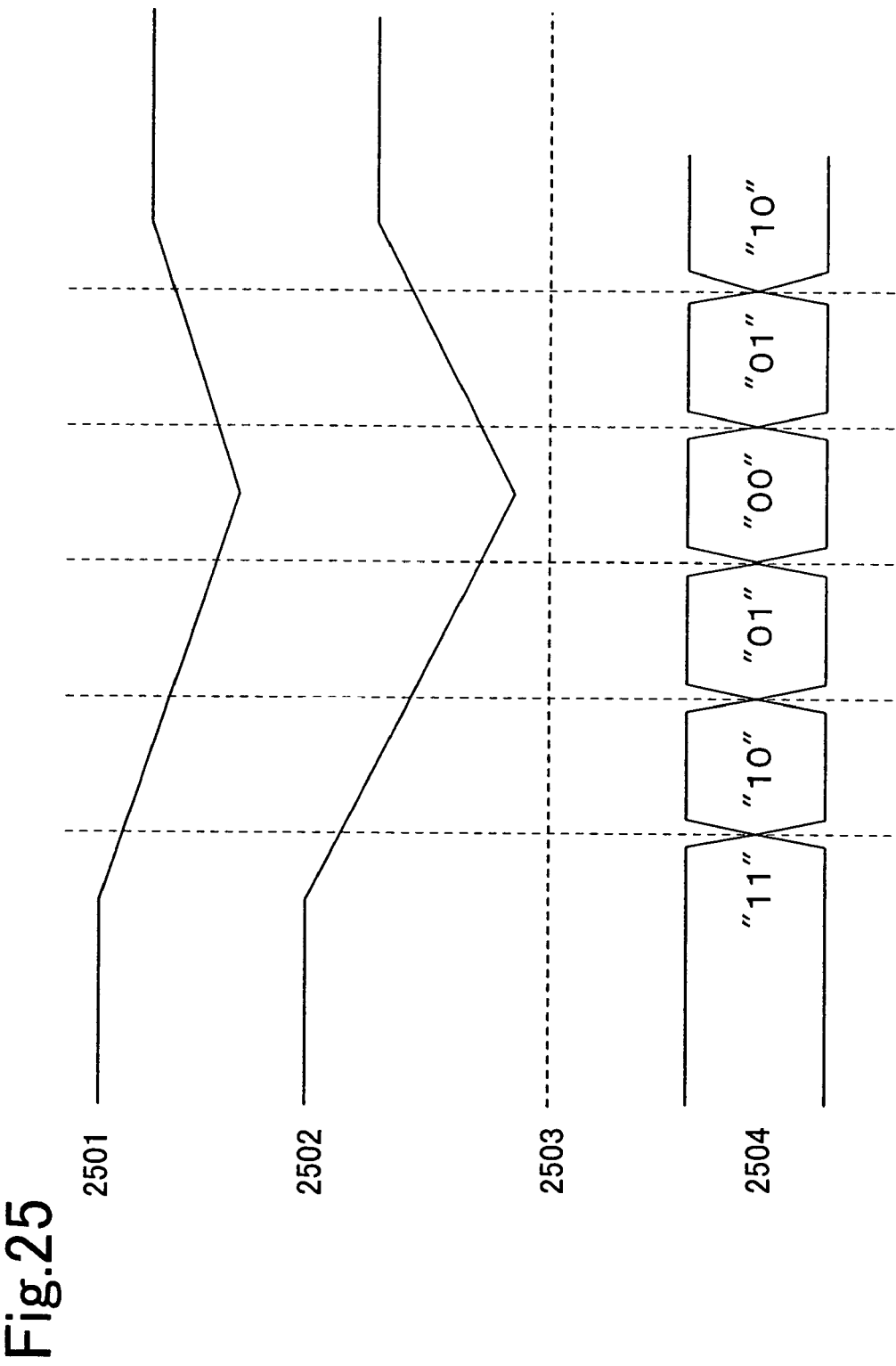
FIG. 25 is an example of the timing chart of a power control circuit of a semiconductor device of the present invention (4)

In this embodiment, as an example of a power control circuit in the configuration described in the embodiment mode, a method of controlling clock signals by monitoring variation in current consumption unlike in Embodiment 3 will be described with reference to FIG. 24 and FIG. 25. FIG. 24 shows a circuit diagram of a power control circuit. FIG. 25 is a flowchart showing behavior of a power control circuit in this embodiment.

First, a circuit diagram of a power control circuit of this embodiment will be described with reference to FIG. 24. In FIG. 24, an input terminal of a first operational amplifier 2402 is connected to resistors 2403, 2404, 2405, and 2406, and the output terminal is connected to the resistor 2405 and a regulator 2408. An output terminal of the regulator 2408 is connected to a resistor 2410. An input terminal of a second operational amplifier 2414 is connected to resistors 2410, 2411, 2412, and 2413, and the output terminal is connected to an ADC 2415.

In FIG. 24, supply voltage supplied from the power supply circuit 108 in FIG. 1 is supplied to the arithmetic circuit 102 in FIG. 1 via a monitor resistor 2401 through a wiring 2416. Voltage in proportion to current consumption in the arithmetic circuit 102 is generated between each end of the monitor resistor 2401. Assume that the voltage is input voltage of an amplifier circuit including the first operational amplifier 2402 and the first to fourth resistors 2403 to 2406, monitor voltage is outputted to a monitor voltage wiring 2407.

Supply voltage is supplied to the regulator 2408 through the wiring 2416, and a reference potential is outputted to a reference potential wiring 2409. Supply voltage and reference potential are inputted to the second operational amplifier 2414 via the resistors 2410 to 2413 as shown in FIG. 24. Note that the resistors 2410 to 2413 constitute required resistance for operating the second operational amplifier 2414 as a differential amplifier circuit. Output of the second operational amplifier 2414 generates a digital signal by the ADC 2415, and outputted to a wiring 2417. It becomes a control signal 114 inputted to the clock generation circuit 103 from the power control circuit 104 in FIG. 1.

Next, behavior of a power control circuit of this embodiment will be described with reference to FIG. 25. Here, a power control circuit in FIG. 24 in the case of detecting the supply voltage in four levels will be described. In FIG. 25, a timing chart of current supplied to the monitor resistor 2401, that is, current consumption of the arithmetic circuit 102 in FIG. 24 shall be 2501. A timing chart of the monitor voltage shall be 2502. A timing chart of a reference potential generated by the regulator 2408 in FIG. 24 shall be 2503. At that time, 2504 is a timing chart of the control signal 114. The control signal 114 is "00", "01", "10", and "11" in order of increasing monitor voltage, that is, in order of increasing current consumption.

With a configuration of a power control circuit described above, the state of current consumption in the arithmetic circuit 102 can be detected. Specifically, it can be detected that current consumption is higher in order of the cases where the control signal 114 is "11", "10", "01", and "00". Accordingly, frequency of a non-overlapping clock in the clock generation circuit 103 may be changed using the control signal 114. Otherwise, the duty ratio may be changed. Specifically, as the detected current consumption is higher, frequency of a non-overlapping clock or duty ratio may preferably be reduced.

Note that, in accordance with the state of the supply voltage detected in the power control circuit 104, frequency of the non-overlapping clock of the clock generation circuit 103, or the specific value of the duty ratio can be determined by a practitioner in consideration of the circuit scale, power consumption, operational performance, or the like of the arithmetic circuit provided on a semiconductor device.

With the above described configuration, even in the case where supply voltage of a semiconductor device varies and there occurs delay in propagating clock signals, an arithmetic circuit can be operated stably. Accordingly, a highly reliable semiconductor device having a high performance arithmetic circuit can be provided. In particular, such a configuration is effective in the case of forming a semiconductor device from thin film transistors. Further, in a wireless chip in which supply voltage is supplied by induced electromotive force from a communication signal and communication data are transmitted/received by an ASK system, even when the communication signal is unstable or supply voltage is unstable, a synchronous circuit can be operated stably. Therefore, a high performance and highly reliable wireless chip equipped with a large scale arithmetic circuit can be provided with a suitable structure.

Embodiment 5

In this embodiment, the case where a semiconductor device of the invention is structured using thin film transistors (TFTs) will be described with reference to FIGS. 11A and 11B.

Figure 11A:
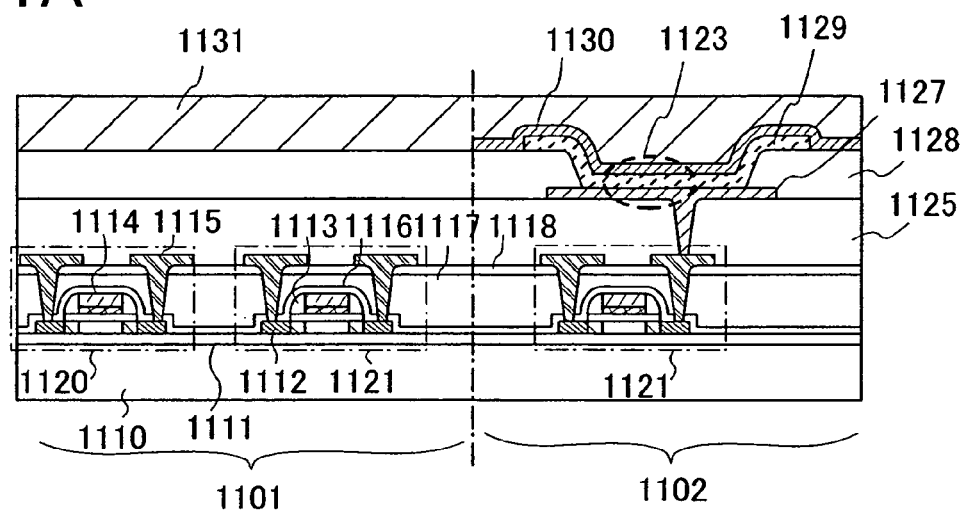
FIGS. 11A and 11B are cross-sectional views of a semiconductor device of the present invention (1)

FIG. 11A is a cross-sectional view of a TFT portion 1101 and a memory portion 1102 formed over an insulating substrate 1110. The TFT portion 1101 is preferably used for example, for an arithmetic circuit. The memory portion 1102 is preferably used for example, for a memory element of a nonvolatile memory. A glass substrate, a quartz substrate, a substrate formed of silicon, a metal substrate, a plastic substrate, or the like can be used for the insulating substrate 1110.

In the case of using a glass substrate, one surface of the glass substrate, opposite to a surface over which a TFT and the like are formed may be ground to be thin for use. Such a glass substrate reduced in thickness, which contributes reduction in weight and thickness of a device.

A base film 1111 is provided over the insulating substrate 1110. Thin film transistors 1120 and 1121 are provided over the base film 1111 in the TFT portion 1101, and a thin film transistor 1122 is provided over the base film 1111 in the memory portion 1102. Each thin film transistor has a semiconductor film 1112 which is formed separately into an island shape, a gate electrode 1114 which is provided over a gate insulating film, and insulators provided on the surfaces of the gate electrode which are called sidewalls 1113. The semiconductor film 1112 is formed to a thickness of 0.2 μm or less, typically a thickness of 40 nm to 170 nm, and preferably a thickness of 50 nm to 150 nm. Further, an insulating film 1116 covering the sidewalls 1113 and the semiconductor film 1112, and an electrode 1115 connected to an impurity region formed in the semiconductor film 1112 are included. The electrode 1115 which is connected to the impurity region can be formed by forming a contact hole in the gate insulating film and the insulating film 1016, forming a conductive film in the contact hole, and patterning the conductive film.

In thin film transistors for forming the semiconductor device of the invention, an insulating film which is typified by a gate insulating film or the like can be formed by high-density plasma treatment. High-density plasma treatment is a plasma treatment in which the plasma density is $1\times10^{11}$ cm$^{-3}$ or more, preferably in the range of $1\times10^{11}$ cm$^{-3}$ to $9\times10^{15}$ cm$^{-3}$, and a high frequency wave such as a microwave (for example, at a frequency of 2.45 GHz) is used. If plasma is generated in such conditions, low electron temperature would be 0.2 eV to 2 eV. As to high-density plasma which has low electron temperature characteristics as described above, the kinetic energy of activated species is low, thus, a film in which plasma damage is small and defect is small can be formed. A body to be formed, a substrate over which a patterned semiconductor film is formed in the case of forming a gate insulating film, is disposed in a chamber for carrying out such plasma treatment. Then, the distance between an electrode for generating plasma, what is called an antenna, and the body to be formed is set at 20 mm to 80 mm, preferably 20 mm to 60 mm, for performing film formation. Such a high-density plasma treatment enables a low-temperature process (where the substrate temperature is 400° C. or less). Therefore, a plastic film with low heat-resistance substrate can be formed over the substrate.

Such an insulating film can be formed in a nitrogen atmosphere or an oxygen atmosphere. A nitrogen atmosphere is, typically, an atmosphere in which nitrogen and rare gas are mixed or an atmosphere in which nitrogen, hydrogen and rare gas are mixed. As the rare gas, at least one of helium, neon, argon, krypton, or xenon can be used. In addition, in an oxygen atmosphere, typically, an atmosphere in which oxygen and rare gas are mixed, or an atmosphere in which oxygen, hydrogen and rare gas are mixed. An atmosphere in which dinitrogen monoxide and rare gas are mixed can be used for achieving the similar effect. As the rare gas, at least one of helium, neon, argon, krypton, or xenon can be used.

The insulating film formed in this manner is dense without damaging other coatings. In addition, the insulating film formed by high-density plasma treatment can improve a state of an interface state of the semiconductor film which contacts the insulating film. For example, if a gate insulating film is formed using high-density plasma treatment, the state of the interface between the in insulating film and the semiconductor film a semiconductor film can be improved. As a result, electrical characteristics of a thin film transistor can be improved.

The case of using high-density plasma treatment for forming an insulating film has been described; the high-density plasma treatment may be applied to a semiconductor film as well. By the high-density plasma treatment, the surface of the semiconductor film can be reformed. As a result, the interface state can be improved, and electrical characteristics of a thin film transistor can be improved accordingly.

In addition, insulating films 1117 and 1118 are preferably provided in order to improve planarity. At this time, the insulating film 1117 is preferably be formed of an organic material and the insulating film 1118 is preferably formed of an inorganic material. In the case where the insulating films 1117 and 1118 are provided, the electrode 1115 can be formed over the insulating films 1117 and 1118 so as to be connected to an impurity region through a contact hole.

Further, an insulating film 1125 is provided, and a bottom electrode 1127 is formed so as to connect to the electrode 1115. An insulating film 1128 is formed which covers an end portion of the bottom electrode 1127 and is provided with an opening portion so as to expose the bottom electrode 1127. In the opening portion, a memory material layer 1129 and an upper electrode 1130 are formed. In this way, a memory element 1123, which has the bottom electrode 1127, the memory material layer 1129, and the upper electrode 1130, is formed. The memory material layer 1129 can be formed of an organic material or an inorganic material. The bottom electrode 1127 and the upper electrode 1130 can be formed of a conductive material. For example, it can be formed of a film made of an element of aluminum (Al), titanium (Ti), molybdenum (Mo), tungsten (W) or silicon (Si), or of an alloy film using the above-described elements. In addition, a light-transmitting material such as indium tin oxide (ITO), indium tin oxide containing silicon oxide, or indium oxide containing zinc oxide at 2 to 20% can be used.

In order to further improve the flatness and to prevent penetration of an impurity element, an insulating film 113 is preferably formed.

For the insulating film described in this embodiment, an inorganic material or an organic material can be used. As the inorganic material, silicon oxide or silicon nitride can be used. As the organic material, polyimide, acrylic, polyamide, polyimideamide, resist, benzocyclobutene, siloxane, or polysilazane can be used. Siloxane includes of a skeleton having a bond of silicon (Si) and oxygen (O), in which an organic group containing at least hydrogen (e.g., an alkyl group or aromatic hydrocarbon) is used as a substituent. Alternatively, a fluoro group may be used as the substituent. Further alternatively, a fluoro group and an organic group containing at least hydrogen may be used as the substituents. Polysilazane is formed of a polymer material having a bond of silicon (Si) and nitrogen (N) as a starting material.

Figure 11B:
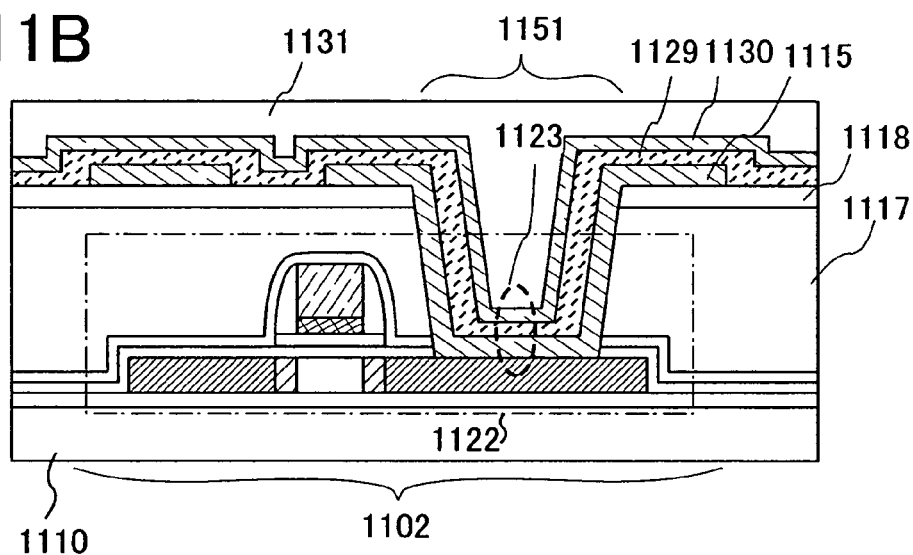

FIG. 11B is a cross-sectional view of a memory in which a memory material layer is formed in a contact hole 1151 of the electrode 1115 unlike in FIG. 11A. Similarly to FIG. 11A, the electrode 1115 is used as a bottom electrode, and over the electrode 1115, the memory material layer 1129 and the upper electrode 1130 are formed thereby forming the memory element 1123. Subsequently, the insulating film 1131 is formed. Since the other structure is the same as FIG. 11A, description thereof will be omitted.

By forming a memory element in the contact hole 1151 as described above, downsizing of the memory element can be achieved. In addition, an electrode for a memory is rendered unnecessary; thus, the number of manufacturing steps can be reduced and a semiconductor device mounted with the memory can be provided at low cost.

As set forth above, by structuring the semiconductor device using thin film transistors in each of which a semiconductor thin film formed over a substrate having an insulating surface such as a glass substrate, a quartz substrate, or a plastic substrate is used as an active layer, a high-functional and low-power consumption semiconductor device can be provided at low cost with the weight reduced.

This embodiment can be freely combined with the above embodiment mode and the above embodiments.

Embodiment 6

In this embodiment, a method for manufacturing a semiconductor device, which is different from the above embodiments will be described.

Similarly to the above embodiment mode, an insulating substrate is prepared, and a release layer is formed. The release layer can be formed over the entire surface of the insulating substrate or formed selectively. The release layer is formed of an element selected from W, Ti, Ta, Mo, Nb, Nd, Ni, Co, Zr, Zn, Ru, Rh, Pd, Os, Ir, or Si; or an alloy material or a compound material mainly containing such an element. The release layer can use a single layer structure of the above element or the like or a layered structure of the element or the like. Such a release layer can be formed by CVD, sputtering, electron beam, or the like. In this embodiment, W is formed by CVD. At that time, plasma treatment may preferably perform using $O_2$, $N_2$ or $N_2O$. Accordingly, a separation which is a subsequent step can be carried out easily.

Then, a base film and a semiconductor film are formed over the release layer as in the above embodiment mode. When the semiconductor film is heat-treated, the release layer might be heated as well. When an amorphous semiconductor film is formed using heat treatment by CVD, the semiconductor film contains much hydrogen. Accordingly, there are heat treatment for removing the hydrogen and heat treatment for crystallizing the amorphous semiconductor film. Film peeling can be prevented by the heat treatment for removing the hydrogen.

After that, as in the above embodiment mode, a thin film transistor is formed by using a semiconductor film. Then, a plurality of thin film transistors are electrically connected, thereby forming a circuit included in the semiconductor device. The circuit may be a wireless communication circuit such as a power supply circuit; a system reset circuit, a demodulation circuit, a modulation circuit, or a logic circuit such as a CPU, a ROM, a RAM, or a controller.

After that, the insulating substrate is physically and chemically separated and the thin film transistors and the like are transferred to a flexible substrate such as a plastic substrate.

Hereupon, the insulating substrate can be separated by changing the state of the release layer. For example, an opening is provided so as to expose a part of the release layer, and the exposed release layer is irradiated with laser. The irradiation of the release layer with laser can sets off the separation. After that, the insulating substrate and the thin film transistor and the like may be physically separated from each other. Alternatively, thin film transistor and the like may naturally peel off the insulating substrate or the like due to film stress without applying any additional force.

Further, semiconductor device in which thin film transistors and the like are transferred to a flexible substrate can be formed. Such a semiconductor device has added values such as lighter weight, thinner thickness, and high flexibility.

This embodiment can be implemented in any combination with Embodiment Mode and/or the above embodiments.

Embodiment 7

Figure 12:
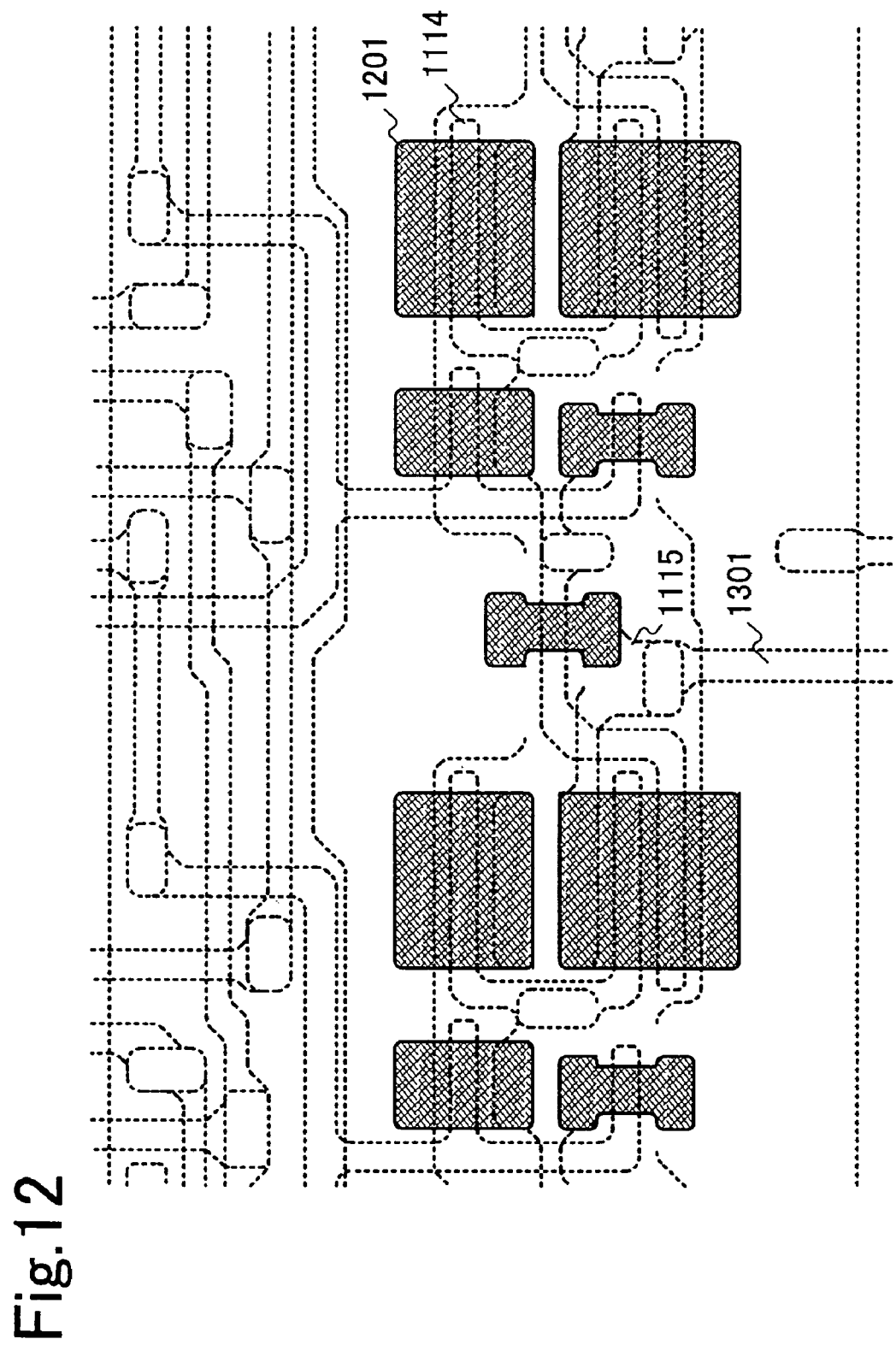
FIG. 12 shows a layout of a semiconductor device of the present invention (1) (semiconductor layer)
Figure 13:
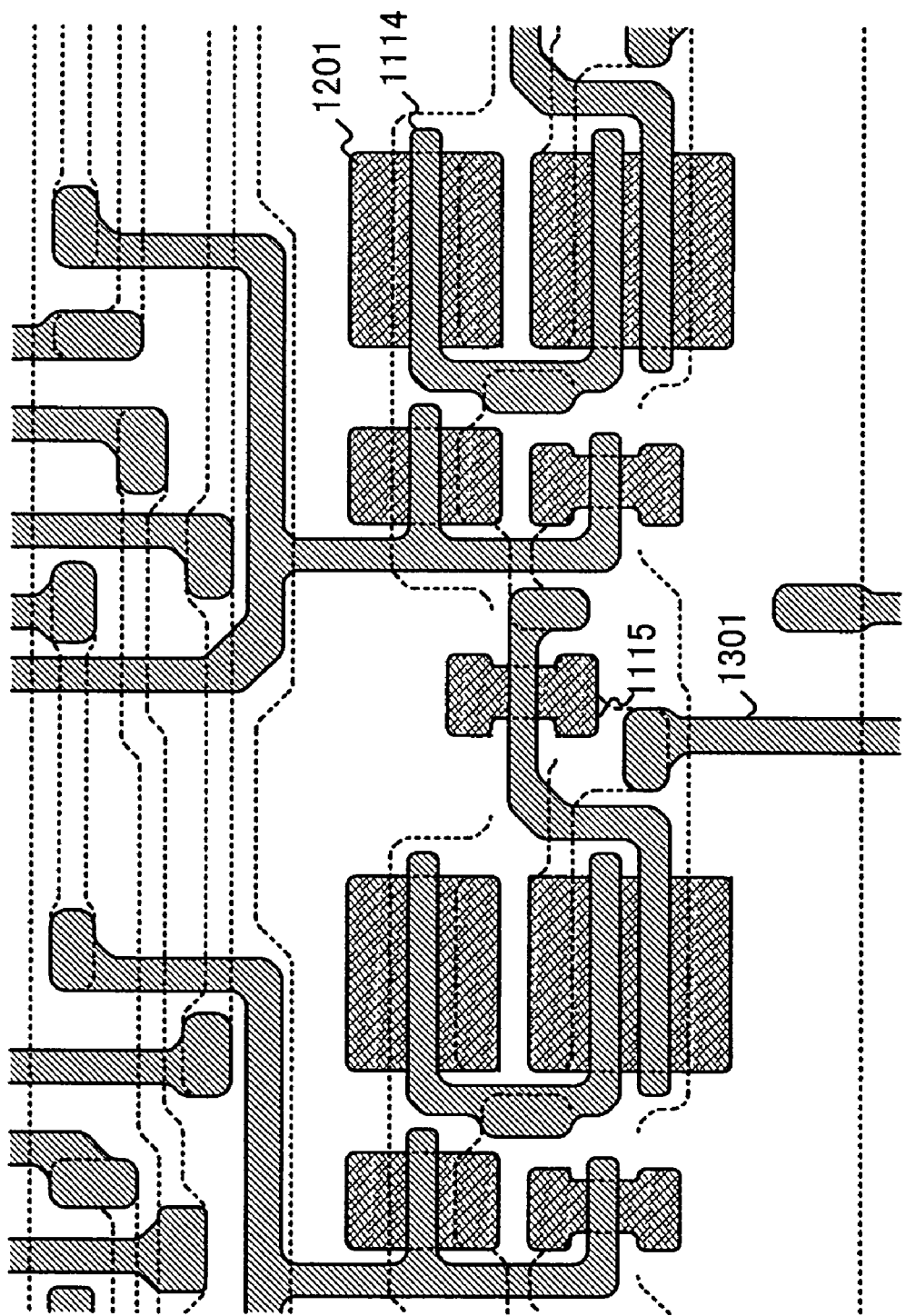
FIG. 13 shows a layout of a semiconductor device of the present invention (1) (gate wiring)

In this embodiment, a layout of thin film transistors constituting a part of a circuit in the semiconductor device of the invention will be described with reference to FIG. 12, FIG. 13, and FIG. 14.

A semiconductor layer corresponding to the semiconductor film 1112 described in Embodiment 3 is formed over an entire surface of a substrate having an insulating surface or a part thereof (a region having an area larger than the area determined as a semiconductor region of a transistor), with a base film or the like interposed therebetween. Then, a mask pattern is formed over the semiconductor layer by photolithography. By etching the semiconductor layer using the mask pattern, island-shaped semiconductor patterns 1201 having specific shapes including a source region, a drain region, and a channel region of a thin film transistor shown in FIG. 12.

The shapes of the semiconductor layer patterns are decided in consideration of circuit characteristics required or adequacy of the layout, based on characteristics of a thin film transistor.

In a thin film transistor for constituting a circuit in a wireless chip of the invention, a photomask for forming a semiconductor layer has a pattern. This pattern of the photomask has a corner that is rounded by removing a right triangle with one side of 10 μm or shorter in the corner portion. The shape of this mask pattern can be transferred as a pattern shape of a semiconductor layer as shown in FIG. 12. The mask pattern may be transferred to the semiconductor layer so that the corner of the semiconductor pattern 1201 is more rounded than the corner of the photomask pattern. In other words, the corner of the pattern of the semiconductor film may have a pattern shape which is more smoothly rounded than the photomask pattern. Note that in FIG. 12, the gate electrode 1114, a gate wiring 1301, the electrode 1115, and the like to be formed later are indicated by a dotted line.

Subsequently, a gate insulating film is formed over the semiconductor layer 1101 which is patterned to have a rounded corner. Then, as described in Embodiment 3, the gate electrode 1114 which partially overlaps with the semiconductor layer, and the gate wiring 1301 are formed at the same time. The gate electrode and the gate wiring can be formed by forming a metal layer or a semiconductor layer and carrying out photolithography.

A photomask for forming the gate electrode or the gate wire has a pattern. This pattern of the photomask has a corner and a right triangle therein having a length of 10 μm or less or in the range between one-fifth the width of the wire and half the width of the wire on each side is removed. The shape of this mask pattern can be transferred as a pattern of a gate electrode or a gate wire as shown in FIG. 13. The mask pattern may be transferred to the gate electrode or the gate wire so that the corner of the gate electrode or the gate wire is more rounded. In other words, the gate electrode or the gate wire may have a pattern with a corner that is more smoothly rounded shape than the corner of the mask pattern.

At a corner of the gate electrode or the gate wire formed using such a photomask, a curved line is formed at the outer corner of the gate electrode or the gate wire when viewed from above. Further, the inner corner is also formed to be rounded along the outer corner. Note that in FIG. 13, the electrode 1115 to be formed later is indicated by dotted lines.

Such a gate electrode or gate wiring bends rectangularly because of layout limitation. Therefore, for the round corner portion of the gate electrode or the gate wiring, a projection (an outer side) and a depression (an inner side) are provided. At the round projection, it is possible to suppress generation of fines due to anomalous discharge at a time of dry plasma etching. In addition, at the round depression, even if there are fines generated, the fines which tend to collect at the corner portion can be washed away in washing. As a result, it is advantageous that significant yield improvement can be expected.

Subsequently, over the gate electrode or the gate wiring, an insulating layer or the like corresponding to the insulating films 1116, 1117, and 1118 is formed as described in Embodiment 3. Naturally, the insulating film may be a single layer in the invention.

Then, over the insulating layer, an opening is formed in a predetermined position of the insulating film, and in the opening, a wiring corresponding to the electrode 1115 is formed. This opening is provided to electrically connect the semiconductor layer or the gate wiring layer which is in the lower layer and the wiring layer to each other. As for the wiring, a mask pattern is formed by photolithography, and is formed into a predetermined pattern by an etching process.

With the wiring, predetermined elements can be connected to each other. This wiring does not connect the predetermined elements by a straight line but bends rectangularly (hereinafter referred to as a "bending portion") because of layout limitation. In addition, the wiring may be changed in width in the opening portion or another region. For example, in the opening portion, when the opening is equal to or larger than the wiring width, the wiring width is changed to be wider at that portion. Further, since the wiring also functions as one electrode of a capacitor portion due to circuit layout, the wiring width may be large.

In that case, in the bending portion of the mask pattern, the corner of the wire can be rounded by removing a right triangle having 10 μm or shorter, or in the range between one-fifth the width of the wire and half the width of the wire on a side. A wire pattern has a similar rounded corner portion as shown in FIG. 14. A corner portion of the wire can be rounded with a cutout having sides in the range of one-fifth the width of the wire and half the width of the wire. That is to say, the circumference of the wire layer in the corner portion is curved when viewed from above. Further, the inner corner is also made to be rounded along the outer corner. Such a wiring having a rounded corner has an advantage that fines are suppressed to be generated due to anomalous discharge in the projection in the bending portion in dry etching with plasma. Meanwhile, in the depression, even if there are fines generated, the fines which tend to collect at the corner portion can be washed away in washing. As a result, it is advantageous that significant yield improvement can be expected, which is also advantageous. The wire with a rounded corner can also allow electrical conduction.

Figure 14:
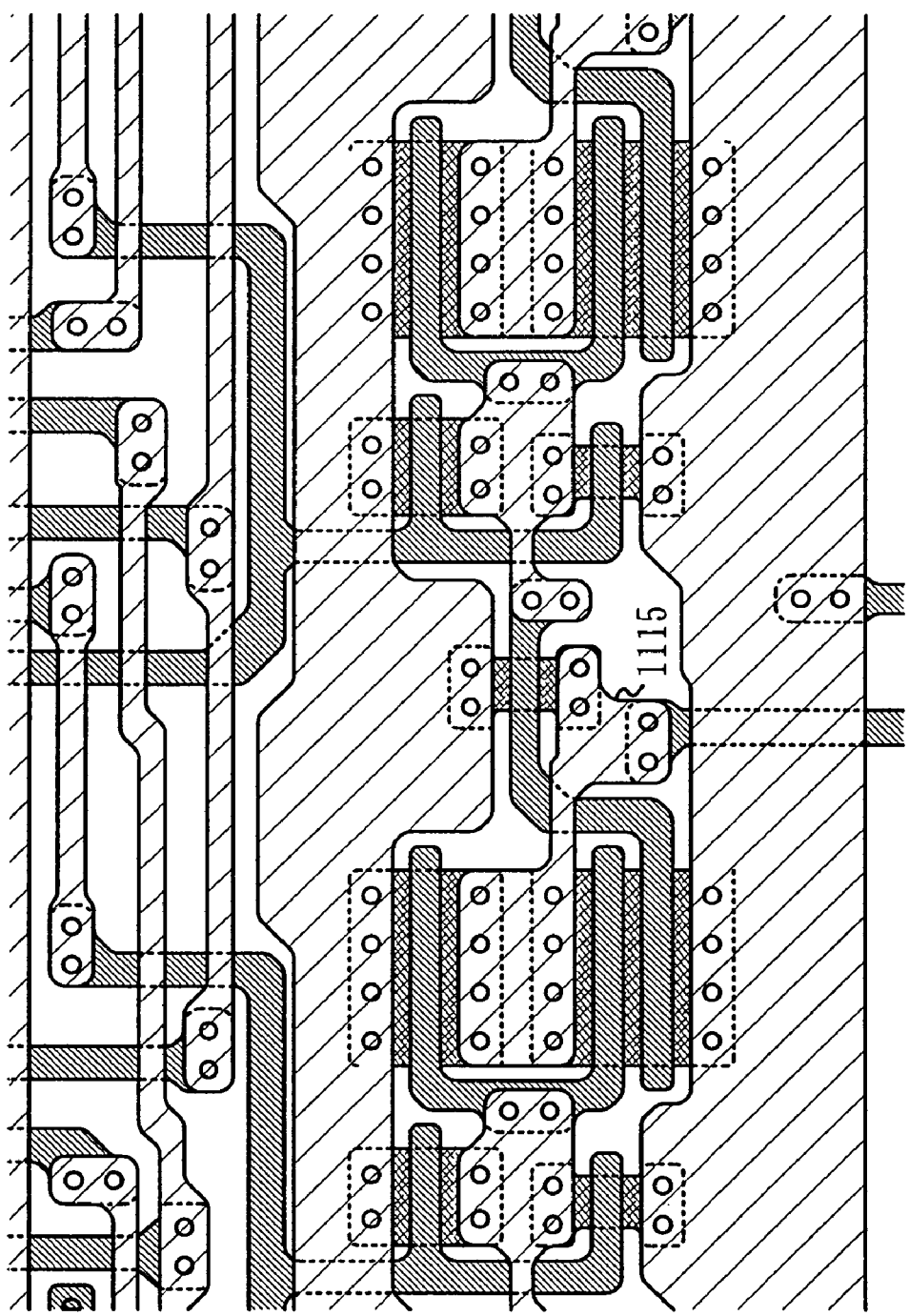
FIG. 14 shows a layout of a semiconductor device of the present invention (1) (wiring)

In a circuit having the layout shown in FIG. 14, by not bending the corner portion of the bending portion or at the position where the wiring width is changed, so much to provide roundness, it is possible to suppress generation of fines due to anomalous discharge when dry etching with plasma is performed. In addition, fines which tend to collect at the corner can be easily washed away in washing, which leads to the improvement of productivity. That is, the problem of dust or fines generated in a manufacturing process can be resolved. Further, the wire with a rounded corner is expected to allow electrical conduction. In particular, in the case of wirings of a driver circuit area or the like in which many parallel wirings are provided, it is very advantageous that dust can be washed away.

Described in this embodiment is the mode in which the corner portion or the bending portion is round in the three layouts of the semiconductor layer, the gate wiring, and the wiring; however, the invention is not limited to this. That is, the corner portion or the bending portion may be rounded in any one of the layers so that the problem of dust, fines, or the like in a manufacturing process can be resolved.

If a semiconductor device is constituted using the above-described layout, a high-performance and low-power consumption semiconductor device which consumes less power can be provided at low cost with the weight reduced.

Note that this embodiment can be implemented in any combination with Embodiment Mode and the above embodiments.

Embodiment 8

In this embodiment, an example of forming a static RAM (SRAM) as one component of the semiconductor device of the invention will be described with reference to FIGS. 15A to 17B.

Figure 15A:
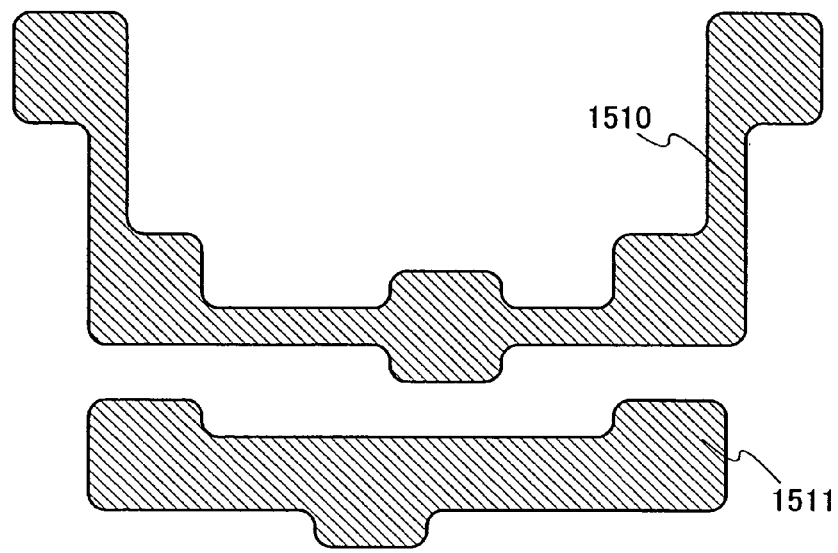
FIGS. 15A and 15B show layouts of a semiconductor device of the present invention (2) (semiconductor layer)

Semiconductor layers 1510 and 1511 shown in FIG. 15A are preferably formed of silicon or a crystalline semiconductor containing silicon as its component. For example, polycrystalline silicon obtained by crystallizing a silicon film by laser annealing or the like, single crystalline silicon, or the like is used. Other than the above, a metal oxide semiconductor, amorphous silicon, or an organic semiconductor exhibiting a semiconductor characteristic can also be employed.

At any event, a semiconductor layer to be formed first is formed over an entire surface of a substrate having an insulating surface or a part thereof (a region having an area larger than the area determined as a semiconductor region of a transistor). Then, with photolithography technology, a mask pattern is formed over the semiconductor layer. By etching the semiconductor layer using the mask pattern, the island-shaped semiconductor layers 1510 and 1511 each having a specific shape are formed which includes source and drain regions and a channel region of a TFT. The semiconductor layers 1510 and 1511 are determined in consideration of adequacy of the layout.

Figure 15B:
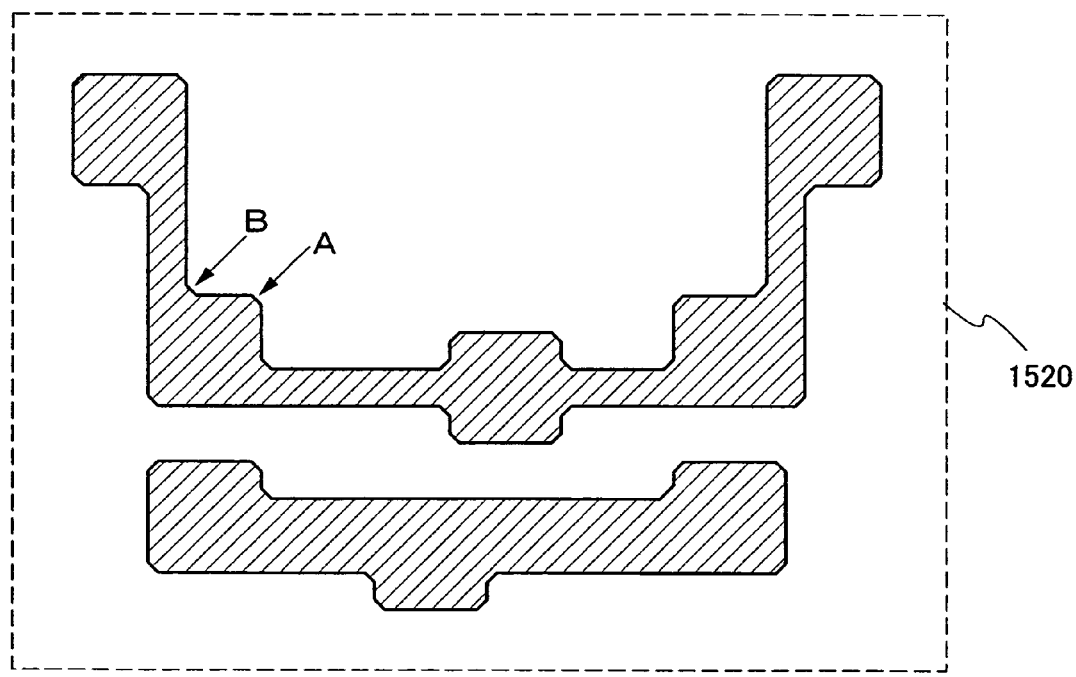

A photomask for forming the semiconductor layers 1510 and 1511 shown in FIG. 15A has a mask pattern 1520 shown in FIG. 15B. This mask pattern 1520 is different depending on whether a resist to be used in the photolithography process is a positive type or a negative type. In the case where a positive type resist is used, the mask pattern 1520 shown in FIG. 15B is formed as a light shielding portion. The mask pattern 1520 has a shape where a top portion A is cut. In addition, a bending portion B is bent plural times so as not to bend at right angle in the corner thereof. In this photomask pattern, for example, the corner portion (right triangle) of the pattern is removed with a length of 10 μm or less on a side.

The shape of the mask pattern 1520 shown in FIG. 15B is reflected in the semiconductor layers 1510 and 1511 shown in FIG. 15A. In that case, a shape similar with the mask pattern 1520 may be transferred, or may be transferred such that the corner portion of the mask pattern 1520 is more rounded. That is, a roundness in which the pattern shape is further less bent than the photomask pattern 1520.

Figure 16A:
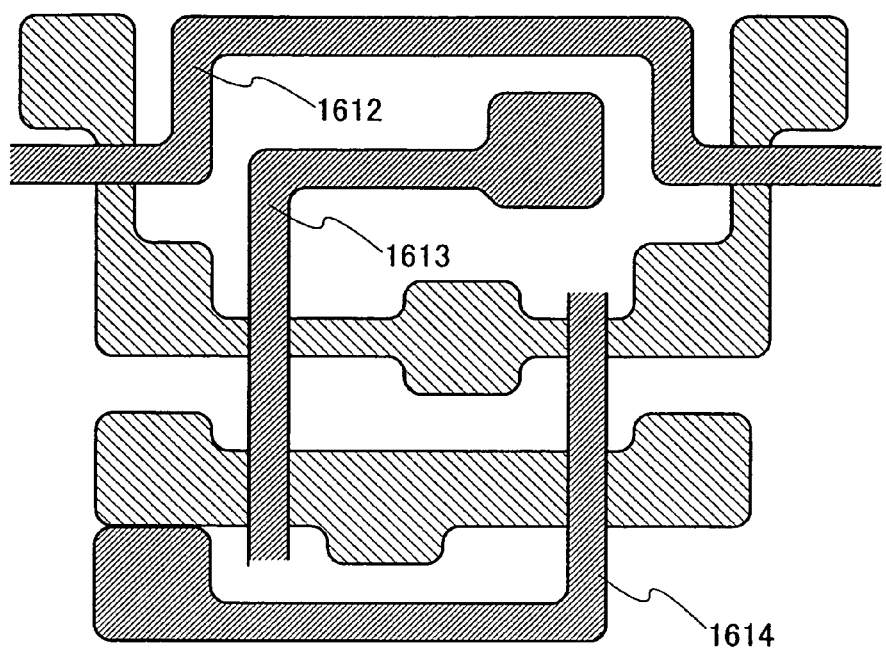
FIGS. 16A and 16B show layouts of a semiconductor device of the present invention (2) (gate wiring)

Over the semiconductor layers 1510 and 1511, an insulating layer containing at least partially silicon oxide or silicon nitride is formed. One purpose of forming this insulating layer is to form a gate insulating layer. Then, as shown in FIG. 16A, gate wirings 1612, 1613, and 1614 are formed so as to partially overlap with the semiconductor layers. The gate wiring 1612 is formed corresponding to the semiconductor layer 1510. The gate wiring 1613 is formed corresponding to the semiconductor layers 1510 and 1511. In addition, the gate wiring 1614 is formed corresponding to the semiconductor layers 1510 and 1511. As for the gate wiring, a metal layer or a highly-conductive semiconductor layer is formed, and the shape thereof is formed over the insulating layer by photolithography.

Figure 16B:
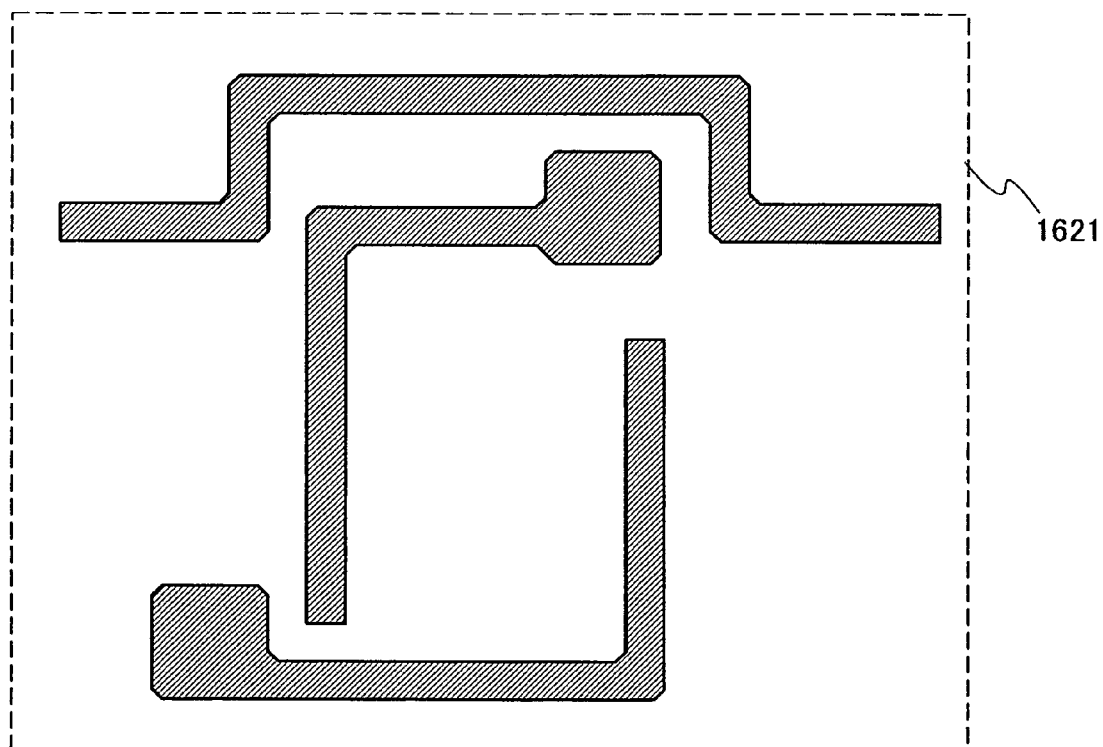

A photomask for forming the gate wiring has a mask pattern 1621 shown in FIG. 16B. In the photomask pattern 1621, the corner portion (right triangle) can be removed with a length of 10 μm or less or in the range between 1/2 and 1/5 of the line width of the wiring. The shape of the mask pattern 1621 shown in FIG. 16B is reflected in the gate wirings 1612, 1613, and 1614 shown in FIG. 16A. In that case, a shape similar with the mask pattern 1621 may be transferred, or may be transferred so that the corner portion of the mask pattern 1621 is more rounded. That is, the pattern thereof is further smoothly rounded than the photomask pattern 1621. In other words, the corner portions of the gate wires 1612, 1613, and 1614 are rounded with a cutout having a side in the range between 5/1 and 1/2 of the width of each wire. At the projection, it is possible to suppress generation of fines due to anomalous discharge when dry etching with plasma is performed. Meanwhile, at the depression, even if there are fines generated, the fines which tend to collect in the corner portion can be washed away in washing. As a result, there is such an advantage that significant yield improvement can be expected.

An interlayer insulating layer is a layer which is formed subsequently to the gate wirings 1612, 1613, and 1614. The interlayer insulating layer is formed of an inorganic insulating material such as silicon oxide or an organic insulating material using polyimide, acrylic resin, or the like. An insulating layer made from silicon nitride, silicon nitride oxide, or the like may be interposed between this interlayer insulating layer and the gate wirings 1612, 1613, and 1614. Furthermore, an insulating layer made from silicon nitride, silicon nitride oxide, or the like may be provided over the interlayer insulating layer as well. This insulating layer can prevent impurities from contaminating the semiconductor layer or the gate insulating layer by an impurity which is not good for a TFT, such as an exogenous metal ion or moisture.

Figure 17A:
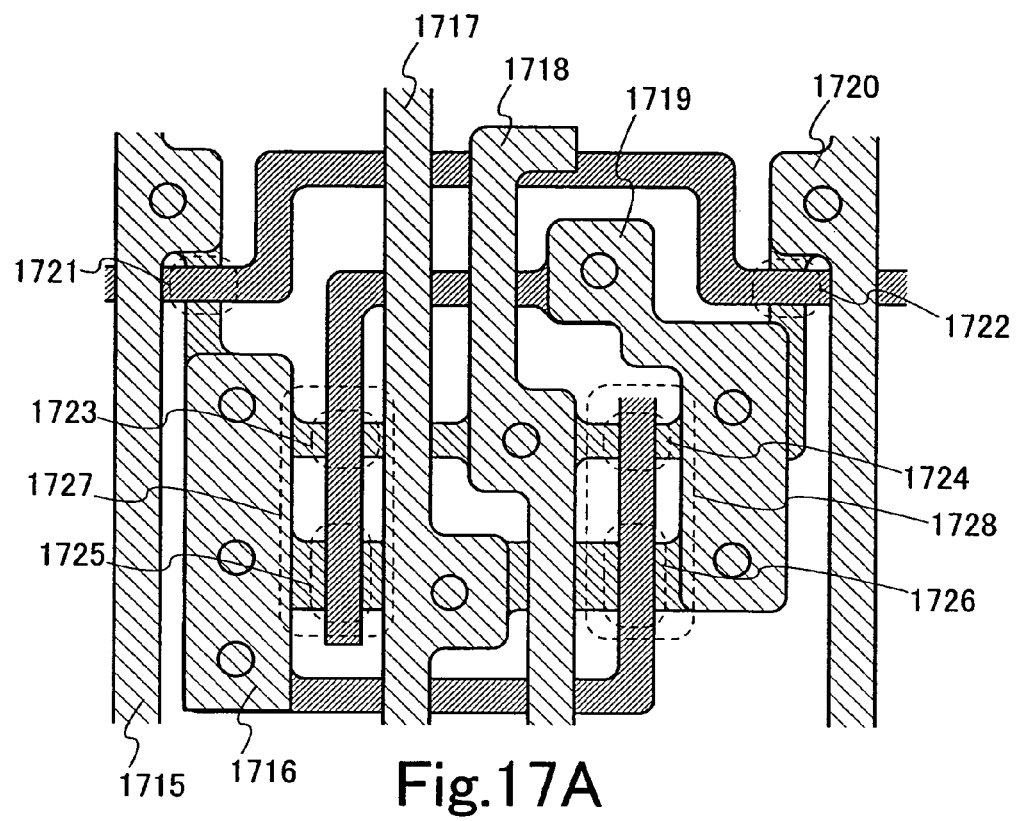
FIGS. 17A and 17B show layouts of a semiconductor device of the present invention (2) (wiring)

In the interlayer insulating layer, an opening is formed at a predetermined position. For example, it is provided corresponding to the gate wiring or the semiconductor layer which is in the lower layer. As for the wiring layer which is formed of one layer or a plurality of layers made from a metal or a metal compound, a mask pattern is formed by photolithography and is formed to be a predetermined pattern by an etching process. Then, as shown in FIG. 17A, wirings 1715 to 1720 are formed so as to partially overlap with the semiconductor layers. With the wiring, predetermined elements can be connected to each other. The wiring does not connect the predetermined elements by a straight line but has a bending portion because of layout limitation. In addition, the wiring is changed in width in the contact portion or another region. In the contact portion, when the diameter of the contact hole is equal to or larger than the wiring width, the wiring width is changed to be wider at that portion.

Figure 17B:
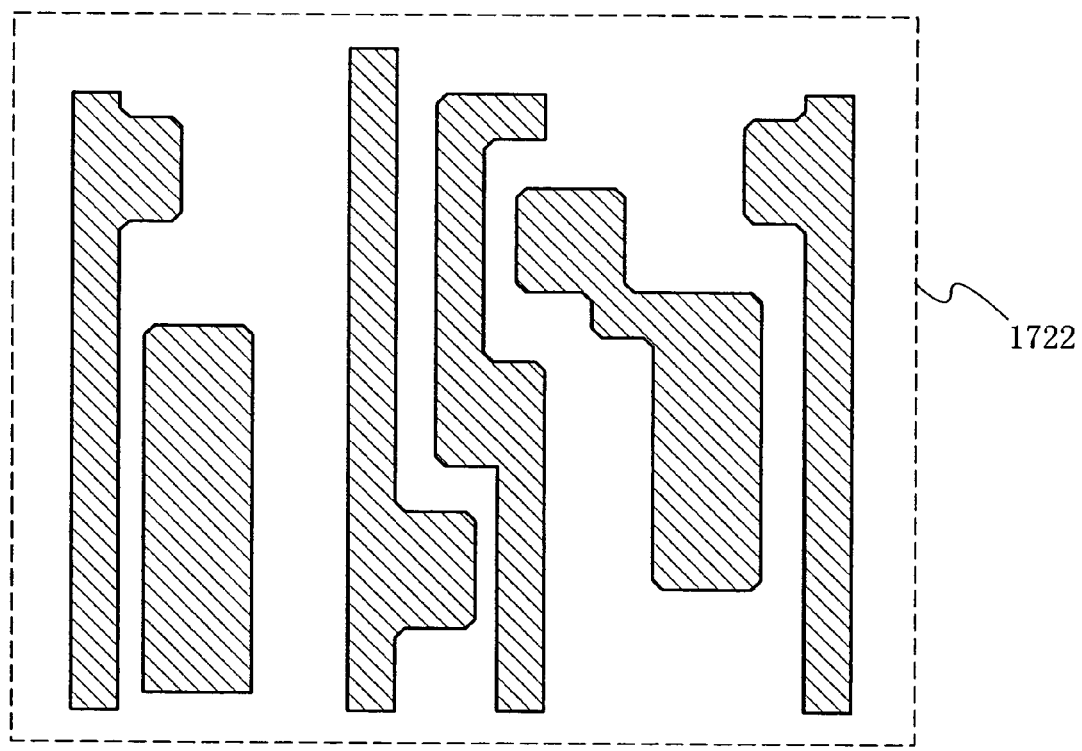

A photomask for forming the wirings 1715 to 1720 has a mask pattern 1722 shown in FIG. 17B. In this case also, the wiring has a pattern in which the corner portion is rounded by removing a corner portion (right triangle) having a side of 10 μm or less or in the range between 1/2 and 1/5 of the line width of the wiring. As to such a wiring, at the projection, it is possible to suppress generation of fines due to anomalous discharge when dry etching with plasma is performed, and at the depression, even if there are fines generated, the fines which tend to collect in the corner portion can be washed away in washing. As a result, there is an advantage that significant yield improvement can be expected. In addition, in the case of a plurality of parallel wirings, it is extremely suitable in order to wash away dust.

In FIG. 17A, n-channel thin film transistors 1721 to 1724 and p-channel thin film transistors 1725 and 1726 are formed. Inverters are constituted by the n-channel thin film transistor 1723 and the p-channel thin film transistor 1725, and the n-channel thin film transistor 1724 and the p-channel thin film transistor 1726 respectively. A circuit including the six transistors forms an SRAM. An insulating layer made from silicon nitride, silicon oxide, or the like may be formed in a layer over these transistors.

With the above structure, a lighter, high-performance, and low-power consumption semiconductor device can be provided at low cost.

Note that this embodiment can be implemented in any combination with Embodiment Mode and the above embodiments.

Embodiment 9

In this embodiment, a transistor for constituting the semiconductor device of the invention will be described with reference to FIGS. 18 to 19E.

A transistor for constituting the semiconductor device of the invention can be structured using a thin film transistor (TFT) as well as a MOS transistor formed over a single crystalline substrate. FIG. 18 is a view showing a cross-sectional structure of such transistors forming a circuit. FIG. 18 shows an n-channel thin film transistor 1821, an n-channel thin film transistor 1822, a capacitor 1824, a resistor 1825, and a p-channel thin film transistor 1823. Each thin film transistor includes a semiconductor layer 1805, an insulating layer 1808, and a gate electrode 1809. The gate electrode 1809 is formed by stacking a first conductive layer 1803 and a second conductive layer 1802. FIGS. 19A to 19D are top views corresponding to the thin film transistor 1821, the thin film transistor 1822, the capacitor 1824, and the resistor 1825, and the p-channel thin film transistor 1823 which can be additionally referred.

Figure 18:
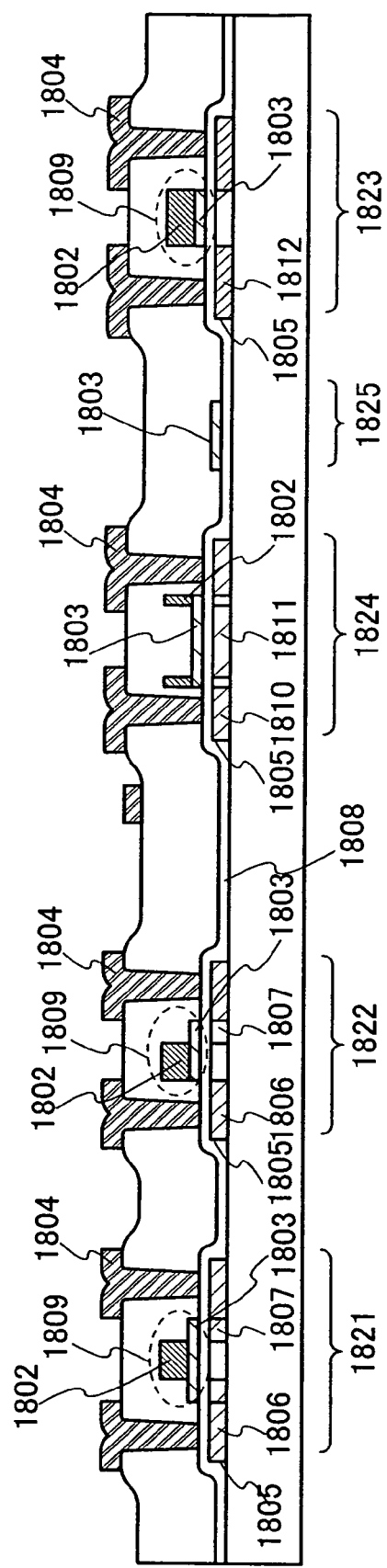
FIG. 18 is a cross-sectional view of a semiconductor device of the present invention (2)

In FIG. 18, in the n-channel thin film transistor 1821, in a channel length direction (a direction in which carriers flow), an impurity region 1807 doped with an impurity at lower concentration than the impurity concentration of an impurity region 1806 which forms a source or drain region forming contact with a wiring 1804, which is also called a lightly-doped-drain (LDD), is formed in the semiconductor layer

1805. Into the impurity region 1806 and the impurity region 1807, phosphorus or the like is added as the impurity to give n-type conductivity in the case of forming the n-channel thin film transistor 1821. LDDs are formed as means to suppress hot-electron deterioration and short-channel effect.

As shown in FIG. 19A, in the gate electrode 1809 of the n-channel thin film transistor 1821, the first conductive layer 1803 is formed spreading on both sides of the second conductive layer 1802. In this case, the thickness of the first conductive layer 1803 is formed to be smaller than that of the second conductive layer. The first conductive layer 1803 is formed with the thickness through which ion species accelerated in an electric field of 10 kV to 100 kV can pass. The impurity region 1807 is formed so as to overlap with the first conductive layer 1803 of the gate electrode 1809. That is, an LDD region to be overlapped by the gate electrode 1809 is formed. In this structure, a one-conductive type impurity is added into the impurity region 1807 through the first conductive layer 1803 using the second conductive layer 1802 as a mask, thereby forming the impurity region 1807 in a self-aligned manner. Accordingly, an LDD to overlap with the gate electrode is formed in a self-aligned manner.

The thin film transistor having an LDD on both sides is applied to a rectifying TFT of the power supply circuit 108 in Embodiment Mode, or a thin film transistor for forming a transmission gate (also called an "analog switch") used in a logic circuit. Since both positive and negative voltages are applied to the source or drain electrode of such a TFT, an LDD is preferably provided on both sides of the gate electrode.

In addition, in the case where a gate wiring is formed using the second conductive layer 1802, the first conductive layer 1803 may be patterned so as to align both ends of the two layers. As a result, a minute gate wiring can be formed. In addition, it is not necessary to form an LDD to overlap with the gate electrode in a self-aligned manner.

In FIG. 18, in the n-channel thin film transistor 1822, the impurity region 1807 doped with an impurity at lower concentration than the impurity concentration of the impurity region 1806 is formed on one side of the gate electrode in the semiconductor layer 1805. As shown in FIG. 14B, in the gate electrode 1809 of the n-channel thin film transistor 1822, the first conductive layer 1803 is formed spreading on one side of the second conductive layer 1802. In this case also, a one-conductive type impurity is added through the first conductive layer 1803 using the second conductive layer 1802 as a mask, thereby the LDD can be formed in a self-aligned manner.

The thin film transistor having an LDD on one side may be applied to a thin film transistor in which only one of positive voltage or negative voltage is applied between the source and drain electrodes. Specifically, it may be applied to a transistor for forming a logic gate such as an inverter circuit, a NAND circuit, a NOR circuit, or a latch circuit, or a thin film transistor for forming an analog circuit such as a sense amplifier, a constant voltage generating circuit, or a VCO.

In FIG. 18, the capacitor 1824 is formed in which a gate insulating layer 1808 is interposed between the first conductive layer 1803 and the semiconductor layer 1805. In the semiconductor layer 1805 for forming the capacitor 1824, an impurity region 1810 and an impurity region 1811 are provided. The impurity region 1811 is formed in a position to overlap with the first conductive layer 1803 in the semiconductor layer 1805. In addition, the impurity region 1810 makes contact with the wiring 1804. The impurity region 1811 can be formed by adding a one-conductivity type impurity through the first conducting layer 1803; therefore, the impurity concentrations can be made to be the same or different. At any event, the semiconductor layer 1805 which functions as an electrode in the capacitor 1824 is preferably reduced in resistance by adding the one-conductivity type impurity. In addition, the first conductive layer 1803 can be made function sufficiently as an electrode by using the second conductive layer 1802 as an auxiliary electrode as shown in FIG. 19C. With such a composite electrode structure in which the first conductive layer 1803 and the second conductive layer 1802 are combined, the capacitor 1824 can be formed in a self-aligned manner.

The capacitor is used as a storage capacitor provided in the power supply circuit 108 or as a resonant capacitor provided in the resonance circuit 107 in Embodiment Mode. In particular, the resonant capacitor in which both positive voltage and negative voltage are applied between two terminals of the capacitor is required to function as a capacitor regardless of whether the voltage between the two terminals is positive or negative.

In FIG. 19D, the resistor 1825 is formed from the first conductive layer 1803. Since the first conductive layer 1803 is formed to a thickness of about 30 nm to 150 nm, the resistor can be structured by setting the width and length as appropriate.

The resistor is used as a resistance load provided in the modulation/demodulation circuit 105 in Embodiment Mode. In addition, it may be used as a load in the case of controlling current using a VCO or the like. The resistor may be formed using a semiconductor layer containing an impurity element at high concentration, or a thin metal layer. Compared with the semiconductor layer in which the resistance value depends on film thickness, film quality, impurity concentration, activation rate, and the like; the metal layer in which resistance value is determined by a few parameters of film thickness and film quality, which is suitable because variation is small.

In FIG. 19E, the p-channel thin film transistor 1823 has an impurity region 1812 in the semiconductor layer 1805. This impurity region 1812 forms a source or drain region making contact with the wiring 1804. In a structure of the gate electrode 1809, the first conductive layer 1803 overlaps with the second conductive layer 1802. The p-channel thin film transistor 1823 has a single drain structure in which an LDD is not provided. When the p-channel thin film transistor 1823 is formed, boron or the like is added as an impurity to give p-type conductivity into the impurity region 1812. On the other hand, if phosphorus is added into the impurity region 1812, an n-channel transistor of a single drain structure can be formed as well.

One or both of the semiconductor layer 1805 and the insulating layer 1808 serving as a gate insulating layer may be oxidized or nitrided by high-density plasma treatment in which plasma is excited by a microwave, the electron temperature is 2 eV or less, the ion energy is 5 eV or less, and the electron density is about $11^{11}$ to $11^{13}/cm^3$. treatment may be performed with At this time, the treatment may be carried out by setting the substrate temperature at 300° C. to 450° C. and in an oxidizing atmosphere (e.g., $O_2$ or $N_2O$) or a nitriding atmosphere (e.g., $N_2$ or $NH_3$), thereby the defect level of an interface between the semiconductor layer 1805 and the insulating layer 1808 serving as a gate insulating layer can be reduced. By performing this treatment to the insulating layer 1808 serving as a gate insulating layer, densification of this insulating layer can be achieved. That is, generation of an electric charge defect is suppressed and change of the threshold voltage of the transistor can be suppressed. In addition, in the case where the transistor is operated at a voltage of 3 V or less, this insulating layer oxidized or nitrided with the plasma treatment can be applied as the insulating layer 1808 serving as a gate insulating layer. In addition, in the case where the driving voltage of the transistor is 3 V or more, the insulating layer 1808 serving as a gate insulating layer can be formed by combining the insulating layer formed over a surface of the semiconductor layer 1805 by plasma treatment and an insulating layer stacked by a CVD method (plasma CVD or thermal CVD) each other. In addition, this insulating layer can also be used as a dielectric layer of a capacitor 1824. In this case, since the insulating layer formed with plasma treatment is a dense film formed with a thickness of 1 nm to 10 nm, a capacitor having large charge capacity can be formed.

As described with reference to FIGS. 18 and 19A to 19E, by combining conductive layers having different thicknesses, elements having various structures can be formed. A region where only the first conductive layer is formed and a region where the first conductive layer and the second conductive layer are stacked can be formed using a photomask or a reticle which is provided with a diffraction grating pattern or an auxiliary pattern having a function of reducing optical intensity, which is formed of a semitransparent film. That is, in a photolithography process, the quantity of light transmitted through the photomask is controlled in exposing the photoresist so that the thickness of a resist mask to be developed is varied. In this case, a slit at the resolution limit or less may be provided in the photomask or the reticle to form the above-described resist having the complex shape. In addition, by baking at about 200° C. after developing, a mask pattern made from a photoresist material may be changed in shape.

In addition, by using the photomask or the reticle which is provided with a diffraction grating pattern or an auxiliary pattern having a function of reducing optical intensity, which is formed of a semitransparent film, the region where only the first conductive layer is formed and the region where the first conductive layer and the second conductive layer are stacked can be formed successively. As shown in FIG. 19A, the region where only the first conductive layer is formed can be formed selectively over the semiconductor layer. Such a region is effective over the semiconductor layer, but is not required in the other region (a wiring region which is successive to the gate electrode). The region where only the first conductive layer is formed is not required to be formed in the wiring region by using this photomask or reticle; thus, wiring density can be improved substantially.

In the case of FIG. 18 and FIGS. 19A to 19E, the first conductive layer is formed of a high-melting-point metal such as tungsten (W), chromium (Cr), tantalum (Ta), tantalum nitride (TaN) or molybdenum (Mo), or an alloy or a compound containing the high-melting-point metal as its main component with a thickness of 30 nm to 50 nm. In addition, the second conductive layer is formed of a high-melting-point metal such as tungsten (W), chromium (Cr), tantalum (Ta), tantalum nitride (TaN) or molybdenum (Mo), or an alloy or a compound containing the high-melting-point metal as its main component with a thickness of 300 nm to 600 nm. For example, different conductive materials are used for the first conductive layer and the second conductive layer respectively so that difference arises in the etching rate therebetween in a later etching process. As an example, TaN film can be used for the first conductive layer and a tungsten film can be used for the second conductive layer.

According to the description of this embodiment, transistors having different electrode structures, a capacitor, and a resistor can be formed separately using the same patterning process by using the photomask or the reticle which is provided with a diffraction grating pattern or an auxiliary pattern having a function of reducing optical intensity, which is formed of a semitransparent film. Accordingly, in accordance with circuit characteristics, elements having different modes can be formed without increasing the number of steps and can be integrated.

If a semiconductor device is formed from the above-described transistors, a lighter, high-performance, and low-power consumption wireless chip can be provided at low cost.

Note that this embodiment can be implemented in any combination with Embodiment Mode and the embodiments.

Embodiment 10

In this embodiment, an example of a system using a wireless chip as a semiconductor device of the invention is described with reference to FIGS. 20 and 21. This embodiment will describe a user authentication system of a personal computer with high security, using the semiconductor device of the invention.

Figure 20:
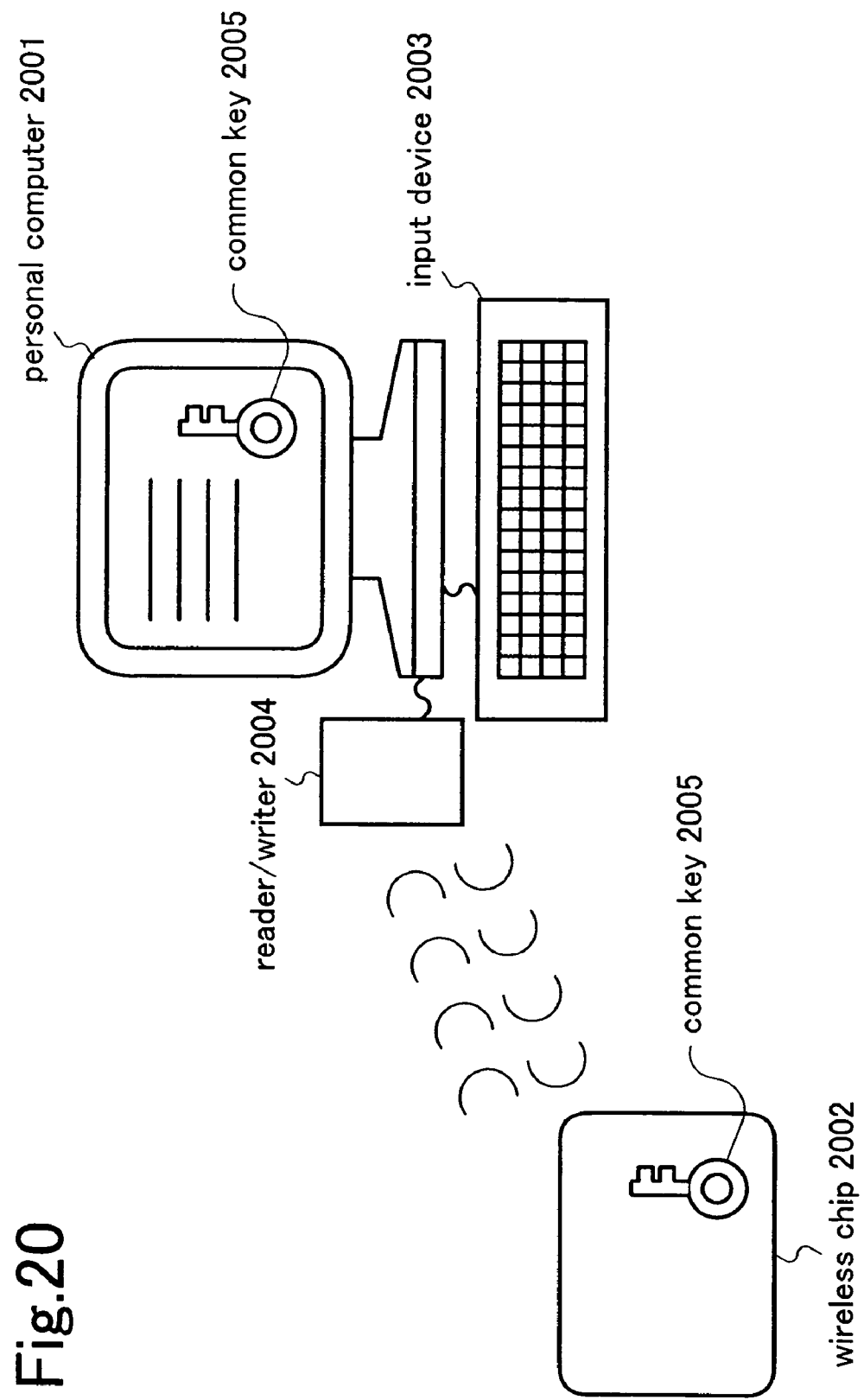
FIG. 20 is a schematic view of a user authentication system using a semiconductor device of the present invention.
Figure 21:
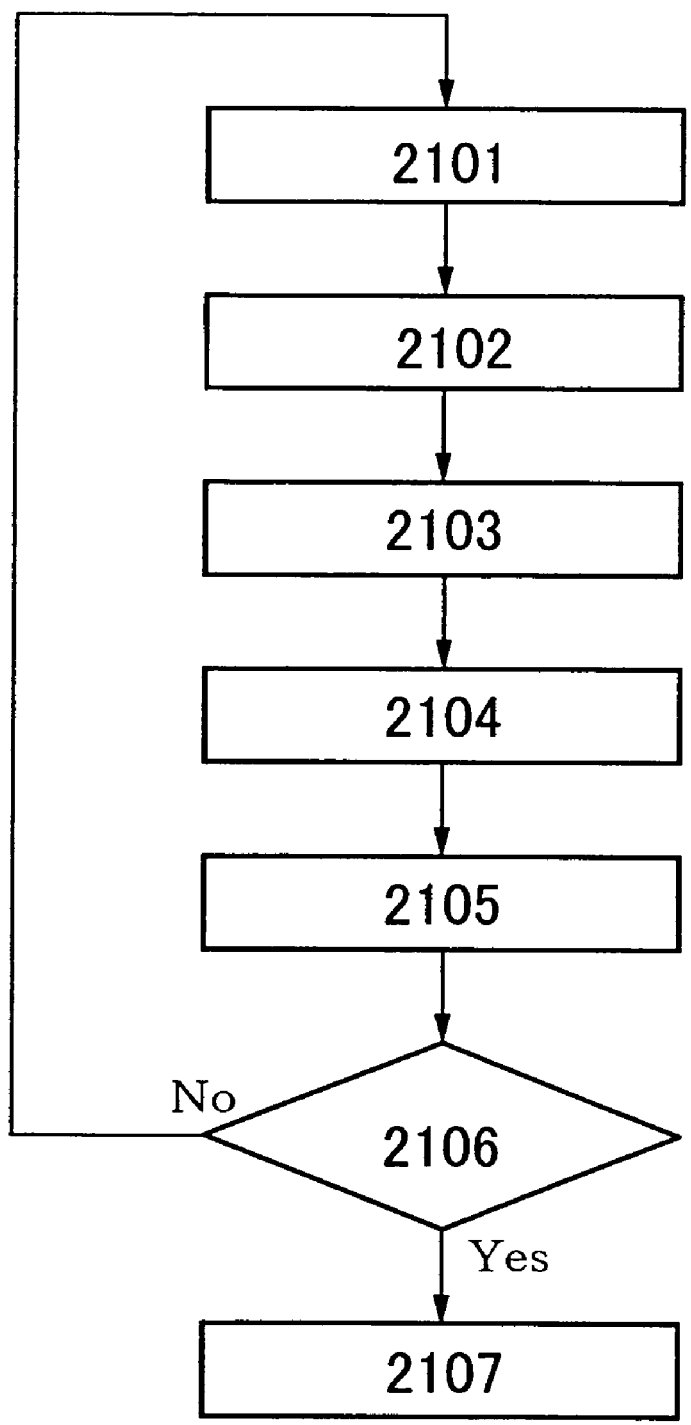
FIG. 21 is a flowchart of a user authentication system using a semiconductor device of the present invention.

FIG. 20 is a schematic diagram of the user authentication system of this embodiment, which includes a personal computer 2001 and a wireless chip 2002. An input device 2003 and a reader/writer 2004 are connected to the personal computer 2001.

Both the personal computer 2001 and the wireless chip 2002 have a common key 2005 for encoding. Specifically, data of the common key 2005 is stored in respective memories of the personal computer 2001 and the wireless chip 2002. The common key 2005 is, for example, data of 64 to 128 bits, which is used for encoding a plain text (data before being encoded) and decoding an encoded text. As for the common key, different common keys are formed for each user who is officially registered and all of them are stored in the personal computer 2001. In other words, the personal computer 2001 has the number of common keys corresponding to the number of users registered officially. On the other hand, the wireless chip 2002 is owned by a user who registered officially, and has only the common key specific to the user. The common key must be kept without being known to another person.

Although the case where a common key encoding method (see ISO/IEC 9798-2 information technology-security techniques-entity authentication-Part 2: mechanisms using symmetric encipherment algorithms) is used as the encoding method is described in this embodiment, the invention can be easily applied to the case of another encoding method such as a public key encoding method (see ISO/IEC 9798-3 information technology-security techniques-entity authentication-Part 3: Mechanisms using digital signature techniques).

The personal computer 2001 has means for encoding a plain text by using the common key 2005. Specifically, software of carrying out encoding algorithm is provided. In addition, the wireless chip 2002 has means for decoding an encoded text by using the common key 2005. Specifically, decoding algorithm is carried out in the arithmetic circuit described in Embodiment Mode 1 or Embodiment Mode 2.

Hereinafter, usage of the user authentication system of this embodiment is described with reference to a flow chart of FIG. 21.

First, a prospective user inputs a user name and a password of the personal computer 2001 with the input device 2003 (USER NAME INPUT 2101). The password is registered in advance by a user who is registered officially. The personal computer 2001 encodes a plain text by using a corresponding common key depending on the input user name (ENCODED DATA CREATION 2102). Here, a plain text may be either data having a specific meaning or data having no meaning. Next, the encoded data is transferred from the reader/writer 2004 (ENCODED DATA TRANSMISSION 2103). The wireless chip 2002 receives the encoded data, decodes it with the common key 2005 (DECODING PROCESS 2104), and transmits the decoded data to the reader/writer (DECODED DATA TRANSMISSION 2105). The personal computer 2001 compares the decoded data with the first plain text (AUTHENTICATION 2106), and only in the case where they match with each other, verifies the prospective user as the user registered officially and permits use (NORMAL USE 2107).

In such a user authentication system of this embodiment as described above, a computer cannot be utilized only by a person who own his password and a wireless chip of the invention. Therefore, security is extremely higher than authentication only with a password. In addition, a user can utilize a personal computer in the same way as that in the conventional authentication only with a password if the semiconductor device is taken along by the user, which requires a few additional obligations.

Note that the user authentication of a personal computer has been described in this embodiment; however, this embodiment can be easily applied to another system capable of being utilized only by a user who is registered officially. For example, the invention can be easily applied to an ATM (Automated Teller Machine), a CD (Cash Dispenser), or the like.

With the above structure, a user authentication system with extremely high security using a semiconductor device of the invention can be established at low cost.

This embodiment can be implemented in any combination with Embodiment Mode and the above embodiments.

Embodiment 11

Figure 26:
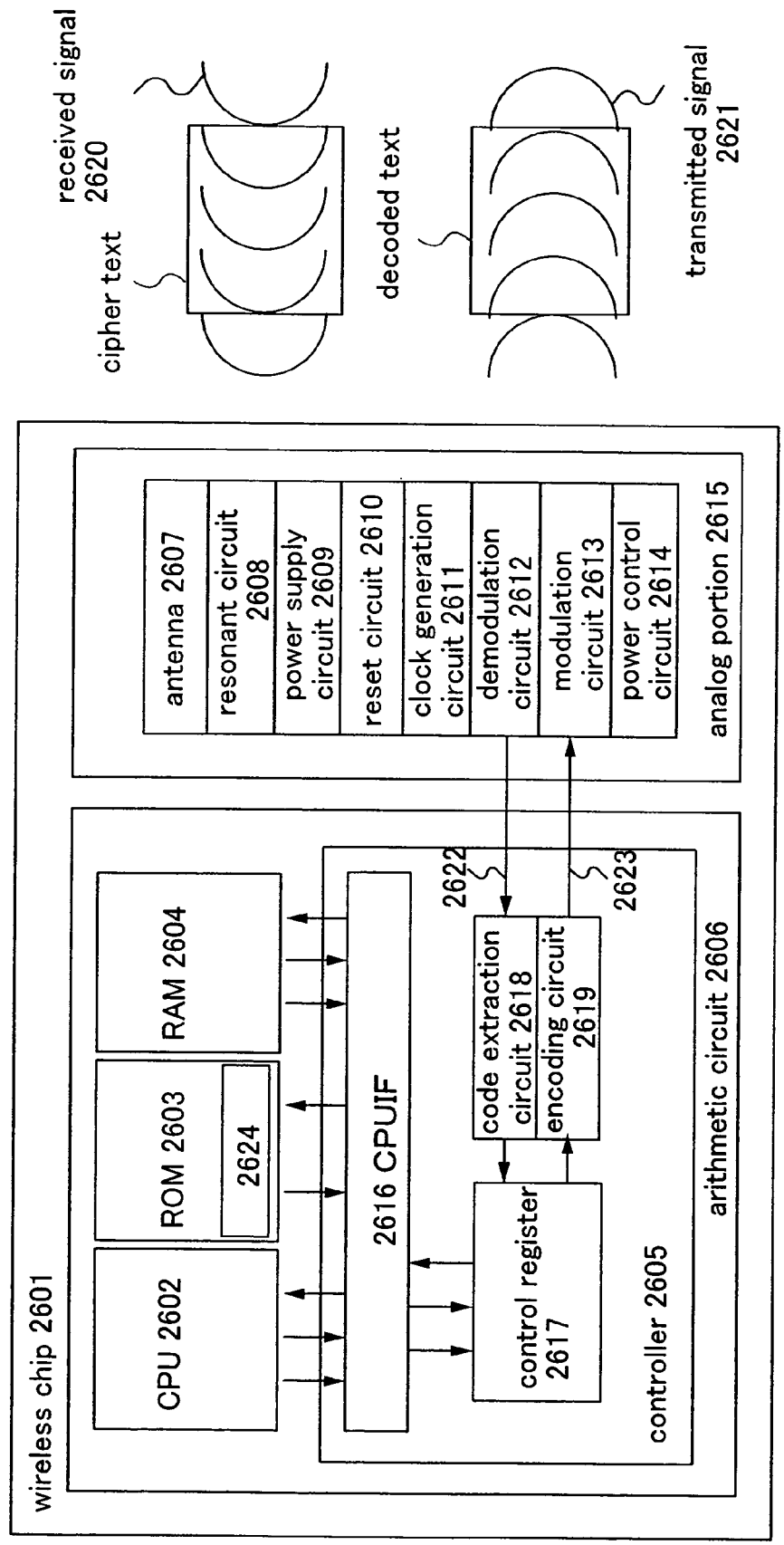
FIG. 26 is a block diagram of a semiconductor device of the present invention.

In this embodiment, a wireless chip having cryptographic function will be described as an example of a semiconductor device of the present invention with reference to FIG. 27 to FIG. 28. FIG. 26 is a block diagram of a wireless chip, and FIG. 28 is a cross-sectional view of a wireless chip.

First, a block configuration of a wireless chip will be described with reference to FIG. 26. In FIG. 26 the wireless chip 2601 includes an arithmetic circuit 2606 having a CPU 2602, a ROM 2603, a RAM 2604, and a controller 2605 and an analog portion 2615 including an antenna 2607, a resonant circuit 2608, a power supply circuit 2609, a reset circuit 2610, a clock generation circuit 2611, a demodulation circuit 2612, a modulation circuit 2613, and a power control circuit 2614. The controller 2605 includes a CPU interface (CPUIF) 2616, a control register 2617, a code extraction circuit 2618, an encoding circuit 2619. Note that, in FIG. 26, communication signals are separately shown as a received signal 2620 and a transmitted signal 2621 for simplifying the explanation; however, they are actually integrated to constitute a signal, and the signal is simultaneously transmitted and received between the wireless chip 2601 and the reader/writer. After the received signal 2620 is received by the antenna 2607 and the resonant circuit 2608, it is demodulated by the demodulation circuit 2612. Further, the transmitted signal 2621 is modulated by the modulation circuit 2613, and then transmitted by the antenna 2607.

In FIG. 26, when the wireless chip 2601 is placed inside the magnetic field generated by a communication signal, induced electromotive force is produced by the antenna 2607 and the resonant circuit 2608. The induced electromotive force is held in a capacitor in the power supply circuit 2609, further, the potential is stabilized by the capacitance, and the induced electromotive force is supplied as supply voltage to each circuit of the wireless chip 2601. The reset circuit 2610 generates an original reset signal for the whole wireless chip 2601. For example, the reset circuit generates a signal which rises after rise in the supply voltage with delay as a reset signal. The clock generation circuit 2611 changes the frequency of a clock signal and the duty ratio. The demodulation circuit 2612 detects amplitude variation of the received signal 2620 of an ASK system as received data 2622 of "0"/"1". The demodulation circuit 2612 is, for example, a low-pass filter. Further, the demodulation circuit 2612 transmits transmitted data by varying amplitude of the transmitted signal 2621 of an ASK system. For example, in the case where a transmitted data 2623 is "0", the resonance point of the resonant circuit 2608 is changed, thereby changing amplitude of the communication signal. The power control circuit 2614 monitors the supply voltage supplied from the power supply circuit 2609 to the arithmetic circuit 2606 or current consumption in the arithmetic circuit, thereby generating a control signal for changing frequency of the clock signal and the duty ratio in the clock generation circuit 2611.

Operations of a wireless chip of this embodiment will be described. First, the wireless chip 2601 receives cipher text data in the received signal 2620 transmitted from the reader/writer. After the received signal 2620 is demodulated by the demodulation circuit 2612, the received signal 2620 is separated into a control command, cipher text data, and the like by a code extraction circuit 2618, and then it is stored in the control register 2617. Here, the control command is a data for designating response of the wireless chip 2601. For example, transmission of a unique ID number, operation stop, decoding, and the like are designated. Here, assume that a control command for decoding is received.

Subsequently, in an arithmetic circuit 2606, the CPU 2602 decodes a cipher text using a private key 2624 stored in the ROM 2603 in accordance with a decoding program stored in the ROM 2603 in advance. The decoded cipher text (decoded text) is stored in the control register 2617. At that time, the RAM 2604 is used as a data storing region. Note that the CPU 2602 accesses the ROM 2603, the RAM 2604, and the control register 2617 via the CPUIF 2616. The CPUIF 2616 has a function of generating an access signal with respect to any one of the ROM 2603, the RAM 2604, and the control register 2617 in accordance with the address which the CPU 2602 demands.

Finally, in the encoding circuit 2619, the transmitted data 2623 is generated from the encoded data and modulated by the modulation circuit 2613, and the transmitted signal 2621 is transmitted to the reader/writer.

Note that in this embodiment, a method using software, that is a system in which an arithmetic circuit is formed from a CPU and a large scale memory, and a program is executed by the CPU has been described as an arithmetic method; however, an arithmetic method may be selected in accordance with the purpose and an arithmetic circuit can be formed based on the method. For example, as another arithmetic method, there are a method using hardware and a method using both hardware and software. In the method of processing using hardware, an arithmetic circuit may be a dedicated circuit. In the method of processing using both hardware and software, an arithmetic circuit may include a dedicated circuit, a CPU, and a memory; the dedicated circuit performs a part of arithmetic processing, and the CPU executes programs other than arithmetic processing.

Next, a layout configuration of a wireless chip will be described with reference to FIG. 27. Note that, in FIG. 27, components corresponding to the components shown in FIG. 26 are denoted by the same reference numerals and the description will be omitted.

Figure 27:
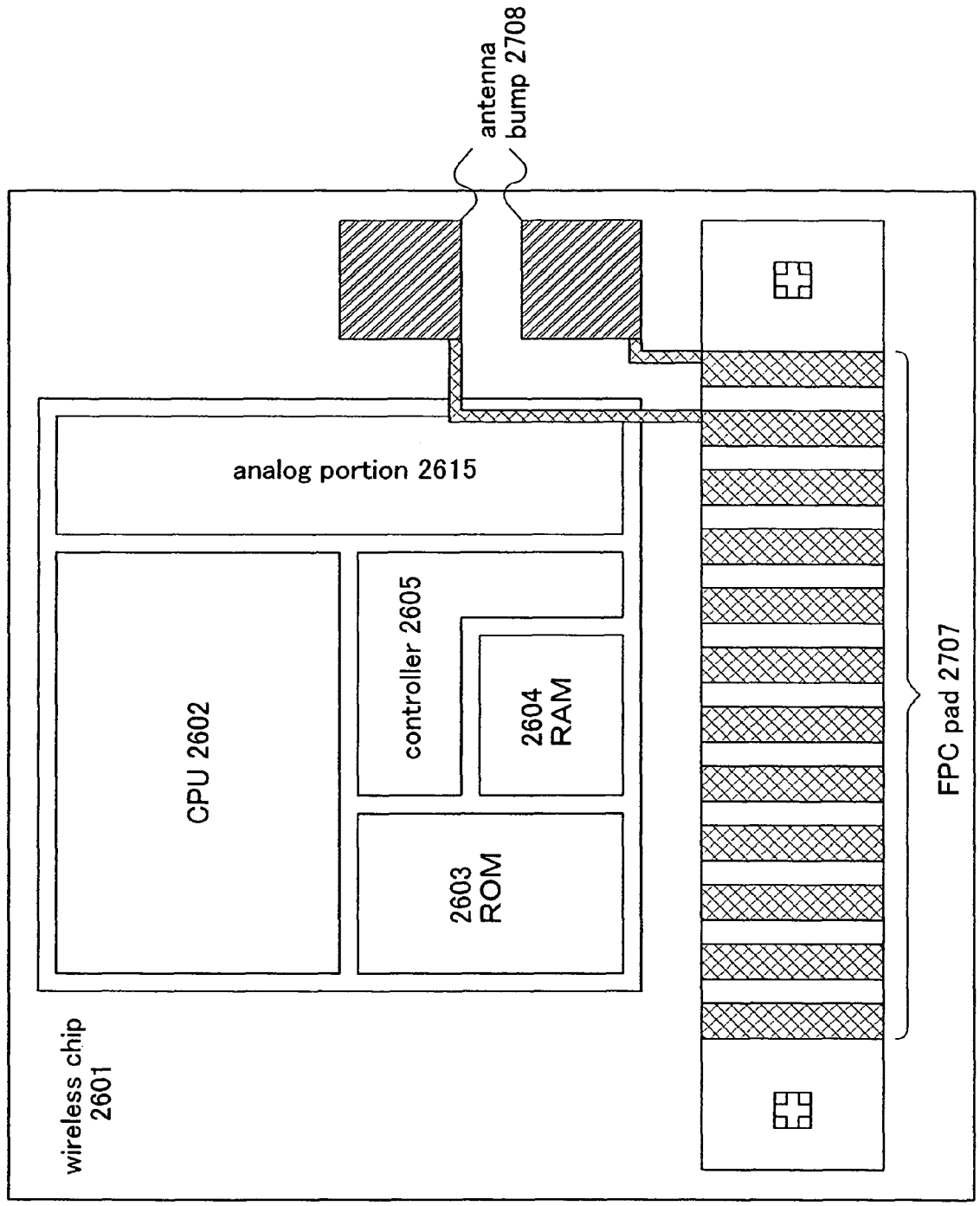
FIG. 27 is a block diagram of a semiconductor device of the present invention.
Figure 28:
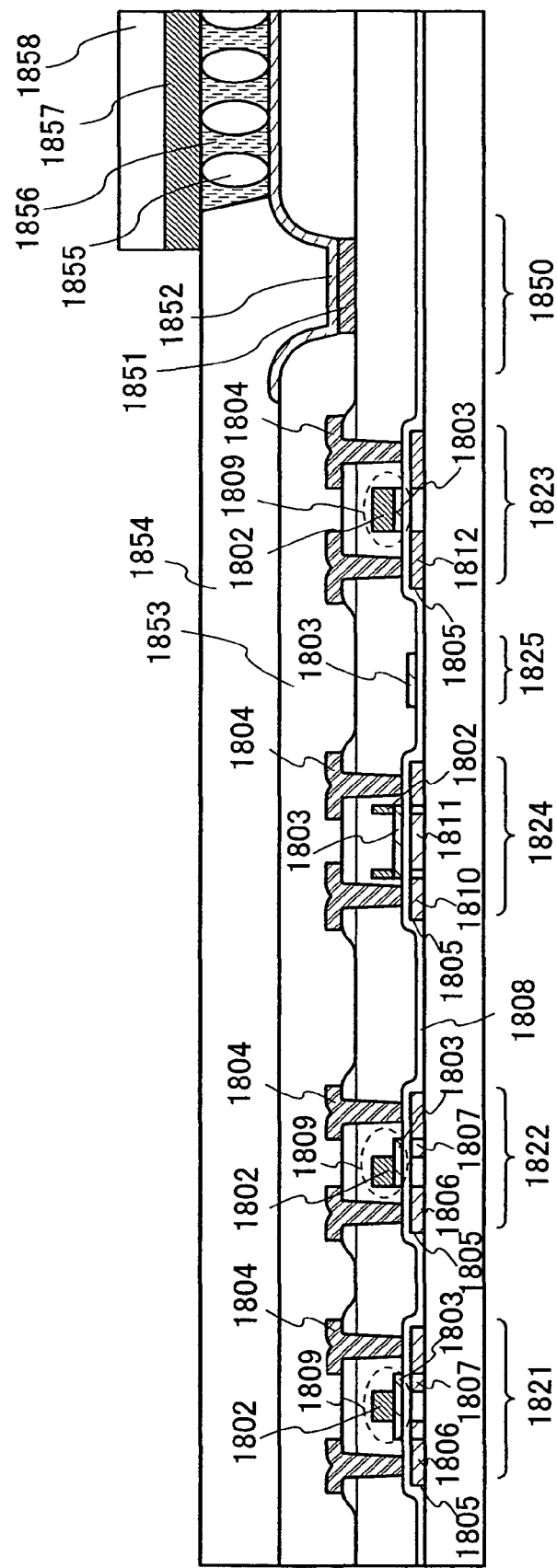
FIG. 28 shows a cross section of a semiconductor device of the present invention.

In FIG. 27, an FPC pad 2707 is an electrode pad group used for attaching the FPC (Flexible Print Circuit) to the wireless chip 2601, and the antenna bump 2708 is an electrode pad used for attaching the antenna (not shown). Note that when attaching the antenna, excess pressure may be applied to the antenna bump 2708. Therefore, it is desirable that components for forming a circuit such as a transistor are not placed under the antenna bump 2708.

The FPC pad 2707 is mainly effective when used for failure analysis. In the wireless chip, supply voltage is obtained by a communication signal, so that for example, the arithmetic circuit does not operated completely when defects are generated in the antenna or the power supply circuit. Accordingly, failure analysis is significantly difficult. However, when supply voltage is supplied to the wireless chip 2601 from the FPC pad via the FPC pad 2707 and an arbitrary electrical signal is inputted instead of an electrical signal, the arithmetic circuit can be operated. Accordingly, failure analysis can be carried out efficiently.

In addition, it is more effective to provide the FPC pad 2707 such that measurement using a prober can be carried out. Specifically, in the FPC pad 2707, when the electrode pad is placed in accordance with a pitch of the prober needle, measurement using a prober is enabled. With the use of a prober, the number of steps for attaching the FPC can be eliminated at a time of failure analysis. Further, measurement can be performed even in the state where a plurality of wireless chips is formed over the substrate; thus, the number of steps for division into each wireless chip can be eliminated as well. Further, quality inspection of wireless chips can be carried out immediately before the step of attaching an antenna in mass-production. Thus, defectives can be screened out in an earlier stage in the process flow, so that production cost can be reduced.

A cross-sectional view of such a wireless chip is shown in FIG. 28. First, as shown in FIG. 18, steps up to the formation of a wiring 1804 are finished. An insulating layer 1853 is formed so as to cover the wiring 1804. An inorganic material or an organic material can be used for the insulating layer 1853. Silicon oxide or silicon nitride can be used as an inorganic material. Polyimide, acrylic, polyamide, polyimide amide, resist, benzocyclobutene, siloxane, or polysilazane can be used as an organic material. Siloxane is composed of a skeleton formed by the bond of silicon (Si) and oxygen (O), in which an organic group containing at least hydrogen (e.g., an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is formed with a polymer material having the bond of silicon (Si) and nitrogen (N) as a starting material.

In a connection region 1850, an opening is formed in the insulating layer 1853 so that a wiring 1851 which is simultaneously formed with the wiring 1804 is exposed. In the opening, it is preferable that top ends are rounded and the sides are tapered. Thus, breaks in a pattern formed over a step can be prevented.

In the opening, the connection wiring 1852 is formed. The connection wiring 1852 can be formed of a film made from an element of aluminum (Al), titanium (Ti), molybdenum (Mo), tungsten (W) or silicon (Si), or of an alloy film using the above-described elements. In addition, a light-transmitting material such as indium tin oxide (ITO), indium tin oxide containing silicon oxide, or indium oxide containing zinc oxide at 2% to 20% can be used. Hereupon, the connection wiring 1852 is provided so as not to overlap with a region such as an n-channel thin film transistor 1821, an n-channel thin film transistor 1822, a capacitor element 1824, a resistor 1825, and a p-channel thin film transistor 1823. Thus, unnecessary parasitic capacitance is prevented from forming.

An insulating layer 1854 is formed so as to cover the insulating layer 1853 and the connection wiring 1852. The insulating layer 1854 can be formed in as similar manner as the insulating layer 1853.

An opening is formed in the insulating layer 1854 so as to expose the connection wiring 1852 provided over the insulating layer 1853. In the opening, an anisotropic conductor 1856 containing conductive fine particles 1855 are provided, and an FPC (flexible printed circuit) 1858 including a conductive layer 1857 is connected thereto.

In this manner, a wireless chip of the invention can be manufactured.

Embodiment 12

As the antenna, an antenna having a size and a shape corresponding to a target frequency may be used under the Radio Law. The frequency of a signal transmitted and received is 125 kHz, 13.56 MHz, 915 MHz, 2.45 GHz or the like, each of which is standardized by ISO or the like. Specifically, a dipole antenna, a patch antenna, a loop antenna, a Yagi antenna, and the like may be used. The shape of an antenna connected to a wireless chip will be described in this embodiment.

Figure 29A:
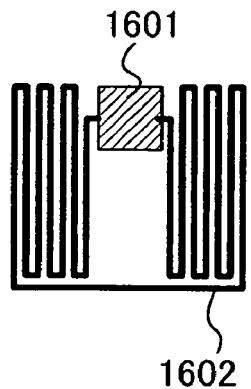
FIGS. 29A to 29D show shapes of an antenna of a semiconductor device of the present invention.

FIG. 29A shows a wireless chip 1601 to which an external antenna 1602 is connected. In FIG. 29A, the wireless chip 1601 is provided at the center portion, and the antenna 1602 is connected to the connection terminal of the wireless chip 1601. The antenna 1602 is bent rectangularly so as to ensure the length of the antenna.

Figure 29B:
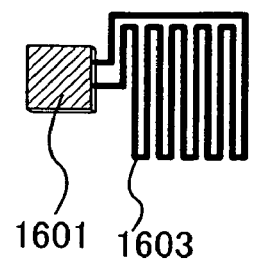

FIG. 29B shows a mode in which an external antenna 1603 is provided on a connection terminal at one side end of the wireless chip 1601. The antenna 1603 is bent rectangularly so as to ensure the length of the antenna.

Figure 29C:
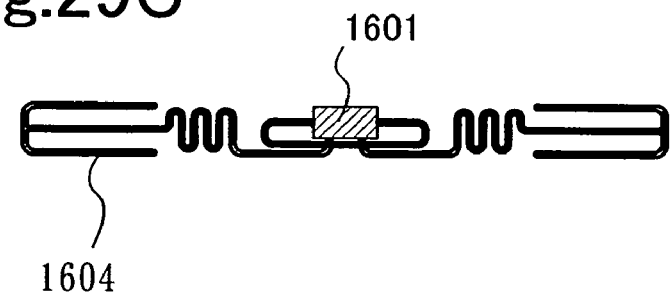

FIG. 29C shows a mode in which an external antenna 1604 is bent rectangularly is provided on either side end of the wireless chip 1601.

Figure 29D:
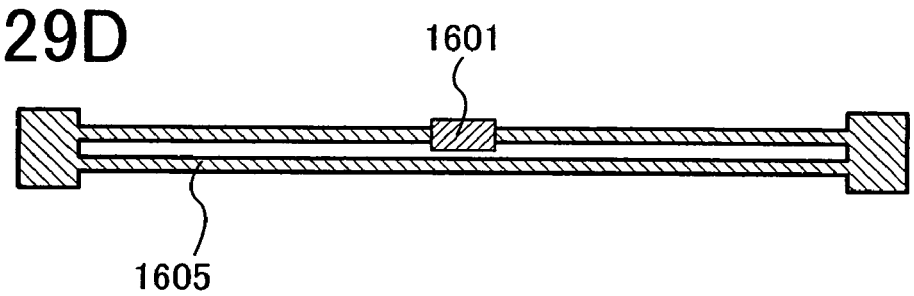

FIG. 29D shows a mode in which a linear external antenna 1605 is provided on either end of the wireless chip 1601.

The shape of an antenna may be selected in accordance with the shape or the polarized wave of an antenna, or use or the structure of a wireless chip. Specifically, if a dipole antenna is used as the antenna, it may be a folded dipole antenna. If a loop antenna is used as the antenna, it may be a circular loop antenna or a square loop antenna. If a patch antenna is used as the antenna, it may be a circular patch antenna or a square patch antenna.

If a patch antenna is used, the antenna preferably uses a dielectric material such as ceramic. The antenna can be miniaturized by increasing the dielectric constant of a dielectric material used for a substrate of the patch antenna. In addition, the patch antenna has high mechanical strength and thus can be used repeatedly.

A dielectric material of a patch antenna may be formed of ceramic, an organic resin, a mixture of ceramic and an organic resin, or the like. Ceramic is typified by alumina, glass, forsterite, and the like. Further, plural kinds of ceramics may be mixed to be used. In order to obtain a high dielectric constant, a dielectric layer is preferably formed of a ferroelectric material. The ferroelectric material is typified by barium titanate ($BaTiO_3$), lead titanate ($PbTiO_3$), strontium titanate ($SrTiO_3$), lead zirconate ($PbZrO_3$), lithium niobate ($LiNbO_3$), lead zirconate titanate (PZT), and the like. Further, plural kinds of ferroelectric materials may be mixed to be used.

Structures shown in Embodiment Mode and the above embodiments can be applied to the wireless chip 1601.

Embodiment 13

In this embodiment, a mode in which a semiconductor device of the invention is formed over a plastic substrate will be described. Note that a semiconductor device of this embodiment mode includes an RF circuit for carrying out wireless communication, and an arithmetic circuit in a CPU.

Communication specifications of a semiconductor device of the invention are shown in Table 1.

TABLE 1

|  | ISO | ISO/IEC 15693 (Part compliance) |
|---|---|---|
|  | Frequency | 13.56 MHz |
| To semiconductor device | Modulation | Amplitude shift keying |
|  | Modulation index | 100% |
| From reader/writter | Data rate | 26.48 kbits/s |
|  | Data encode | Pulse-position modulation |
|  | Data encode mode | One out of four |
| To reader/writter From semiconductor device | Communication signal interface | Load modulation |
|  | Subcarrier frequency | 423.75 KHz |
|  | Data rate | 26.48 kbits/s |
|  | Data encode | Manchester system |

A 13.56 MHz radio signal is used for communication, and the communication standard and the protocol are partially based on ISO/IEC 15693. In a semiconductor device of the invention, supply voltage is supplied using the radio signal via an antenna. A semiconductor device of the invention has an external antenna; however, the antenna may be replaced by an internal antenna which is integrated with a circuit. Data transmission rate is set at 26.48 kbit/s, and pulse position modulation is used for data encoding from a reader/writer to the semiconductor device, and Manchester encoding used for data encoding from the semiconductor device to the reader/writer.

An outline of a semiconductor device of the invention is shown in Table 2.

TABLE 2

|  |  | Total TFTs | 71K |
|---|---|---|---|
|  |  | Chip core size* | 20 mm × 20 mm × 195 μm (Core: 14 mm × 14 mm × 195 μm) |
|  |  | Weight* | 103 mg |
| Logic circuit | CPU | Frequency | 3.39 MHz |
|  |  | Total TFTs | 26K |
|  |  | Architecture | 8 b CISC |
|  |  | General register | 16 × 8 b |
|  |  | Address bus | 16 b |
|  |  | Data bus | 8 b |
|  | ROM | Size | 2 KB |
|  | RAM | Size | 64 B |
|  | Controller | Tr count | 11K |
|  |  | Circuit configuration | CPU interface RF interface Register Clock control circuit |
| RF circuit |  | Circuit configuration | Resonance capacitor Power circuit System reset circuit Clock generation circuit Demodulation circuit Modulation circuit |

*Antenna is not include.

A semiconductor device of the invention can be formed using a thin film transistor for a flexible substrate, a light-weight semiconductor of 103 mg.

Figure 30:
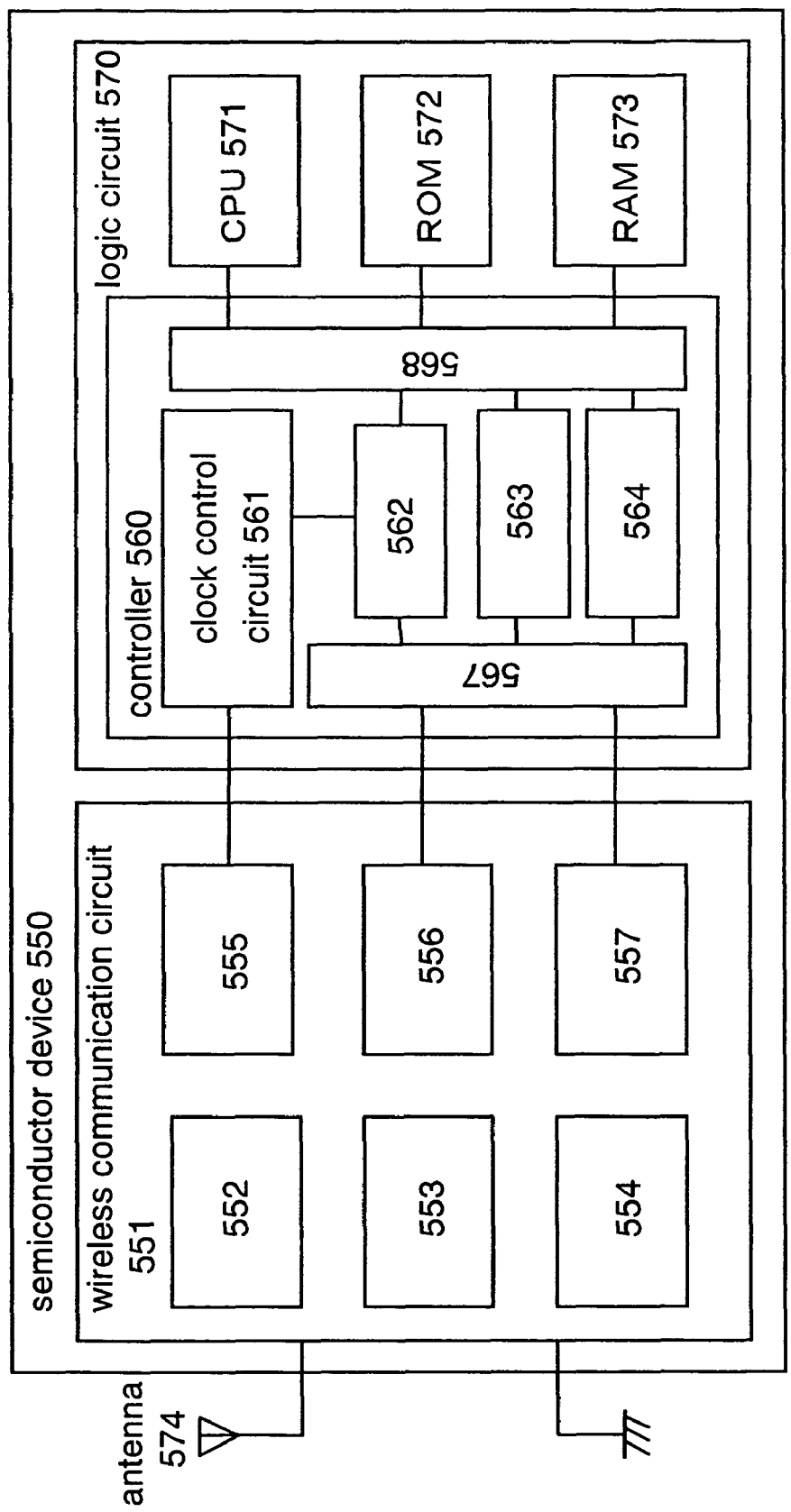
FIG. 30 is a block diagram of a semiconductor device of the present invention.

A block configuration of a semiconductor device of the invention is shown in FIG. 30. A semiconductor device 550 of the invention includes a wireless communication circuit 551 and a logic circuit 570. The wireless communication circuit 551 includes a resonant capacitor 552, a power supply circuit 553, a system reset circuit 554, a clock generator 555, a demodulation circuit 556, a modulation circuit 557, and the like. The resonant capacitor 552 can constitutes an external antenna with the resonant circuit. The power supply circuit 553 includes a rectifier circuit and a storage capacitor, and can provide supply voltage. The system reset circuit 554 can generate a system reset signal, and the clock generator 555 can generate a system clock signal. The demodulation circuit 556 includes a LPF (Low Pass Filter), and can extract data from the radio signal. The modulation circuit 557 can superimpose data on the radio signal by the Manchester coding. These circuits can be formed from thin film transistors.

The logic circuit 570 includes a controller 560, a CPU 571, a ROM 572, a RAM 573, and the like; the controller 560 includes a clock control circuit 561, a control register 562, a data receiving register 563, a data transmitting register 564, a wireless communication interface 567, a CPU interface 568. These circuits and the like can be formed from thin film transistors. The demodulation circuit 556 and the modulation circuit 557 can transmit/receive a signal to/from a control register 562, a data receiving register 563, or a data transmitting register 564 via a wireless communication interface 567. The clock generator 555 is controlled by the clock control circuit 561; the clock control circuit 561 is operated based on the control register 562. The control register 562, the data receiving register 563 and the data transmitting register 564 can transmit/receive a signal to/from the CPU 571, the ROM 572, and the RAM 573 via the CPU interface 568.

A CPU included in the semiconductor device is an 8 bit CISC, and it can be structured using a flip-flop of 2 phase non-overlap clock operation described in the above embodiment mode. With the use of a flip-flop of 2 phase non-overlap clock operation, malfunctions due to variation in clock skew or variations in TFT characteristics can be prevented, and the reliability can be improved. A 2 KB mask ROM can be used as the ROM 572, and it can store programs, private keys, and the like. A 64 B SRAM can be used as the RAM 573, and the SRAM can be used as a workspace of the CPU. Thus, a circuit configuration of a memory cell is devised, reliability in writing/read. The controller 560 has a function of a state machine of the semiconductor device.

Figure 31:
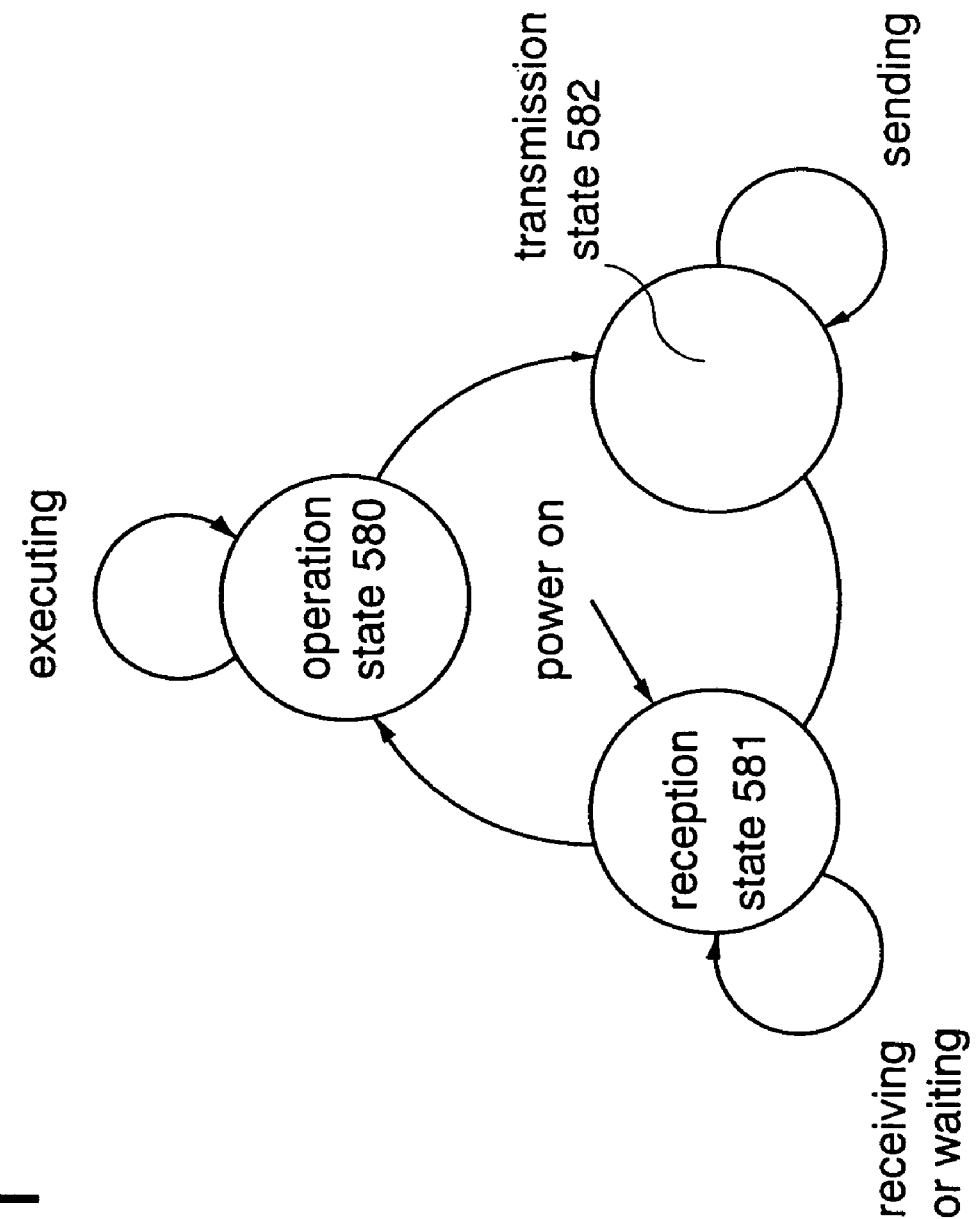
FIG. 31 is a state transition diagram showing operations of a semiconductor device of the present invention.

FIG. 31 shows a state transition diagram of the semiconductor device. When a state flag in the control register 562 is changed, sequential transition of an operation state 580, a reception state 581, and a transmission state 582 occurs. In the reception state 581, serial data extracted from the radio signal is stored in the data register 563. In the operation state 580, the CPU 571 performs processing using a program stored in the ROM 572 and data in the data receiving register 563, an the transmitted data is stored in the transmitted data register 564. In the transmission state 582, transmitted data stored in the transmitted data register 564 are converted into serial data and they are transmitted in order. The logic circuit 570 is separated into a reception block, an operation block, a transmission block respectively for circuits operated in the operation state 580, the reception state 581, and the transmission state 582, and supply of the clock signals to each block is controlled in the clock control circuit 561. Such intricate clock signal control can reduce current consumption of the semiconductor device and can improve reliability of the semiconductor device.

Design of such a semiconductor device can be determined as below. As to the wireless communication circuit 551, after designing per sub circuit using SPICE, custom layout is carried out, operation of the whole RF circuit is checked using Nanosim (R), and the design can be determined. As to the CPU 571, after RTL design using VerilogHDL (R), custom layout is carried out for the register, and standard cell-based logic synthesis, automatic layout are carried out for the others, and the design can be determined. As to the ROM 572 and the RAM 573, after designing a memory cell using SPICE, custom layout is carried out, and the design can be determined. As to the CPU 571, the ROM 572, and the RAM 573, timing verification is preferably performed using Nanosim (R) after layout. As to the design of the controller 560, after RTL design using VerilogHDL (R), standard cell-based logic synthesis, automatic layout are carried out, and the design can be determined.

In the semiconductor device, SAFER (Secure And Fast Encryption Routine) can be used as an algorithm of cryptographic processing. SAFER mainly includes 8 bit operations and is an algorithm suitable for an 8 bit CPU. In a wireless chip included in the semiconductor device, functions of receiving data for cipher text, decoded the data using a private key, and transmitting data for plain text to the reader/writer. Naturally, another algorithm for cryptographic processing such as DES or AES can be used for the semiconductor device.

Figure 32:
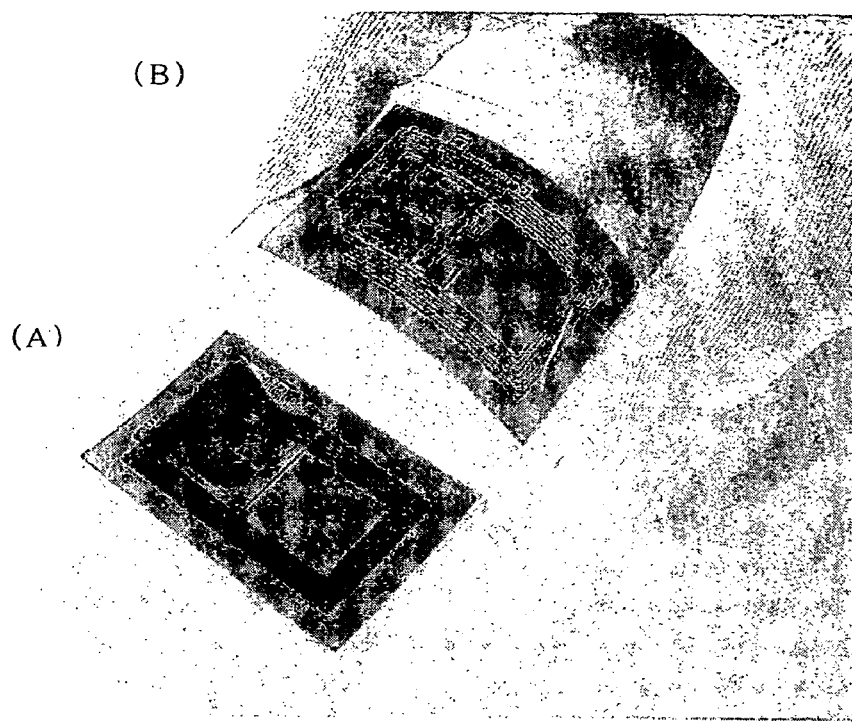
FIG. 32 is photographs of semiconductor devices of the present invention.
Figure 33:
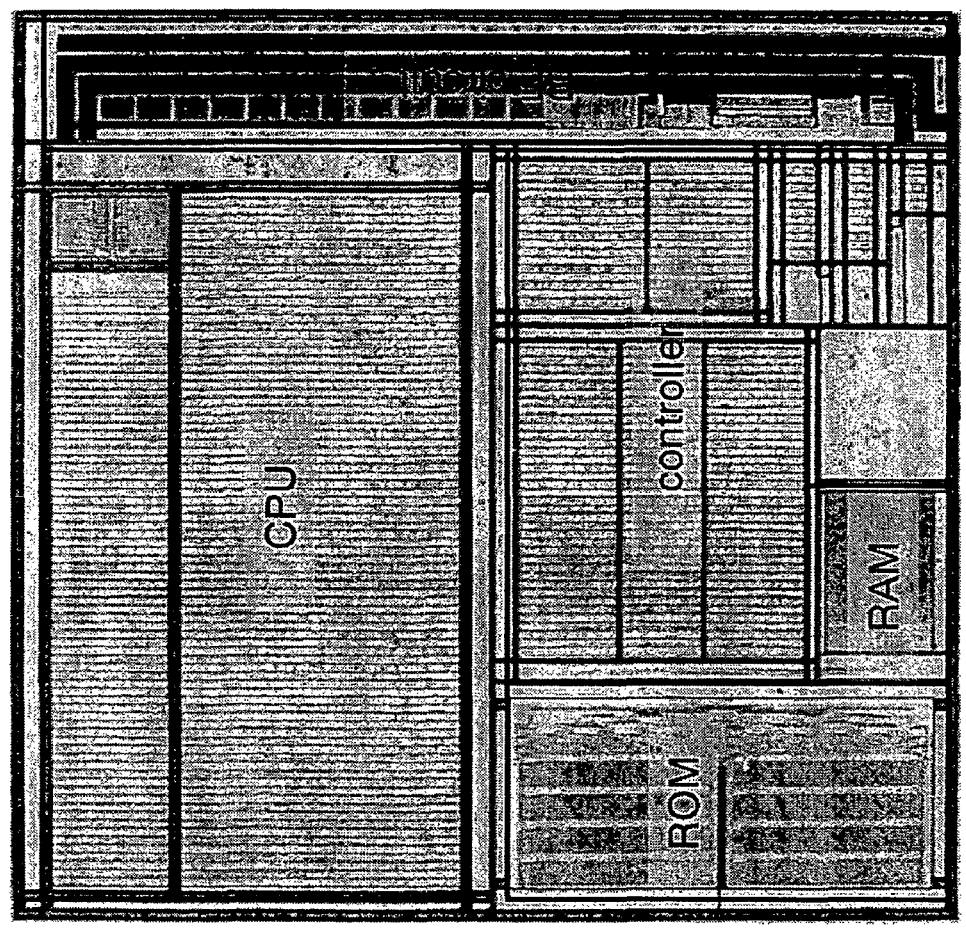
FIG. 33 is a block diagram of a semiconductor device of the present invention.

FIG. 32 shows a wireless chip including a semiconductor device formed over a glass substrate and a wireless chip including a semiconductor device formed over a flexible substrate. FIG. 33 shows enlarged view of the wireless chip and the block diagram. The present invention can provide such a thin wireless chip.

Figure 34:
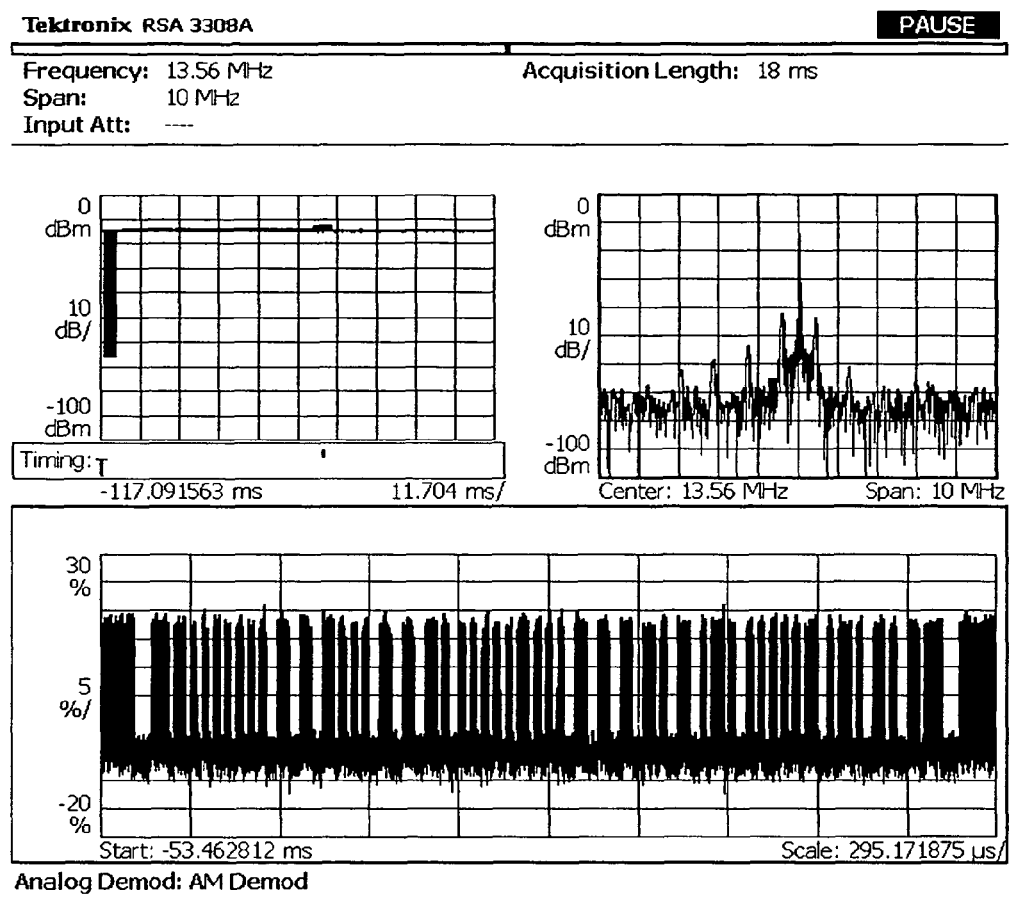
FIG. 34 shows operation measurement data of a semiconductor device of the invention.

FIGS. 34A to 34C show results of measuring a waveform of a communication signal of a wireless chip, which is measured with a spectrum analyzer. Respective figures show waveforms of a signal in the case where the ordinate represents signal intensity, and the vertical axis represents time FIG. 34A; the ordinate represents signal intensity, and the vertical axis represents frequency in FIG. 34B, and the ordinate represents signal intensity, and the vertical axis represents time in FIG. 34C. As a measurement example, after receiving data for cipher text, the data is decoded using the private key and data for plaintext are transmitted. The measurement result of measuring a 13.56 MHz signal of a wireless chip formed over a flexible substrate is shown. Current consumption of the wireless chip was 2.3 mA in the case where the internal generated voltage was 1.8 V. Thus, a lower power consumption wireless chip can be obtained.

This application is based on Japanese Patent Application serial No. 2005-222194 filed in Japan Patent Office on Jul. 29, 2005 and Japanese Patent Application serial No. 2005-318543 filed in Japan Patent Office on Nov. 1, 2005; the entire contents of which are hereby incorporated by reference.

What is claimed is:

1. A semiconductor device comprising:
an arithmetic circuit;
a clock generation circuit for supplying clock signals to the arithmetic circuit;
a power control circuit;
a power supply circuit operationally connected to the arithmetic circuit and the clock generation circuit, the power supply circuit configured to supply voltage to the clock generation circuit,
wherein the power control circuit is configured to compare a reference voltage generated from a supply voltage applied by the power supply circuit with the supply voltage applied by the power supply circuit and to output a control signal to the clock generation circuit in accordance with a result of comparing the reference voltage with the supply voltage,
wherein a duty ratio of a clock signal is changed in accordance with the supply voltage from the power supply circuit.

2. A semiconductor device comprising:
an arithmetic circuit;
a power control circuit; and
a clock generation circuit,
wherein the arithmetic circuit includes a first latch having a function of changing a period where data is held by a first gate signal, and a second latch having a function of changing a period where data is held by a second gate signal,
the power control circuit has a function of generating a control signal in accordance with a voltage supplied to the arithmetic circuit,
the clock generation circuit has functions of generating a first clock signal and a second clock signal, and
the first gate signal and the second gate signal are generated respectively based on the first clock signal and the second clock signal which are generated in the clock generation circuit.

3. A semiconductor device comprising:
an arithmetic circuit;
a power control circuit; and
a clock generation circuit,
wherein the arithmetic circuit includes a first latch having a function of changing a period where data is held by a first gate signal, and a second latch having a function of changing a period where data is held by a second gate signal,
the power control circuit has a function of generating a control signal in accordance with a voltage supplied to the arithmetic circuit,
the clock generation circuit has functions of generating a first clock signal and a second clock signal,
the control signal changes a period where the first clock signal and the second clock signal are LOW, and
the first gate signal and the second gate signal are generated based on the first clock signal and the second clock signal which are generated in the clock generation circuit.

4. A semiconductor device according to claim 3,
wherein the power control circuit includes a regulator and an operational amplifier circuit.

5. A semiconductor device according to claim 3,
wherein the power control circuit includes a regulator, an operational amplifier circuit, and an analog-digital converter.

6. A semiconductor device according to claim 3,
wherein the clock generation circuit has means for changing frequencies of the first clock signal and the second clock signal.

7. A semiconductor device according to claim 3,
wherein the arithmetic circuit has a CPU and a memory.

8. A semiconductor device comprising:
an arithmetic circuit;
a power control circuit; and
a clock generation circuit,
wherein the arithmetic circuit includes a first latch having a function of changing a period where data is held by a first gate signal, and a second latch having a function of changing a period where data is held by a second gate signal, the power control circuit has a function of generating a control signal in accordance with a current supplied to the arithmetic circuit, the clock generation circuit has functions of generating a first clock signal and a second clock signal, and the first gate signal and the second gate signal are generated respectively based on the first clock signal and the second clock signal which are generated in the clock generation circuit.

9. A semiconductor device comprising:
an arithmetic circuit;
a power control circuit; and
a clock generation circuit,
wherein the arithmetic circuit includes a first latch having a function of changing a period where data is held by a first gate signal, and a second latch having a function of changing a period where data is held by a second gate signal,
the power control circuit has a function of generating a control signal in accordance with a current supplied to the arithmetic circuit,
the clock generation circuit has functions of generating a first clock signal and a second clock signal,
the control signal changes a period where the first clock signal and the second clock signal are LOW, and
the first gate signal and the second gate signal are generated based on the first clock signal and the second clock signal which are generated in the clock generation circuit.

10. A semiconductor device according to claim 9,
wherein the power control circuit includes a regulator and an operational amplifier circuit.

11. A semiconductor device according to claim 9,
wherein the power control circuit includes a regulator, an operational amplifier circuit, and an analog-digital converter.

12. A semiconductor device according to claim 9,
wherein the clock generation circuit has means for changing frequencies of the first clock signal and the second clock signal.

13. A semiconductor device according to claim 9,
wherein the arithmetic circuit has a CPU and a memory.

14. A semiconductor device comprising:
an arithmetic circuit;
a power control circuit; and
a clock generation circuit,
wherein one of the arithmetic circuit, the power control circuit, and the clock generation circuit includes a thin film transistor which has a semiconductor film provided over a substrate having an insulating surface as an active layer,
wherein the arithmetic circuit includes a first latch having a function of changing a period where data is held by a first gate signal, and a second latch having a function of changing a period where data is held by a second gate signal,
the power control circuit has a function of generating a control signal in accordance with a voltage supplied to the arithmetic circuit,
the clock generation circuit has functions of generating a first clock signal and a second clock signal, and the first gate signal and the second gate signal are generated respectively based on the first clock signal and the second clock signal which are generated in the clock generation circuit.

15. A semiconductor device according to claim 14,
wherein the substrate having an insulating surface is any one of a glass substrate, a plastic substrate, and an SOI substrate.

16. A semiconductor device comprising:
an arithmetic circuit;
a power control circuit; and
a clock generation circuit,
wherein one of the arithmetic circuit, the power control circuit, and the clock generation circuit includes a thin film transistor which has a semiconductor film provided over a substrate having an insulating surface as an active layer,
wherein the arithmetic circuit includes a first latch having a function of changing a period where data is held by a first gate signal, and a second latch having a function of changing a period where data is held by a second gate signal,
the power control circuit has a function of generating a control signal in accordance with a voltage supplied to the arithmetic circuit,
the clock generation circuit has functions of generating a first clock signal and a second clock signal,
the control signal changes a period where the first clock signal and the second clock signal are LOW, and
the first gate signal and the second gate signal are generated based on the first clock signal and the second clock signal which are generated in the clock generation circuit.

17. A semiconductor device according to claim 16,
wherein the arithmetic circuit has a CPU and a memory.

18. A semiconductor device according to claim 16,
wherein the substrate having an insulating surface is any one of a glass substrate, a plastic substrate, and an SOI substrate.

19. A semiconductor device according to claim 16,
wherein the power control circuit includes a regulator and an operational amplifier circuit.

20. A semiconductor device according to claim 16,
wherein the power control circuit includes a regulator, an operational amplifier circuit, and an analog-digital converter.

21. A semiconductor device according to claim 16,
wherein the clock generation circuit has means for changing frequencies of the first clock signal and the second clock signal.

22. A semiconductor device comprising:
an arithmetic circuit;
a power control circuit; and
a clock generation circuit,
wherein one of the arithmetic circuit, the power control circuit, and the clock generation circuit includes a thin film transistor which has a semiconductor film provided over a substrate having an insulating surface as an active layer,
wherein the arithmetic circuit includes a first latch having a function of changing a period where data is held by a first gate signal, and a second latch having a function of changing a period where data is held by a second gate signal,
the power control circuit has a function of generating a control signal in accordance with a current supplied to the arithmetic circuit, the clock generation circuit has functions of generating a first clock signal and a second clock signal, and the first gate signal and the second gate signal are generated based on the first clock signal and the second clock signal which are generated in the clock generation circuit.

23. A semiconductor device according to claim 22, wherein the substrate having an insulating surface is any one of a glass substrate, a plastic substrate, and an SOI substrate.

24. A semiconductor device comprising:

an arithmetic circuit;

a power control circuit; and a clock generation circuit, wherein one of the arithmetic circuit, the power control circuit, and the clock generation circuit includes a thin film transistor which has a semiconductor film provided over a substrate having an insulating surface as an active layer, wherein the arithmetic circuit includes a first latch having a function of changing a period where data is held by a first gate signal, and a second latch having a function of changing a period where data is held by a second gate signal, the power control circuit has a function of generating a control signal in accordance with a current supplied to the arithmetic circuit, the clock generation circuit has functions of generating a first clock signal and a second clock signal, the control signal changes a period where the first clock signal and the second clock signal are LOW, and the first gate signal and the second gate signal are generated based on the first clock signal and the second clock signal which are generated in the clock generation circuit.

25. A semiconductor device according to claim 24, wherein the substrate having an insulating surface is any one of a glass substrate, a plastic substrate, and an SOI substrate.

26. A semiconductor device according to claim 24, wherein the power control circuit includes a regulator and an operational amplifier circuit.

27. A semiconductor device according to claim 24, wherein the power control circuit includes a regulator, an operational amplifier circuit, and an analog-digital converter.

28. A semiconductor device according to claim 24, wherein the clock generation circuit has means for changing frequencies of the first clock signal and the second clock signal.

29. A semiconductor device according to claim 24, wherein the arithmetic circuit has a CPU and a memory.

* * * * *